(12) United States Patent
Yamazaki et al.

(10) Patent No.: US 11,152,512 B2
(45) Date of Patent: Oct. 19, 2021

(54) SEMICONDUCTOR DEVICE, DISPLAY DEVICE, AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Junichi Koezuka, Tochigi (JP); Masami Jintyou, Shimotsuga (JP); Yasutaka Nakazawa, Tochigi (JP); Toshimitsu Obonai, Shimotsuke (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/613,147

(22) PCT Filed: May 7, 2018

(86) PCT No.: PCT/IB2018/053142
§ 371 (c)(1),
(2) Date: Nov. 13, 2019

(87) PCT Pub. No.: WO2018/221351
PCT Pub. Date: Nov. 22, 2018

(65) Prior Publication Data
US 2020/0203532 A1    Jun. 25, 2020

(30) Foreign Application Priority Data

May 19, 2017 (JP) .............................. JP2017-099571
Jul. 6, 2017 (JP) .............................. JP2017-133092
Nov. 9, 2017 (JP) .............................. JP2017-216684

(51) Int. Cl.
*H01L 27/00* (2006.01)
*H01L 29/00* (2006.01)
(Continued)

(52) U.S. Cl.
CPC ........ *H01L 29/7869* (2013.01); *G02F 1/1368* (2013.01); *H01L 27/1225* (2013.01); *H01L 29/66969* (2013.01)

(58) Field of Classification Search
CPC ............. H01L 27/1255; H01L 27/1225; H01L 27/3262; H01L 29/66969; H01L 29/78648;
(Continued)

(56) References Cited

U.S. PATENT DOCUMENTS 8,790,960 B2 * 7/2014 Yamazaki ......... H01L 29/78606
438/104
9,112,036 B2    8/2015 Koezuka et al.
(Continued)

FOREIGN PATENT DOCUMENTS

CN    101752390 A    6/2010
CN    103178057 A    6/2013
(Continued)

OTHER PUBLICATIONS

International Search Report (Application No. PCT/IB2018/053142) dated Aug. 7, 2018.
(Continued)

*Primary Examiner* — Nikolay K Yushin
(74) *Attorney, Agent, or Firm* — Robinson IP Law Office, P.C.; Eric J. Robinson

(57) ABSTRACT

A semiconductor device with favorable electrical characteristics, a semiconductor device with stable electrical characteristics, or a highly reliable semiconductor device or display device is provided. A first insulating layer and a first conductive layer are stacked over a first region of a first metal oxide layer. A first layer is formed in contact with a second metal oxide layer and a second region of the first metal oxide layer that is not overlapped by the first insulat-
(Continued)

ing layer. Heat treatment is performed to lower the resistance of the second region and the second metal oxide layer. A second insulating layer is formed. A second conductive layer electrically connected to the second region is formed over the second insulating layer. Here, the first layer is formed to contain at least one of aluminum, titanium, tantalum, and tungsten.

19 Claims, 36 Drawing Sheets

(51) Int. Cl.
  *G02F 1/1368* (2006.01)
  *H01L 29/786* (2006.01)
  *H01L 27/12* (2006.01)
  *H01L 29/66* (2006.01)

(58) Field of Classification Search
  CPC ... H01L 29/7869; H01L 29/45; G02F 1/1368; G02F 1/136213; G02F 1/13454; G02F 1/1343
  See application file for complete search history.

(56) References Cited

U.S. PATENT DOCUMENTS

| | | | |
|---|---|---|---|
| 9,257,594 | B2 | 2/2016 | Yamazaki et al. |
| 9,287,294 | B2 * | 3/2016 | Yamazaki ............ H01L 27/1255 |
| 9,287,407 | B2 | 3/2016 | Koezuka et al. |
| 9,496,408 | B2 | 11/2016 | Yamazaki et al. |
| 9,530,856 | B2 * | 12/2016 | Miyairi ............... H01L 29/7869 |
| 9,691,905 | B2 * | 6/2017 | Ito ....................... H01L 29/4908 |
| 9,741,865 | B2 | 8/2017 | Yamazaki et al. |
| 9,837,645 | B2 | 12/2017 | Koezukaj et al. |
| 9,899,536 | B2 | 2/2018 | Yamazaki et al. |
| 10,181,545 | B2 | 1/2019 | Yamazaki et al. |
| 11,024,763 | B2 | 6/2021 | Yamazaki et al. |
| 2010/0140613 | A1 | 6/2010 | Kimura |
| 2011/0240998 | A1 | 10/2011 | Morosawa et al. |
| 2011/0269266 | A1 * | 11/2011 | Yamazaki ......... H01L 29/66969 438/104 |
| 2012/0161132 | A1 * | 6/2012 | Yamazaki ............... C04B 35/58 257/57 |
| 2013/0020571 | A1 | 1/2013 | Yamazaki et al. |
| 2013/0126859 | A1 | 5/2013 | Yeh et al. |
| 2013/0153893 | A1 | 6/2013 | Morosawa et al. |
| 2013/0221358 | A1 | 8/2013 | Morosawa et al. |
| 2013/0270527 | A1 | 10/2013 | Kwon et al. |
| 2014/0291668 | A1 | 10/2014 | Morosawa |
| 2015/0187898 | A1 * | 7/2015 | Miyairi ............. H01L 29/66969 257/43 |
| 2015/0206981 | A1 | 7/2015 | Komachi |
| 2016/0372606 | A1 * | 12/2016 | Ito ..................... H01L 29/78693 |
| 2017/0053947 | A1 | 2/2017 | Makita et al. |
| 2018/0145180 | A1 | 5/2018 | Koezuka et al. |

FOREIGN PATENT DOCUMENTS

| | | |
|---|---|---|
| CN | 103295909 A | 9/2013 |
| JP | 2004-109857 A | 4/2004 |
| JP | 2010-156963 A | 7/2010 |
| JP | 2011-228622 A | 11/2011 |
| JP | 2013-130615 A | 7/2013 |
| JP | 2013-179141 A | 9/2013 |
| JP | 2014-007399 A | 1/2014 |
| JP | 2017-054899 A | 3/2017 |
| KR | 2010-0065110 A | 6/2010 |
| KR | 2013-0098906 A | 9/2013 |
| KR | 2013-0115657 A | 10/2013 |
| TW | 201036163 | 10/2010 |
| TW | 201322341 | 6/2013 |
| TW | 201332119 | 8/2013 |
| TW | 201338173 | 9/2013 |
| TW | 201640640 | 11/2016 |
| WO | WO-2010/029859 | 3/2010 |

OTHER PUBLICATIONS

Written Opinion (Application No. PCT/IB2018/053142) dated Aug. 7, 2018.

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.

Ota.K et al., "Silicon-Compatible Low Resistance S/D Technologies for High-Performance Top-Gate Self-Aligned InGaZnO TFTs with UTBB (Ultra-Thin Body and Box) Structures", 2015 Symposium on VLSI Circuits Digest of Technical Papers, Jun. 15, 2015, pp. 214-215.

Taiwanese Office Action (Application No. 107116241) dated Jul. 28, 2021.

* cited by examiner

17 Inverter Circuits

SEMICONDUCTOR DEVICE, DISPLAY DEVICE, AND METHOD FOR MANUFACTURING SEMICONDUCTOR DEVICE

TECHNICAL FIELD

One embodiment of the present invention relates to a semiconductor device and a method for manufacturing the semiconductor device. One embodiment of the present invention relates to a display device and a method for manufacturing the display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin-film solar cell and an organic thin-film solar cell), and an electronic device may each include a semiconductor device.

BACKGROUND ART

As a semiconductor material applicable to a transistor, an oxide semiconductor containing a metal oxide has been attracting attention. For example, Patent Document 1 discloses a semiconductor device achieving high field-effect mobility (in some cases, simply referred to as mobility or µFE) with a structure where a plurality of oxide semiconductor layers are stacked, and among them, the oxide semiconductor layer serving as a channel contains indium and gallium and has a higher indium content than a gallium content.

A metal oxide that can be used for a semiconductor layer can be formed by a sputtering method or the like, and thus can be used for a semiconductor layer of a transistor in a large display device. In addition, capital investment can be reduced because part of production equipment for a transistor including polycrystalline silicon or amorphous silicon can be retrofitted and utilized. A transistor including a metal oxide has higher field-effect mobility than a transistor including amorphous silicon, and thus can achieve a high-performance display device into which a driver circuit is integrated.

Patent Document 2 discloses a thin film transistor in which an oxide semiconductor film including a low-resistance region containing at least one of aluminum, boron, gallium, indium, titanium, silicon, germanium, tin, and lead as a dopant is used for a source region and a drain region.

PATENT DOCUMENT

Patent Document 1: Japanese Published Patent Application No. 2014-007399
Patent Document 2: Japanese Published Patent Application No. 2011-228622

DISCLOSURE OF INVENTION

One object of one embodiment of the present invention is to provide a semiconductor device with favorable electrical characteristics. Another object is to provide a semiconductor device with stable electrical characteristics. Another object of one embodiment of the present invention is to provide a highly reliable semiconductor device or display device.

Note that the description of these objects does not preclude the existence of other objects. One embodiment of the present invention does not necessarily achieve all the objects listed above. Note that other objects can be derived from the description of the specification, the drawings, the claims, and the like.

One embodiment of the present invention is a method for manufacturing a semiconductor device, including steps of forming a first metal oxide layer and a second metal oxide layer over one surface; forming and stacking a first insulating layer and a first conductive layer over a first region of the first metal oxide layer; forming a first layer in contact with the second metal oxide layer and a second region of the first metal oxide layer that is not overlapped by the first insulating layer; performing heat treatment to lower the resistance of the second region of the first metal oxide layer and the resistance of the second metal oxide layer; forming a second insulating layer to cover the first metal oxide layer, the second metal oxide layer, the first insulating layer, and the first conductive layer; and forming, over the second insulating layer, a second conductive layer electrically connected to the second region. Here, the first layer is formed to contain at least one of aluminum, titanium, tantalum, and tungsten.

The above embodiment preferably includes a step of removing the first layer after the step of performing the heat treatment and before the step of forming the second insulating layer.

In the above embodiment, the second conductive layer is preferably formed to overlap the second metal oxide layer.

Alternatively, the above embodiment preferably includes, before the step of forming the first metal oxide layer and the second metal oxide layer, a step of forming a third conductive layer and a fourth conductive layer over one surface and a step of forming a third insulating layer to cover the third conductive layer and the fourth conductive layer. In this case, the first metal oxide layer is preferably formed so that the first region overlaps the third conductive layer, and the second metal oxide layer is preferably formed to at least partly overlap the fourth conductive layer.

In the above embodiment, the first layer is preferably formed by a sputtering method to contain nitrogen.

In the above embodiment, the heat treatment is preferably performed at a temperature higher than or equal to 300° C. and lower than or equal to 450° C. in an atmosphere containing nitrogen.

Another embodiment of the present invention is a semiconductor device including a first metal oxide layer and a second metal oxide layer over one surface; a first insulating layer and a first conductive layer stacked over a first region of the first metal oxide layer; a first layer in contact with the second metal oxide layer and a second region of the first metal oxide layer that is not overlapped by the first insulating layer; a second insulating layer covering the first metal oxide layer, the second metal oxide layer, the first insulating layer, and the first conductive layer; and a second conductive layer positioned over the second insulating layer and electrically connected to the second region. The first layer contains at least one of aluminum, titanium, tantalum, and tungsten. The second region has a lower resistance than the first region.

In the above embodiment, it is preferred that the second conductive layer partly overlap the first insulating layer, the first layer, and the second metal oxide layer.

Alternatively, the above embodiment preferably includes a third conductive layer and a fourth conductive layer below the first metal oxide layer and the second metal oxide layer, and a third insulating layer that covers the third conductive layer and the fourth conductive layer and is positioned below the first metal oxide layer and the second metal oxide layer. In this case, it is preferred that the third conductive layer be partly overlapped by the first region, and that the fourth conductive layer be partly overlapped by the second metal oxide layer. Moreover, it is preferred that the second region be electrically connected to the second metal oxide layer through the second conductive layer.

In the above embodiment, it is preferred that the first region and the second metal oxide layer be seamlessly continuous.

The above embodiment preferably includes a third metal oxide layer between the first metal oxide layer and the first insulating layer. In this case, it is preferred that the third metal oxide layer contain In, Ga, and Zn and have a higher In content than a Ga content. Furthermore, the third metal oxide layer preferably has a higher Zn content than an In content.

Another embodiment of the present invention is a display device including any of the above semiconductor devices and a liquid crystal element. In this case, it is preferred that the liquid crystal element be positioned above the second insulating layer and include a liquid crystal, a fourth conductive layer, and a fifth conductive layer, and that the fourth conductive layer be electrically connected to the second conductive layer.

Another embodiment of the present invention is a display device including any of the above semiconductor devices and a light-emitting element. In this case, it is preferred that the light-emitting element be positioned above the second insulating layer and include a sixth conductive layer, a seventh conductive layer, and a light-emitting layer therebetween, and that the sixth conductive layer be electrically connected to the second conductive layer.

One embodiment of the present invention can provide a semiconductor device with favorable electrical characteristics, a semiconductor device with stable electrical characteristics, or a highly reliable semiconductor device or display device.

Note that the description of these effects does not preclude the existence of other effects. One embodiment of the present invention does not necessarily achieve all the effects listed above. Other effects can be derived from the description of the specification, the drawings, the claims, and the like.

BRIEF DESCRIPTION OF DRAWINGS

In the accompanying drawings:
FIGS. 9A to 9C each illustrate a structure example of a transistor, a capacitor, and the like;
FIGS. 10A to 10C each illustrate a structure example of a transistor, a capacitor, and the like;
FIGS. 11A to 11F illustrate a method for manufacturing a transistor, a capacitor, and the like;
FIGS. 12A to 12E illustrate a method for manufacturing a transistor, a capacitor, and the like;
FIGS. 13A and 13B illustrate a method for manufacturing a transistor, a capacitor, and the like;
FIGS. 14A to 14D illustrate a method for manufacturing a transistor, a capacitor, and the like.

BEST MODE FOR CARRYING OUT THE INVENTION

Figure 1A:
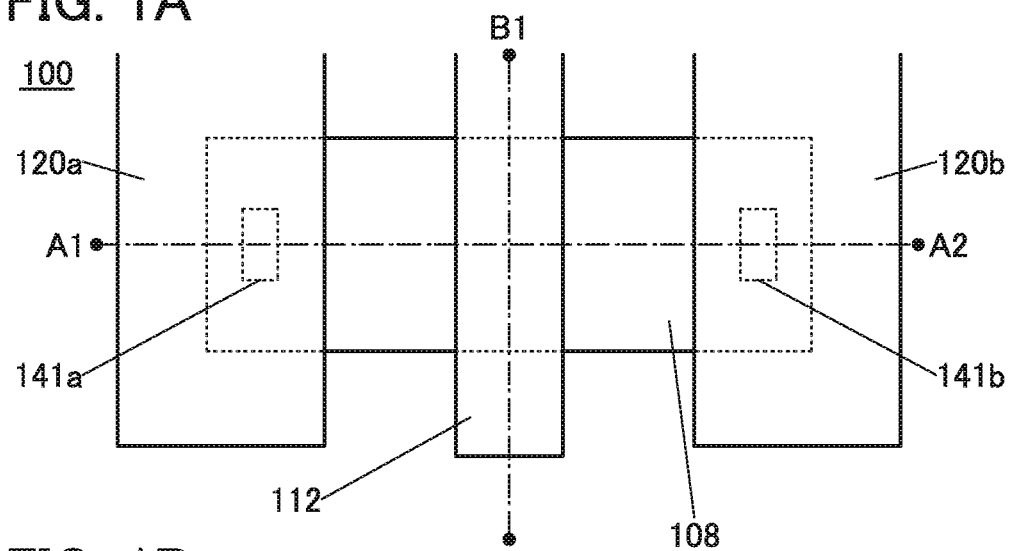
FIGS. 1A to 1C illustrate a structure example of a transistor.

Embodiments will be described below with reference to the accompanying drawings. Note that embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In each drawing described in this specification, the size, the layer thickness, or the region of each component is sometimes exaggerated for clarity. Therefore, the scale is not necessarily limited to that illustrated in the drawings.

In this specification, ordinal numbers such as first, second, and third are used in order to avoid confusion among components, and the terms do not limit the components numerically.

In this specification, terms for describing arrangement (e.g., over, above, under, and below) are used for convenience in describing a positional relation between components with reference to drawings. Furthermore, the positional relationship between components is changed as appropriate in accordance with a direction in which each component is described. Thus, the positional relation is not limited to that described with a term used in this specification and can be explained with another term as appropriate depending on the situation.

Embodiment 1

In this embodiment, examples of a structure and a manufacturing method of a semiconductor device in one embodiment of the present invention will be described. A semiconductor device shown below as an example can be suitably used particularly for a pixel portion or a driver circuit portion of a display device.

One embodiment of the present invention is a transistor including, over a formation surface, a semiconductor layer in which a channel is formed, a gate insulating layer over the semiconductor layer, and a gate electrode over the gate insulating layer. The semiconductor layer contains a metal oxide exhibiting semiconductor properties (hereinafter also referred to as an oxide semiconductor). Hereinafter, the semiconductor layer is sometimes referred to as a first metal oxide layer.

The gate electrode and the gate insulating layer preferably have approximately the same top surface shapes. In other words, the gate electrode and the gate insulating layer are preferably processed so that their side surfaces are continuous. For example, the gate electrode and the gate insulating layer can be formed in such a manner that an insulating film to be the gate insulating layer and a conductive film to be the gate electrode are stacked and then processed continuously with the use of one etching mask. Alternatively, the gate insulating layer may be formed by processing the insulating film with the use of the gate electrode that has been processed in advance as a hard mask.

Here, when a region of the semiconductor layer overlapped by the gate electrode and the gate insulating layer is referred to as a first region and a region not overlapped by these is referred to as a second region, the first region functions as a channel formation region and the second region functions as a source region or a drain region. In this case, the second region preferably has a lower resistance than the first region.

In one embodiment of the present invention, the resistance of the second region is lowered in such a manner that, after the gate insulating layer and the gate electrode are formed over the semiconductor layer, a first layer is formed to cover the second region of the semiconductor layer and heat treatment is performed.

The first layer can be a film containing at least one of metal elements such as aluminum, titanium, tantalum, tungsten, chromium, and ruthenium. The first layer preferably contains at least one of aluminum, titanium, tantalum, and tungsten. Moreover, it is preferable to use a nitride containing at least one of these metal elements or an oxide containing at least one of these metal elements. In particular, it is preferable to use a metal film such as a tungsten film or a titanium film, a nitride film such as an aluminum titanium nitride film, a titanium nitride film, or an aluminum nitride film, or an oxide film such as an aluminum titanium oxide film, for example.

For example, in the case of using an aluminum titanium nitride film, the film preferably satisfies a composition formula of $AlTiN_x$ (x is a real number larger than 0 and smaller than or equal to 3) or a composition formula of $AlTi_xN_y$ (x is a real number larger than 0 and smaller than or equal to 2, y is a real number larger than 0 and smaller than or equal to 4).

The temperature of the heat treatment is preferably high because the treatment with a higher temperature can further accelerate the reduction in resistance of the second region. The temperature of the heat treatment is determined in consideration of the heat resistance of the gate electrode, for example. The temperature can range from 200° C. to 500° C., preferably from 250° C. to 450° C., further preferably from 300° C. to 400° C., for instance. When the temperature of the heat treatment is approximately 350° C., for example, the semiconductor device can be manufactured at a high yield with production facilities using a large-size glass substrate.

The thickness of the first layer can range, for example, from 0.5 nm to 20 nm, preferably from 0.5 nm to 15 nm, further preferably from 0.5 nm to 10 nm, still further preferably 1 nm to 6 nm. Typically, the thickness of the first layer can be approximately 5 nm or approximately 2 nm. With such a thin first layer, the resistance of the metal oxide film can be sufficiently lowered.

The second region can also be referred to as a low-resistance region, and it is important that the second region have a higher carrier density than the channel formation region. For example, the low-resistance region can be a region having a higher hydrogen content than the channel formation region, or a region including a larger amount of oxygen vacancy than the channel formation region. When bonded to a hydrogen atom, oxygen vacancy in the oxide semiconductor serves as a carrier generation source.

The heat treatment is performed while the first layer is provided in contact with the second region, whereby oxygen in the second region is absorbed into the first layer, and thus, a large amount of oxygen vacancy can be generated in the second region. Hence, the second region with an extremely low resistance can be formed.

The second region formed in the above manner has a feature in that its resistance is not likely to be increased by subsequent process steps. There is no possibility that the conductivity of the second region is impaired by heat treatment in an atmosphere containing oxygen or by film formation in an atmosphere containing oxygen, for example; thus, a transistor with favorable electrical characteristics and high reliability can be fabricated.

When the first layer that has undergone the heat treatment has conductivity, the first layer is preferably removed after the heat treatment. In contrast, when the first layer has insulating properties, the first layer can remain and function as a protective insulating film.

It is particularly preferable to make the aluminum titanium nitride film mentioned above remain because of its excellent insulating properties.

Here, with the method for lowering the resistance of a metal oxide film, one of electrodes of a capacitor can be formed at the same time. A method for manufacturing the electrodes of the capacitor will be described below.

First, a second metal oxide layer is formed on the same surface as the first metal oxide layer. It is preferable to form the second metal oxide layer by processing a metal oxide film part of which is to be the first metal oxide layer, in which case the number of steps is not increased. Next, the first layer is formed in contact with the second metal oxide layer, and then heat treatment is performed; thus, the second metal oxide layer with a lower resistance can be formed.

The other electrode of the capacitor is preferably a conductive layer formed by processing a conductive film part of which is to be a conductive layer included in the transistor. The other electrode of the capacitor can be formed by processing a conductive film part of which is to be source and drain electrodes or a second gate electrode of the transistor, for example.

Here, when the other electrode of the capacitor is formed by processing a conductive film part of which is to be the source or drain electrode of the transistor, the first layer with insulating properties can be provided between the pair of electrodes. For example, the aluminum titanium nitride film mentioned above is preferably used for the dielectric of the capacitor because of its high insulating properties and a relatively high dielectric constant.

As described above, in one embodiment of the present invention, the transistor and the capacitor can be manufactured in the same process. For example, the transistor and the capacitor can be suitably used in a pixel portion and a driver circuit portion of a display device including a liquid crystal element or a light-emitting element. This enables the fabrication of a highly reliable display device.

Specific examples will be described below with reference to drawings.

Structure Example 1

Figure 1B:
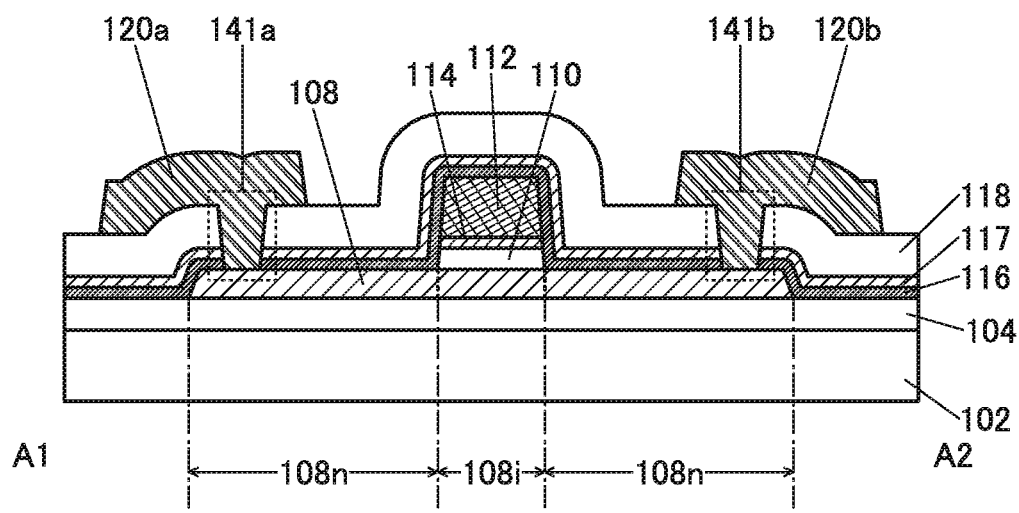
Figure 1C:
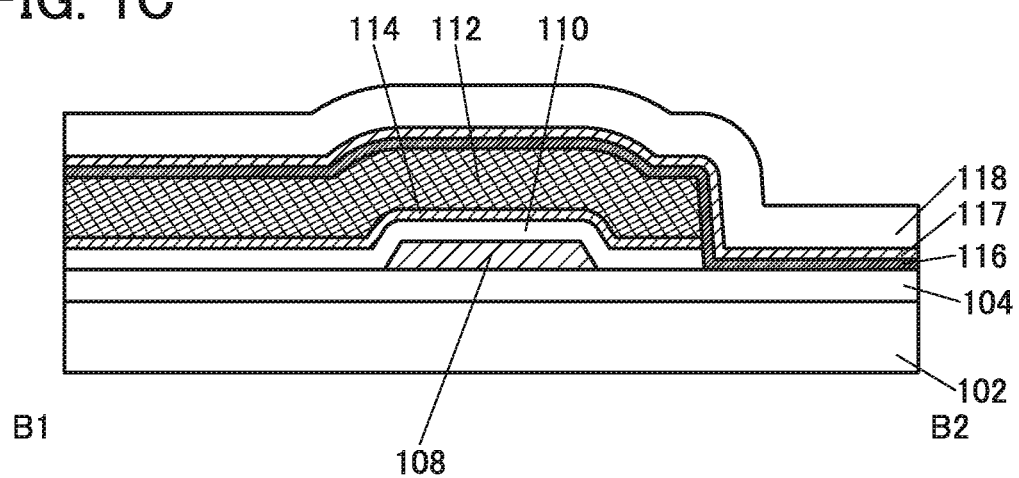

FIG. 1A is a top view of a transistor 100. FIG. 1B is a cross-sectional view along the dashed-dotted line A1-A2 in FIG. 1A. FIG. 1C is a cross-sectional view along the dashed-dotted line B1-B2 in FIG. 1A. Note that in FIG. 1A, some components of the transistor 100 (e.g., a gate insulating layer) are not illustrated. In some cases, the direction of the dashed-dotted line A1-A2 is referred to as a channel length direction, and the direction of the dashed-dotted line B1-B2 is referred to as a channel width direction. As in FIG. 1A, some components are not illustrated in some cases in top views of transistors described below.

The transistor 100 is provided over a substrate 102. The transistor 100 includes an insulating layer 104, a semiconductor layer 108, an insulating layer 110, a metal oxide layer 114, a conductive layer 112, a first layer 116, a metal oxide layer 117, an insulating layer 118, and the like. The semiconductor layer 108 is provided over the insulating layer 104. The insulating layer 110, the metal oxide layer 114, and the conductive layer 112 are stacked in this order over the semiconductor layer 108. The first layer 116 is provided to cover the insulating layer 104, a top surface and a side surface of the semiconductor layer 108, a side surface of the insulating layer 110, a side surface of the metal oxide layer 114, and a top surface and a side surface of the conductive layer 112. The metal oxide layer 117 is provided to cover the first layer 116. The insulating layer 118 is provided to cover the metal oxide layer 117.

Part of the conductive layer 112 functions as a gate electrode. Part of the insulating layer 110 functions as a gate insulating layer. The transistor 100 is a top-gate transistor in which the gate electrode is provided over the semiconductor layer 108.

The semiconductor layer 108 preferably contains a metal oxide. The semiconductor layer 108 includes a region 108$i$ in contact with the insulating layer 110, and a pair of regions 108$n$ between which the region 108$i$ is positioned. The first layer 116 is positioned in contact with the regions 108$n$.

The region 108$i$, which is overlapped by the conductive layer 112, functions as a channel formation region of the transistor 100. The region 108$n$ functions as a source region or a drain region of the transistor 100.

The conductive layer 112, the metal oxide layer 114, and the insulating layer 110 have approximately the same top surface shapes.

Note that in this specification and the like, the expression "having approximately the same top surface shapes" means that edges of stacked layers overlap at least partly, and includes the case where an upper layer and a lower layer are wholly or partly processed using one mask pattern, for example. The expression "having approximately the same top surface shapes" also includes the case where the edges do not completely overlap each other; for instance, the edge of the upper layer may be positioned on the inner side or the outer side of the edge of the lower layer when seen in a top view.

The first layer 116 is provided in contact with the regions 108$n$ of the semiconductor layer 108. The first layer 116 preferably has insulating properties because it is in contact with both the semiconductor layer 108 and the conductive layer 112 as illustrated in FIG. 1B.

The first layer 116 can be a film containing at least one of metal elements such as aluminum, titanium, tantalum, tungsten, chromium, and ruthenium. The first layer 116 preferably contains at least one of aluminum, titanium, tantalum, and tungsten. For example, it is preferable to use a nitride containing at least one of these metal elements or an oxide containing at least one of these metal elements. In particular, it is preferable to use a nitride film such as an aluminum titanium nitride film, a titanium nitride film, or an aluminum nitride film or an oxide film such as an aluminum titanium oxide film, for example.

For example, in the case of using an aluminum titanium nitride film, the film preferably satisfies a composition formula of AlTiN$_x$ (x is a real number larger than 0 and smaller than or equal to 3) or a composition formula of AlTi$_x$N$_y$ (x is a real number larger than 0 and smaller than or equal to 2, y is a real number larger than 0 and smaller than or equal to 4).

As another example, in the case of using a titanium nitride film, the film preferably satisfies a composition formula of TiN$_x$ (x is a real number larger than 0 and smaller than or equal to 2). In the case of using an aluminum nitride film, the film preferably satisfies a composition formula of AlN$_x$ (x is a real number larger than 0 and smaller than or equal to 2).

The region 108$n$ is part of the semiconductor layer 108 and has a lower resistance than the region 108$i$ serving as the channel formation region. The region 108$n$ has a higher carrier density, a higher oxygen vacancy density, a higher nitrogen concentration, higher n-type conductivity, or a higher hydrogen concentration than the region 108$i$. Moreover, a metal element contained in the first layer 116 may be diffused into the region 108$n$.

As illustrated in FIGS. 1A and 1B, the transistor 100 may include a conductive layer 120$a$ and a conductive layer 120$b$ over the insulating layer 118. The conductive layers 120a and 120b function as a source electrode and a drain electrode. The conductive layers 120a and 120b are electrically connected to the regions 108n through openings 141a and 141b provided in the first layer 116, the metal oxide layer 117, and the insulating layer 118.

The insulating layer 110 serving as the gate insulating layer preferably includes an excess oxygen region. When the insulating layer 110 includes an excess oxygen region, excess oxygen can be supplied to the semiconductor layer 108. As a result, oxygen vacancy that might be formed in the semiconductor layer 108 can be filled with excess oxygen, and thus, the semiconductor device can have high reliability.

The metal oxide layer 114 positioned between the insulating layer 110 and the conductive layer 112 functions as a barrier film that prevents oxygen released from the insulating layer 110 from diffusing into the conductive layer 112. The metal oxide layer 114 can be formed using a material that is less permeable to oxygen than at least the insulating layer 110, for example.

In this structure, the metal oxide layer 114 with high barrier properties is provided between the conductive layer 112 and the insulating layer 110; thus, oxygen diffusion from the insulating layer 110 into the conductive layer 112 can be prevented even when the conductive layer 112 is formed using a metal that is likely to absorb oxygen, such as aluminum or copper. Furthermore, even when the conductive layer 112 contains hydrogen, supply of hydrogen from the conductive layer 112 to the semiconductor layer 108 through the insulating layer 110 is suppressed. As a result, the carrier density of the region 108i serving as the channel formation region in the semiconductor layer 108 can be reduced.

The metal oxide layer 114 can be formed using an insulating material or a conductive material. The metal oxide layer 114 with insulating properties functions as part of the gate insulating layer, whereas the metal oxide layer 114 with conductivity functions as part of the gate electrode.

The metal oxide layer 114 is preferably formed using an insulating material with a higher dielectric constant than silicon oxide. It is particularly preferable to use an aluminum oxide film, a hafnium oxide film, or a hafnium aluminate film, for example.

A metal oxide film that does not contain nitrogen as its main component (e.g., an aluminum oxide film or a hafnium oxide film) can be provided between the semiconductor layer 108 and the conductive layer 112 serving as the gate electrode. Accordingly, the metal oxide layer 114 can have an extremely low content of a nitrogen oxide ($NO_x$, where x is larger than 0 and smaller than or equal to 2, preferably larger than or equal to 1 and smaller than or equal to 2; typically $NO_2$ or NO) that might form a level in the layer. Thus, a transistor with excellent electrical characteristics and high reliability can be provided.

An aluminum oxide film, a hafnium oxide film, a hafnium aluminate film, and the like have sufficiently high barrier properties even with a small thickness (e.g., a thickness of approximately 5 nm); thus, such a film can be formed thin, which can increase the productivity. For example, the metal oxide layer 114 can have a thickness of 1 nm to 50 nm, preferably 3 nm to 30 nm. Moreover, an aluminum oxide film, a hafnium oxide film, and a hafnium aluminate film have a higher dielectric constant than a silicon oxide film or the like. A thin insulating film with a high dielectric constant can be formed as the metal oxide layer 114; hence, the intensity of gate electric fields applied to the semiconductor layer 108 can be increased compared to the case of using a silicon oxide film or the like. This results in lower driving voltage and lower power consumption.

The metal oxide layer 114 is preferably formed using a sputtering apparatus. For example, when an aluminum oxide film is formed using a sputtering apparatus, film formation in an atmosphere containing an oxygen gas enables oxygen to be added to the semiconductor layer 108 in a favorable manner. An aluminum oxide film formed with a sputtering apparatus is preferable because the film can have high density.

When a conductive material is used for the metal oxide layer 114, an oxide conductive material such as indium oxide or indium tin oxide can be used. Alternatively, the metal oxide applicable to the semiconductor layer 108 may be used. In particular, a material containing the same element as the semiconductor layer 108 is preferably used. Here, for example, the metal oxide layer 114 is preferably formed by a sputtering method using a metal oxide target used to form the semiconductor layer 108, in which case one deposition apparatus can be shared between these formation steps.

It is preferred that water and hydrogen be less likely to diffuse into the metal oxide layer 114, in which case water and hydrogen can prevent from diffusing into the insulating layer 110 and the semiconductor layer 108 even when the conductive layer 112 is formed using a material into which water and hydrogen are likely to diffuse. It is particularly preferable to use an aluminum oxide film or a hafnium oxide film as the metal oxide layer 114 because of their high barrier properties against water and hydrogen.

For the metal oxide layer 117, a material relatively impermeable to oxygen is preferably used, in which case oxygen can be prevented from being released from the semiconductor layer 108, the insulating layer 110, or the like by heat during steps, for example, and diffusing into the insulating layer 118. Thus, the carrier density of the region 108i serving as the channel formation region can be prevented from increasing, resulting in a highly reliable transistor.

For the metal oxide layer 117, a film similar to one used for the metal oxide layer 114 can be employed. Providing the metal oxide layer 117 and the metal oxide layer 114 can more effectively reduce the carrier density of the region 108i serving as the channel formation region in the semiconductor layer 108.

Here, the semiconductor layer 108 and oxygen vacancy that might be formed in the semiconductor layer 108 will be described.

Oxygen vacancy formed in the semiconductor layer 108 is a problem because of its adverse effect on transistor characteristics. For example, oxygen vacancy formed in the semiconductor layer 108 is bonded with hydrogen to serve as a carrier supply source. The carrier supply source generated in the semiconductor layer 108 causes a change in electrical characteristics, typically a shift in threshold voltage, of the transistor 100. Therefore, the amount of oxygen vacancy in the semiconductor layer 108 is preferably as small as possible.

In view of the above, in one embodiment of the present invention, an insulating film near the semiconductor layer 108, specifically the insulating layer 110 formed over the semiconductor layer 108, includes excess oxygen. Oxygen or excess oxygen is transferred from the insulating layer 110 to the semiconductor layer 108, whereby the amount of oxygen vacancy in the semiconductor layer 108 can be reduced.

Note that the insulating layer 104 positioned below the semiconductor layer 108 may include excess oxygen. In that case, excess oxygen is transferred also from the insulating layer 104 to the semiconductor layer 108, whereby the amount of oxygen vacancy in the semiconductor layer 108 can be further reduced.

The semiconductor layer 108 preferably contains a metal oxide. For example, the semiconductor layer 108 preferably contains In, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and Zn. In particular, M is preferably Al, Ga, Y, or Sn.

The semiconductor layer 108 is particularly preferably formed using an oxide containing In, Ga, and Zn.

The semiconductor layer 108 preferably includes a region in which the atomic proportion of In is higher than that of M. A higher atomic proportion of In results in higher field-effect mobility of the transistor.

Here, in a metal oxide containing In, Ga, and Zn, bonding strength between In and oxygen is weaker than bonding strength between Ga and oxygen; hence, with a higher atomic proportion of In, oxygen vacancy tends to be generated in the metal oxide film. There is a similar tendency when a metal element shown above as M is used instead of Ga. A large amount of oxygen vacancy in the metal oxide film leads to deterioration of electrical characteristics and reduction in reliability of a transistor.

In contrast, in one embodiment of the present invention, an extremely large amount of oxygen can be supplied to the semiconductor layer 108 containing a metal oxide; thus, the semiconductor layer 108 can be formed using a metal oxide material with a high atomic proportion of In. Accordingly, it is possible to achieve a transistor with extremely high field-effect mobility, stable electrical characteristics, and high reliability.

For example, a metal oxide in which the atomic proportion of In is 1.5 times or higher, 2 times or higher, 3 times or higher, 3.5 times or higher, or 4 times or higher that of M can be favorably used.

It is particularly preferred that the atomic ratio of In, M, and Zn in the semiconductor layer 108 be In:M:Zn=5:1:6 or in the neighborhood thereof. Here, the term "neighborhood" includes the following: when the proportion of In is 5, the proportion of M ranges from 0.5 to 1.5 and that of Zn ranges from 5 to 7.

Note that the composition of the semiconductor layer 108 is not limited to the above. For example, the atomic ratio of In, M, and Zn in the semiconductor layer 108 is preferably In:M:Zn=4:2:3 or in its neighborhood.

In the composition of the semiconductor layer 108, the atomic proportions of In, M, and Zn may be approximately equal to each other. That is, the semiconductor layer 108 may contain a material with an atomic ratio of In:M:Zn=1:1:1 or in the neighborhood thereof.

When the semiconductor layer 108 includes a region in which the atomic proportion of In is higher than that of M, the transistor 100 can have high field-effect mobility. Specifically, the field-effect mobility of the transistor 100 can exceed 10 cm$^2$/Vs, preferably exceed 30 cm$^2$/Vs.

For example, the use of the transistor with high field-effect mobility in a gate driver that generates a gate signal allows a display device to have a narrow frame (narrow bezel). The use of the transistor with high field-effect mobility in a source driver included in a display device (particularly a demultiplexer connected to an output terminal of a shift register included in the source driver) can reduce the number of wirings connected to the display device.

Even when the semiconductor layer 108 includes a region in which the atomic proportion of In is higher than that of M, the field-effect mobility may sometimes be low if the semiconductor layer 108 has high crystallinity.

The crystallinity of the semiconductor layer 108 can be analyzed by X-ray diffraction (XRD) or with a transmission electron microscope (TEM), for example.

Impurities such as hydrogen and moisture entering the semiconductor layer 108 are a problem because of their adverse effects on transistor characteristics. Thus, the amount of impurities such as hydrogen and moisture in the semiconductor layer 108 is preferably as small as possible.

It is preferable to use a metal oxide film with a low impurity concentration and a low density of defect states as the semiconductor layer 108, in which case the transistor can have excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic metal oxide film has few carrier generation sources, and thus can have a low carrier density. Accordingly, a transistor in which a channel region is formed in the metal oxide film rarely has a negative threshold voltage (is rarely normally on). The highly purified intrinsic or substantially highly purified intrinsic metal oxide film has a low density of defect states and thus has a low density of trap states in some cases. Furthermore, the highly purified intrinsic or substantially highly purified intrinsic metal oxide film has an extremely low off-state current; even when an element has a channel width of $1 \times 10^6$ μm and a channel length of 10 μm, the off-state current can be less than or equal to the measurement limit of a semiconductor parameter analyzer, that is, less than or equal to $1 \times 10^{-13}$ A, at a voltage between a source electrode and a drain electrode (drain voltage) of 1 V to 10 V.

The semiconductor layer 108 may have a stacked structure including two or more layers.

For example, the semiconductor layer 108 can be a stack including at least two metal oxide films with different compositions.

For instance, in the case of using an In—Ga—Zn oxide, the semiconductor layer 108 is preferably a stack including at least two films each formed using a sputtering target with an atomic ratio of In:M:Zn=5:1:6, 4:2:3, 1:1:1, 1:3:4, or 1:3:2 or in the neighborhood thereof.

Alternatively, the semiconductor layer 108 can be a stack including at least two metal oxide films with different crystallinities.

For example, when a stack of two metal oxide films with different crystallinities is used as the semiconductor layer 108, it is preferable to form the two films successively without exposure to the air by using one oxide target and employing different deposition conditions.

For example, the oxygen flow rate ratio at the time of forming an earlier-formed first metal oxide film is set smaller than that at the time of forming a subsequently formed second metal oxide film. Alternatively, a condition without oxygen flowing is employed at the time of forming the first metal oxide film. In such a manner, oxygen can be effectively supplied at the time of forming the second metal oxide film. The first metal oxide film can have lower crystallinity and higher electric conductivity than the second metal oxide film. With the second metal oxide film, which is the upper film in the stack, having higher crystallinity than the first metal oxide film, damage caused at the time of processing the semiconductor layer 108 or forming the insulating layer 110 can be reduced. For example, a CAC-OS film and a CAAC-OS film can be used as the first metal oxide film and the second metal oxide film, respectively.

Specifically, the oxygen flow rate ratio at the time of forming the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of forming the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Although the deposition conditions such as pressure, temperature, and power may vary between the first metal oxide film and the second metal oxide film, it is preferable to employ the same conditions other than the oxygen flow rate ratio, in which case the time required for these deposition steps can be shortened.

When the semiconductor layer 108 has such a stacked structure, a transistor with excellent electrical characteristics and high reliability can be obtained.

The above is the description of Structure Example 1.

Structure examples of transistors that are partly different from Structure Example 1 will be described below. Note that the description of the same portions as those in Structure Example 1 is omitted in some cases. In drawings that are referred to later, portions having functions similar to those in Structure Example 1 are shown with the hatching pattern used in FIGS. 1B and 1C and are not denoted by reference numerals in some cases.

Structure Example 2

Figure 2A:
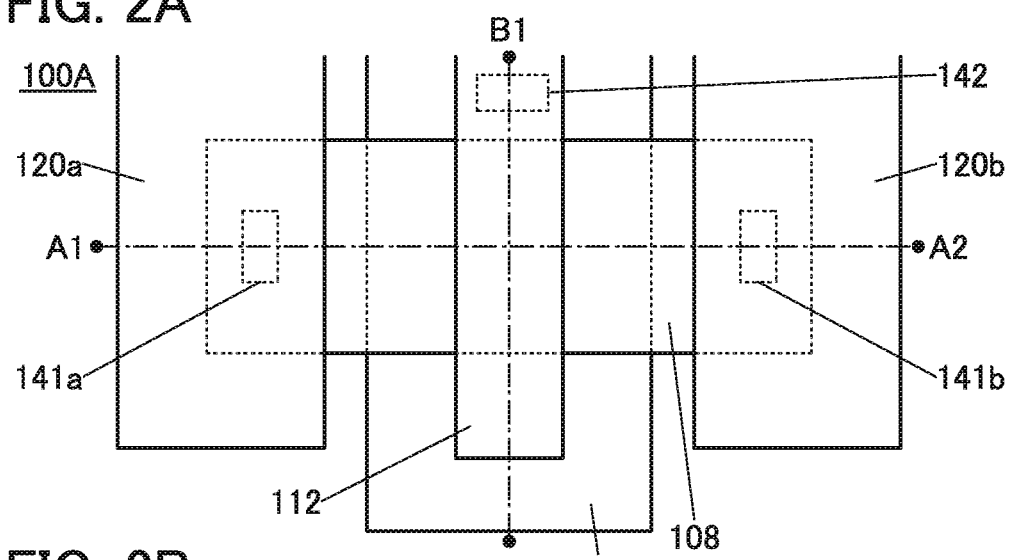
FIGS. 2A to 2C illustrate a structure example of a transistor.
Figure 2B:
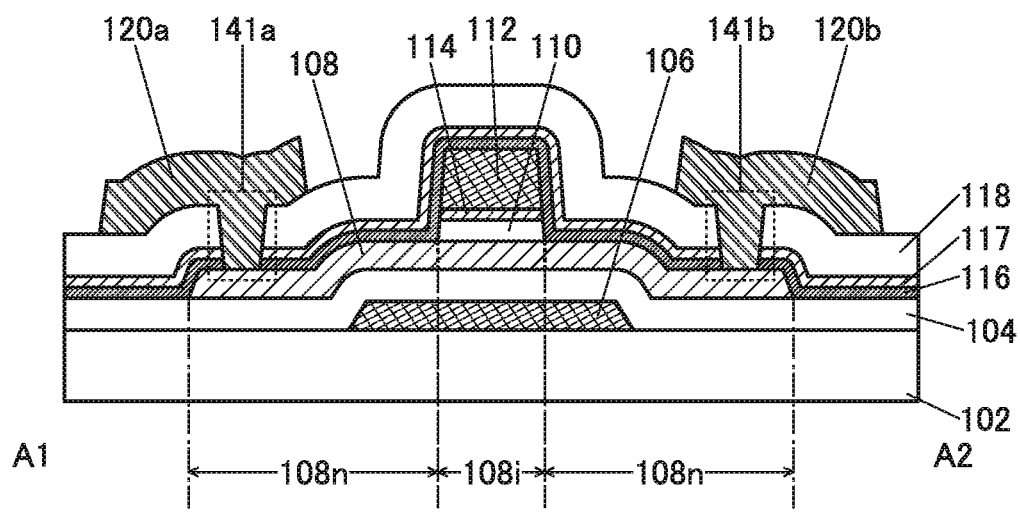
Figure 2C:
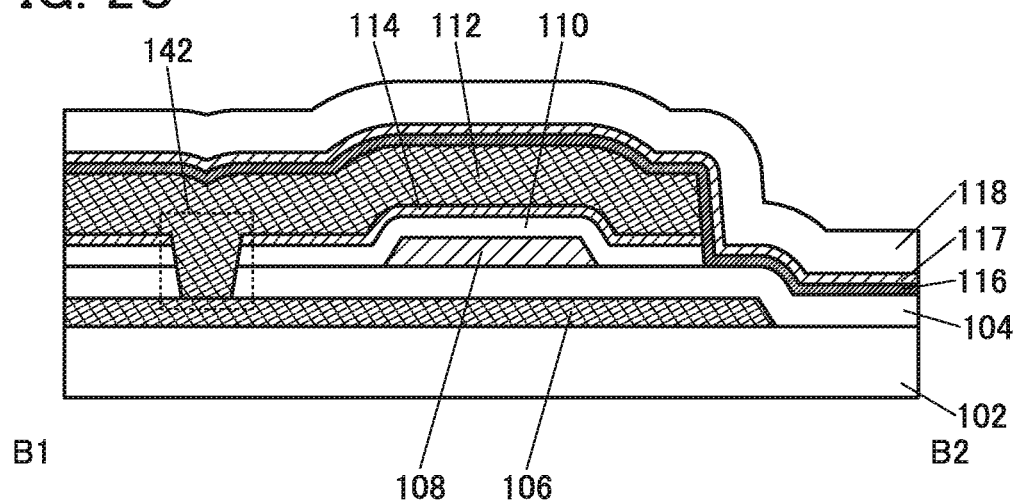

FIG. 2A is a top view of a transistor 100A. FIG. 2B is a cross-sectional view of the transistor 100A in the channel length direction. FIG. 2C is a cross-sectional view of the transistor 100A in the channel width direction.

The transistor 100A is different from the transistor 100 of Structure Example 1 mainly in that the transistor 100A includes a conductive layer 106 between the substrate 102 and the insulating layer 104. The conductive layer 106 includes a region that is overlapped by the semiconductor layer 108 with the insulating layer 104 positioned therebetween.

In the transistor 100A, the conductive layer 106 functions as a first gate electrode (also referred to as bottom gate electrode), and the conductive layer 112 functions as a second gate electrode (also referred to as top gate electrode). Part of the insulating layer 104 functions as a first gate insulating layer, and part of the insulating layer 110 functions as a second gate insulating layer.

In the semiconductor layer 108, a region where the semiconductor layer 108 and at least one of the conductive layer 112 and the conductive layer 106 overlap functions as a channel formation region. For simplicity, a region of the semiconductor layer 108 that is overlapped by the conductive layer 112 (a region corresponding to the region 108i) is hereinafter sometimes referred to as a channel formation region; in fact, a channel may also be formed in a region of the semiconductor layer 108 that is not overlapped by the conductive layer 112 but overlaps the conductive layer 106 (i.e., a region corresponding to the region 108n).

As illustrated in FIG. 2C, the conductive layer 106 may be electrically connected to the conductive layer 112 through an opening 142 formed in the insulating layer 104 and the insulating layer 110. In that case, the conductive layer 106 and the conductive layer 112 can be supplied with the same potential.

The conductive layer 106 can be formed using a material similar to that used for the conductive layer 112 or the conductive layers 120a and 120b. The conductive layer 106 is particularly preferably formed using a material containing copper, in which case its resistance can be reduced.

As illustrated in FIGS. 2A and 2C, the conductive layer 112 and the conductive layer 106 preferably extend beyond an end portion of the semiconductor layer 108 in the channel width direction. In that case, as shown in FIG. 2C, the semiconductor layer 108 in the channel width direction is wholly covered with the conductive layer 112 and the conductive layer 106 with the insulating layer 110 between the semiconductor layer 108 and the conductive layer 112 and with the insulating layer 104 between the semiconductor layer 108 and the conductive layer 106.

In such a structure, the semiconductor layer 108 can be electrically surrounded by electric fields generated by the pair of gate electrodes. At this time, it is particularly preferable to supply the same potential to the conductive layer 106 and the conductive layer 112. In that case, electric fields for inducing a channel can be effectively applied to the semiconductor layer 108, whereby the on-state current of the transistor 100A can be increased. Thus, the transistor 100A can be miniaturized.

Note that the conductive layer 112 is not necessarily connected to the conductive layer 106. In that case, a constant potential may be supplied to one of the pair of gate electrodes, and a signal for driving the transistor 100A may be supplied to the other. At this time, the potential supplied to the one of the gate electrodes can control the threshold voltage at the time of driving the transistor 100A with the other gate electrode.

The above is the description of Structure Example 2.

Structure Example 3

Figure 3A:
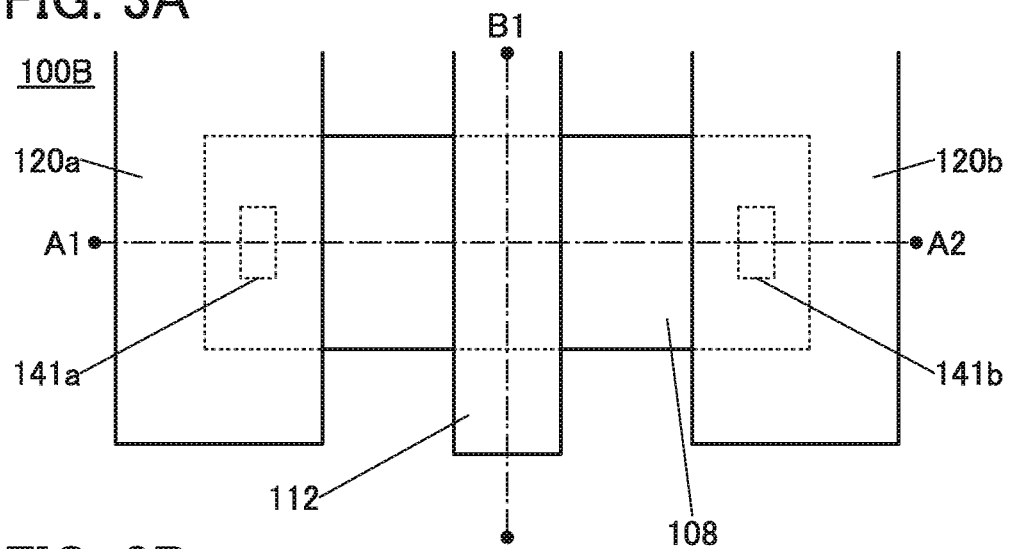
FIGS. 3A to 3C illustrate a structure example of a transistor.
Figure 3B:
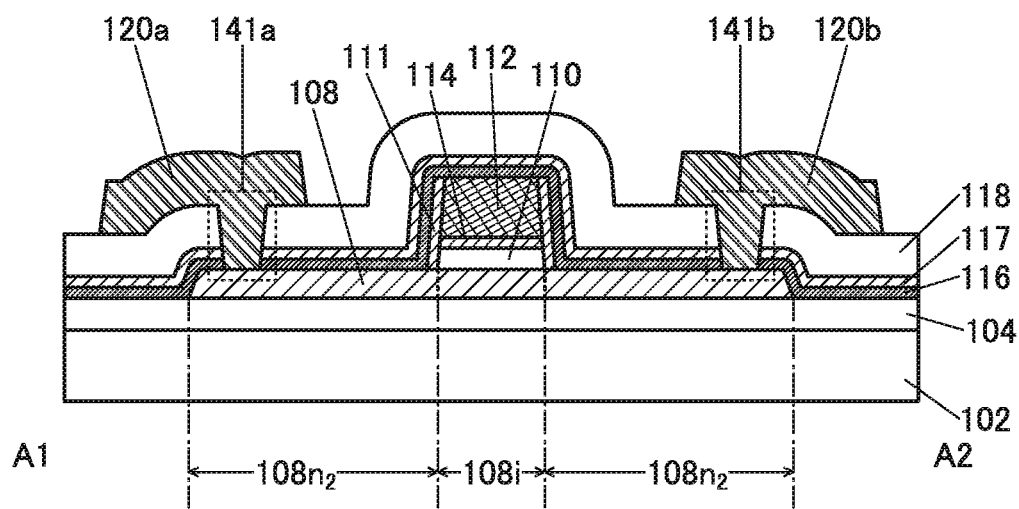
Figure 3C:
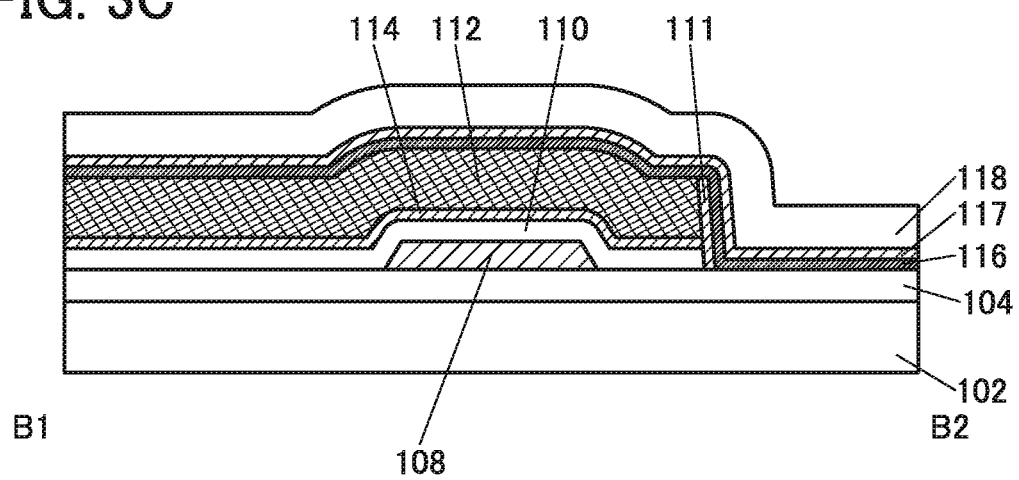

FIG. 3A is a top view of a transistor 100B shown below as an example. FIG. 3B is a cross-sectional view of the transistor 100B in the channel length direction. FIG. 3C is a cross-sectional view of the transistor 100B in the channel width direction.

The transistor 100B is different from the transistor 100 in FIGS. 1A to 1C mainly in that the transistor 100B includes an insulating layer 111.

The insulating layer 111 is provided to cover side surfaces of the conductive layer 112, the metal oxide layer 114, and the insulating layer 110.

The insulating layer 111 functions as a barrier layer and is preferably a layer into which hydrogen, oxygen, water, and the like do not easily diffuse. Providing the insulating layer 111 to cover the side surface of the insulating layer 110, which serves as the gate insulating layer, can prevent diffusion of impurities into the insulating layer 110 and release of oxygen in the insulating layer 110 from its side surface, for example; thus, the reliability can be increased.

The insulating layer 111 is preferably provided to extend from the side surface of the insulating layer 110 to the side surface of the conductive layer 112. This can prevent diffusion of impurities into the interface between the insulating layer 110 and the metal oxide layer 114 and the interface between the metal oxide layer 114 and the conductive layer 112.

As the insulating layer 111, a metal oxide film such as an aluminum oxide film, a hafnium oxide film, or a hafnium aluminate film is preferably used.

An aluminum oxide film, a hafnium oxide film, a hafnium aluminate film, or the like has extremely high barrier properties even when its thickness is small. Accordingly, such a film can have a thickness of 0.5 nm to 50 nm, preferably 1 nm to 40 nm, further preferably 2 nm to 30 nm. In particular, an aluminum oxide film has high barrier properties against hydrogen and the like; hence, sufficient effects are obtained even when the film has an extremely small thickness (e.g., a thickness of 0.5 nm to 1.5 nm).

The insulating layer 111 is preferably formed by a deposition method such as a sputtering method or an atomic layer deposition (ALD) method. Specifically, the insulating layer 111 formed by an ALD method can have high barrier properties because an ALD method enables formation of a highly dense film with high step coverage. A sputtering method is suitable for a large-size glass substrate and thus leads to higher productivity.

The insulating layer 111 can be formed in such a manner, for example, that an insulating film to be the insulating layer 111 is formed and then is processed by anisotropic etching to leave only portions in contact with the side surfaces of the conductive layer 112, the metal oxide layer 114, and the insulating layer 110.

The above is the description of Structure Example 3.

Structure Example 4

Figure 4A:
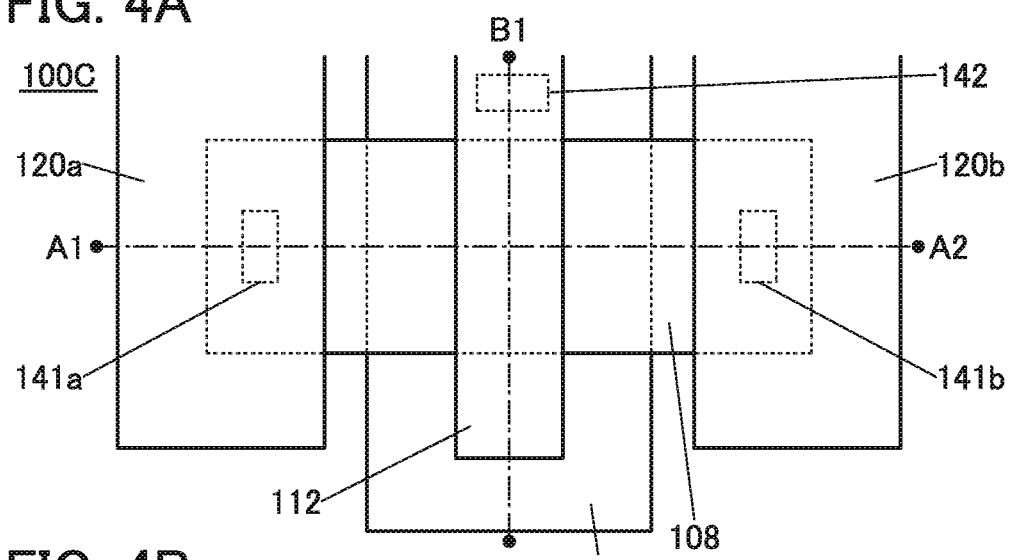
FIGS. 4A to 4C illustrate a structure example of a transistor.
Figure 4B:
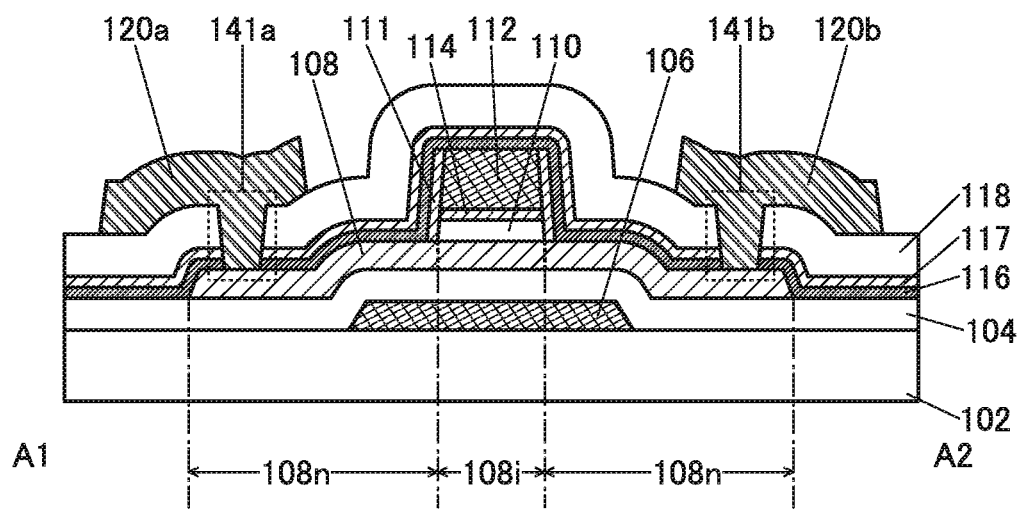
Figure 4C:
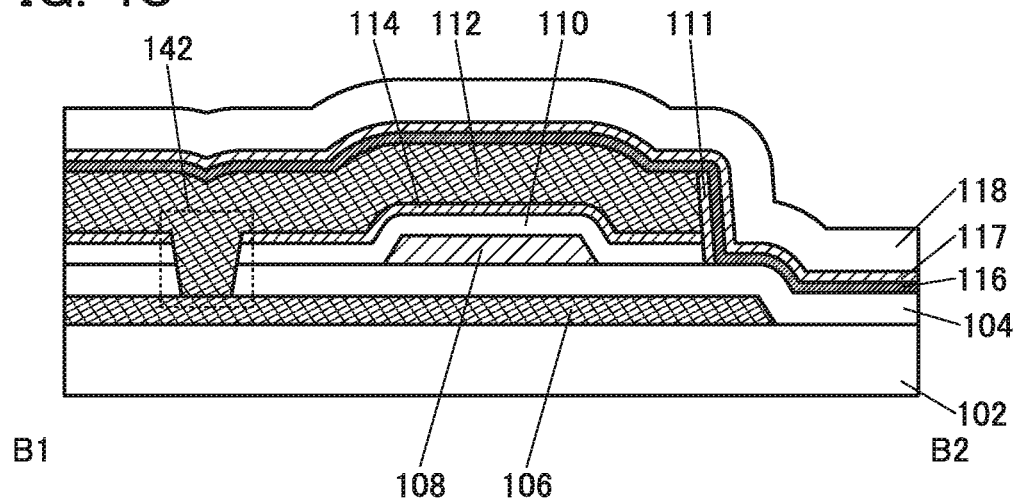

FIG. 4A is a top view of a transistor 100C shown below as an example. FIG. 4B is a cross-sectional view of the transistor 100C in the channel length direction. FIG. 4C is a cross-sectional view of the transistor 100C in the channel width direction.

The transistor 100C differs from the transistor 100A in FIGS. 2A to 2C mainly in that the transistor 100C includes the insulating layer 111.

Like the transistor 100B shown in Structure Example 3, the transistor 100C includes the insulating layer 111 that covers the side surfaces of the conductive layer 112, the metal oxide layer 114, and the insulating layer 110. Thus, diffusion of impurities into the insulating layer 110 and release of oxygen in the insulating layer 110 from its side surface can be prevented, resulting in a highly reliable transistor.

The above is the description of Structure Example 4.

Structure Example 5

Figure 5A:
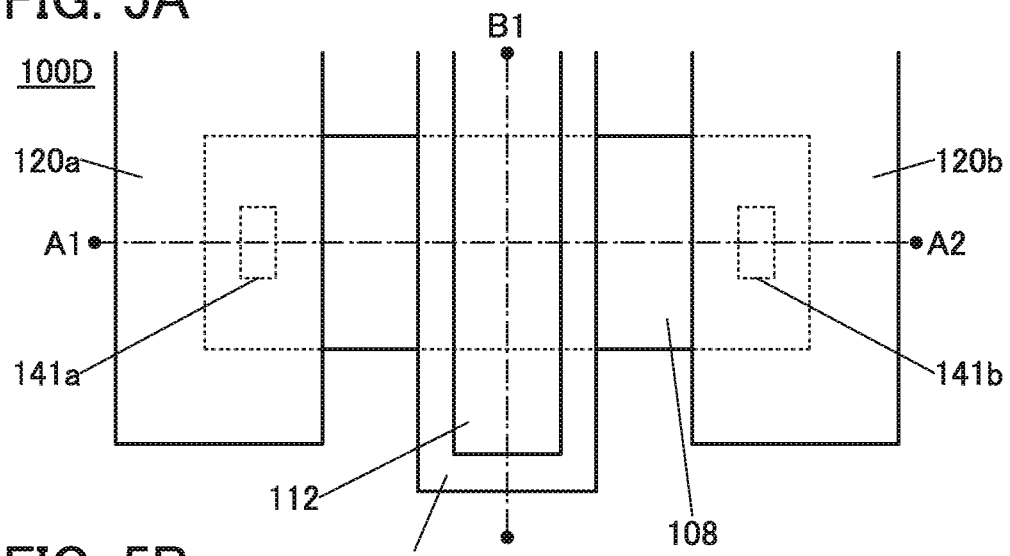
FIGS. 5A to 5C illustrate a structure example of a transistor.
Figure 5B:
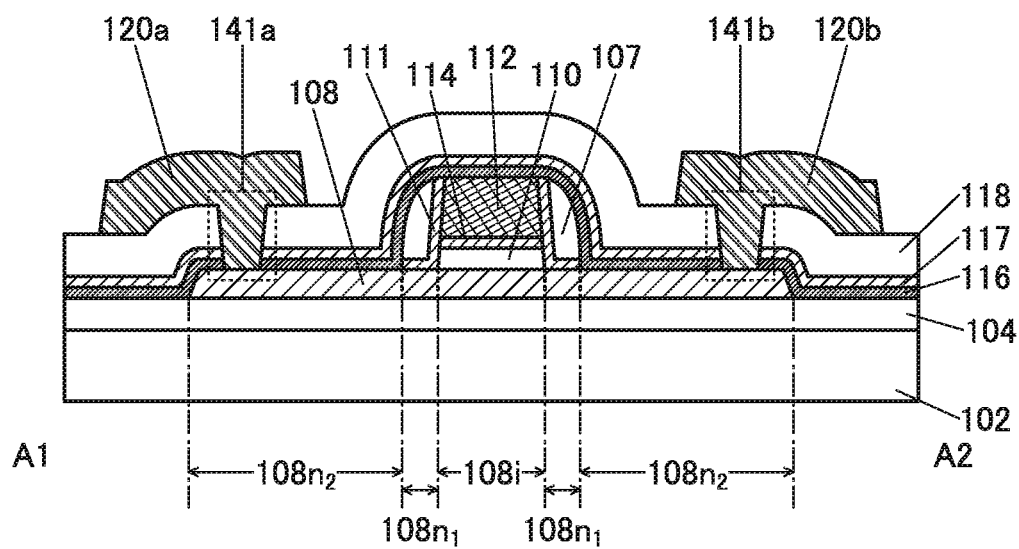
Figure 5C:
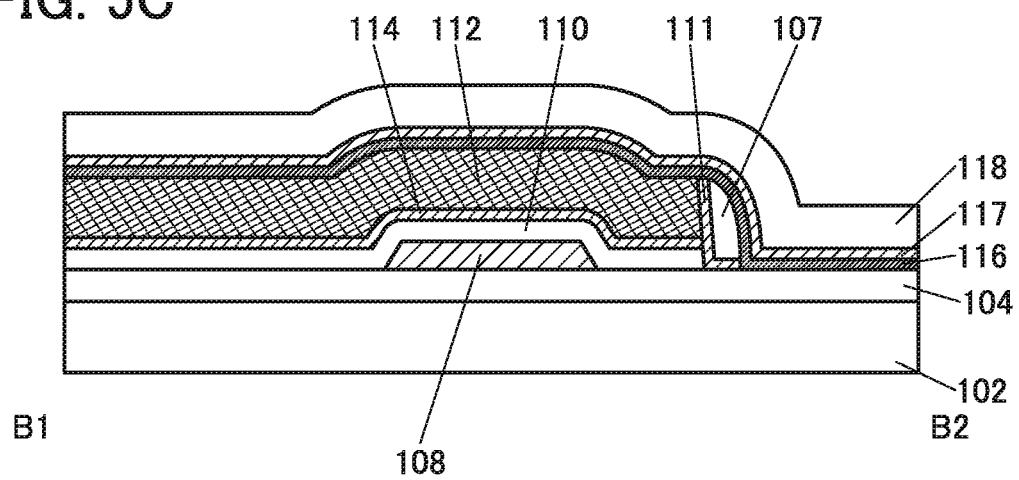

FIG. 5A is a top view of a transistor 100D shown below as an example. FIG. 5B is a cross-sectional view of the transistor 100D in the channel length direction. FIG. 5C is a cross-sectional view of the transistor 100D in the channel width direction.

The transistor 100D differs from the transistor 100 in FIGS. 1A to 1C mainly in that the transistor 100D includes the insulating layer 111 and an insulating layer 107.

The insulating layer 107 is positioned between the insulating layer 110 and the first layer 116. Moreover, the insulating layer 107 is provided in contact with a top surface of a portion of the insulating layer 111 along the side surfaces of the conductive layer 112, the metal oxide layer 114, and the insulating layer 110 and a top surface of a portion of the insulating layer 111 along the top surface of the semiconductor layer 108.

Each of the insulating layers 111 and 107 can be formed in a self-aligned manner without using a photo mask. For example, an insulating film to be the insulating layer 111 and an insulating film to be the insulating layer 107 are stacked and subjected to anisotropic etching without a photomask, whereby the insulating layer 107 along the side surfaces of the conductive layer 112, the metal oxide layer 114, and the insulating layer 110 is formed. Then, the insulating layer 111 can be formed by etching with the insulating layer 107 as a hard mask.

Since the insulating layers 111 and 107 can be formed in a self-aligned manner, a photomask for forming the insulating layer 111 is not necessary, resulting in lower fabrication cost. Moreover, forming the insulating layer 111 in a self-aligned manner does not cause relative misalignment between the insulating layer 111 and the conductive layer 112; hence, the widths of a pair of regions $108m$ functioning as junction regions in the semiconductor layer 108 can be made approximately the same.

The insulating layer 107 can be formed using a material similar to that used for the insulating layer 104 or the insulating layer 118, for example. As the insulating layer 107, an inorganic insulating film such as a silicon oxide film or a silicon oxynitride film can be used, for instance.

Providing the insulating layer 107 can increase the physical distance between the conductive layer 112 and the conductive layer 120a or the conductive layer 120b. This can sometimes lower the parasitic capacitance between the conductive layer 112 and the conductive layer 120a and between the conductive layer 112 and the conductive layer 120b.

As illustrated in FIG. 5B, the insulating layer 111 is provided in contact with part of the top surface of the semiconductor layer 108 on the outside of the end portion (side surface) of the insulating layer 110. In the semiconductor layer 108, a pair of regions that are positioned on the outside of the region $108i$ and overlapped by the insulating layer 111 are denoted by the regions $108n_1$. That is, the region $108n_1$ includes a surface of the semiconductor layer 108 in contact with the insulating layer 111 and a region under the surface.

In the semiconductor layer 108, a pair of regions that are positioned on the outside of the region $108i$ and the pair of regions $108n_1$ are represented by regions $108n_2$. As illustrated in FIG. 5B, the first layer 116 is preferably provided in contact with top surfaces of the regions $108n_2$.

The region $108n_2$ is part of the semiconductor layer 108 and has a lower resistance than the region $108i$ serving as the channel formation region. The region $108n_2$ has a lower resistance than the region $108n_1$.

The region $108n_1$ is positioned between the region $108i$ and the region $108n_2$ and can also be referred to as a junction region. The region $108n_1$ includes a portion whose carrier density is higher than that of the region $108i$ and lower than that of the region $108n_2$. The region $108n_1$ has a higher carrier density, a higher oxygen vacancy density, a higher nitrogen concentration, higher n-type conductivity, or a higher hydrogen concentration than the region $108i$. In addition, the region $108n_1$ has a lower carrier density, a lower oxygen vacancy density, a lower nitrogen concentration, or a lower hydrogen concentration than the region $108n_2$.

As illustrated in FIG. 5B, the insulating layer 111 serving as the barrier layer is provided between the region $108n_1$ and the first layer 116, so that the first layer 116 and the region 108$n_1$ are not in direct contact with each other; hence, the carrier density and the like of the region 108$n_1$ are lower than those of the region 108$n_2$.

Note that the carrier density is not necessarily uniform in the region 108$n_1$; the region 108$n_1$ sometimes has a density gradient that decreases from the region 108$n_2$ side toward the region 108$i$ side. For example, the region 108$n_1$ may have a concentration gradient or a density gradient such that at least one (or two or more) of the hydrogen concentration, nitrogen concentration, and oxygen vacancy density in the region 108$n_1$ decreases from the region 108$n_2$ side toward the region 108$i$ side.

By including the regions 108$n_1$ functioning as the junction regions, the transistor 100D can be highly resistant to high driving voltage and a large amount of current flowing therethrough. Thus, the transistor 100D can be suitably used for a gate driver circuit of a display device, for example.

The above is the description of Structure Example 5.

Structure Example 6

Figure 6A:
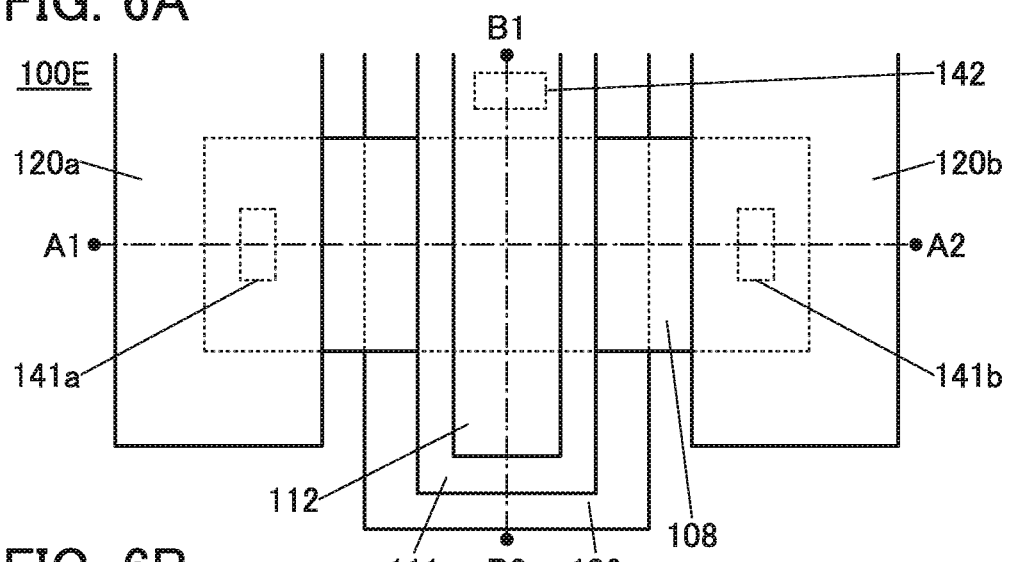
FIGS. 6A to 6C illustrate a structure example of a transistor.
Figure 6B:
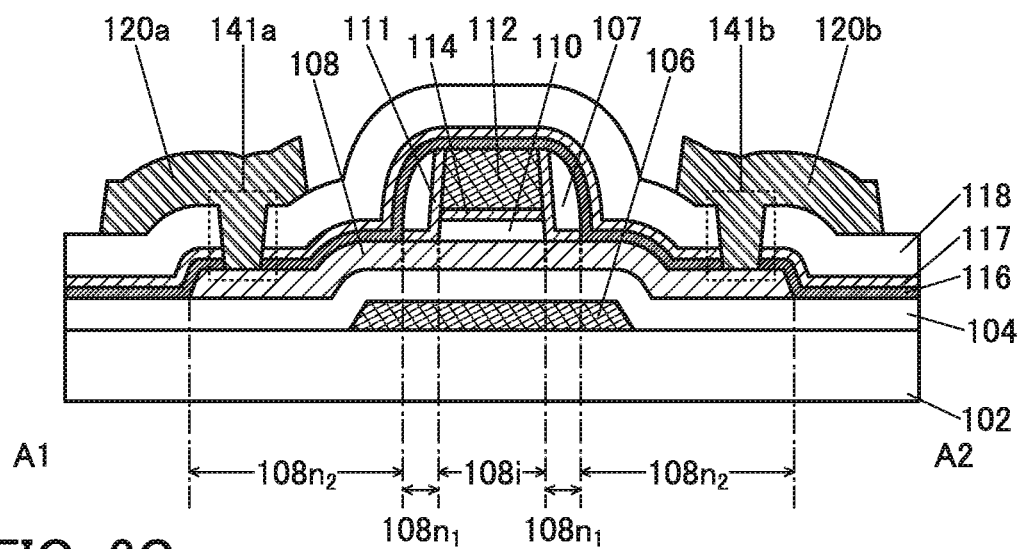
Figure 6C:
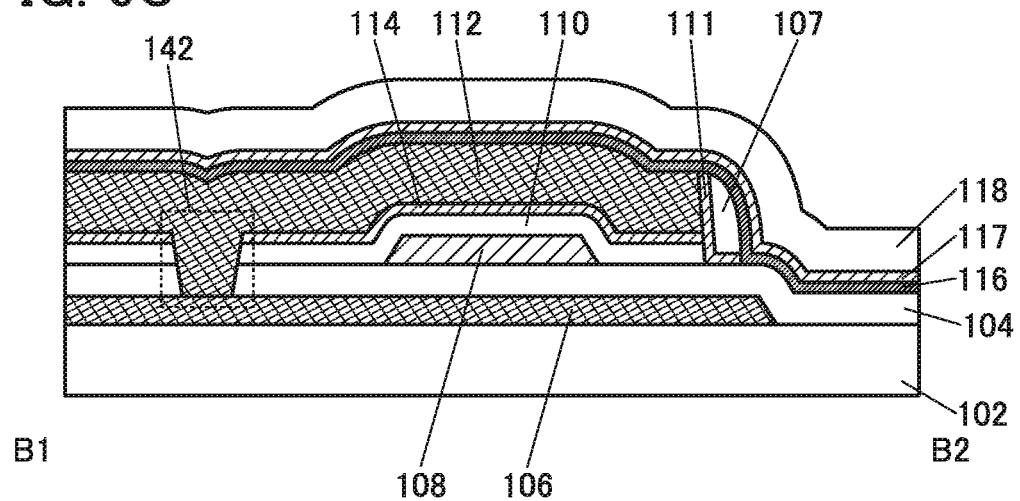

FIG. 6A is a top view of a transistor 100E shown below as an example. FIG. 6B is a cross-sectional view of the transistor 100E in the channel length direction. FIG. 6C is a cross-sectional view of the transistor 100E in the channel width direction.

The transistor 100E differs from the transistor 100D of Structure Example 5 mainly in that the transistor 100E includes the conductive layer 106 functioning as the second gate electrode.

The transistor with such a structure allows a larger amount of current to flow therethrough and can be highly reliable.

The above is the description of Structure Example 6.

Variation examples of Structure Example 1 will be described below.

Variation Example 1

Figure 7A:
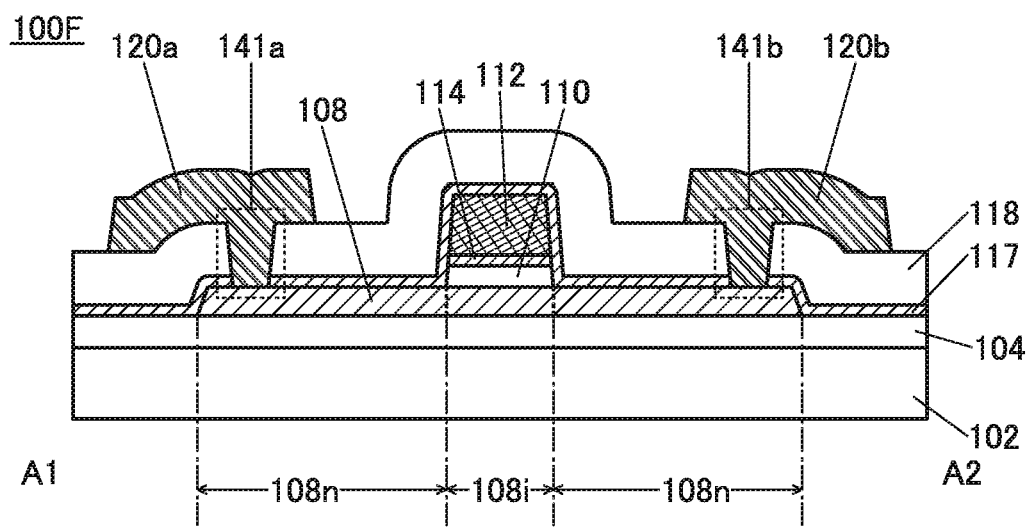
FIGS. 7A and 7B illustrate a structure example of a transistor.
Figure 7B:
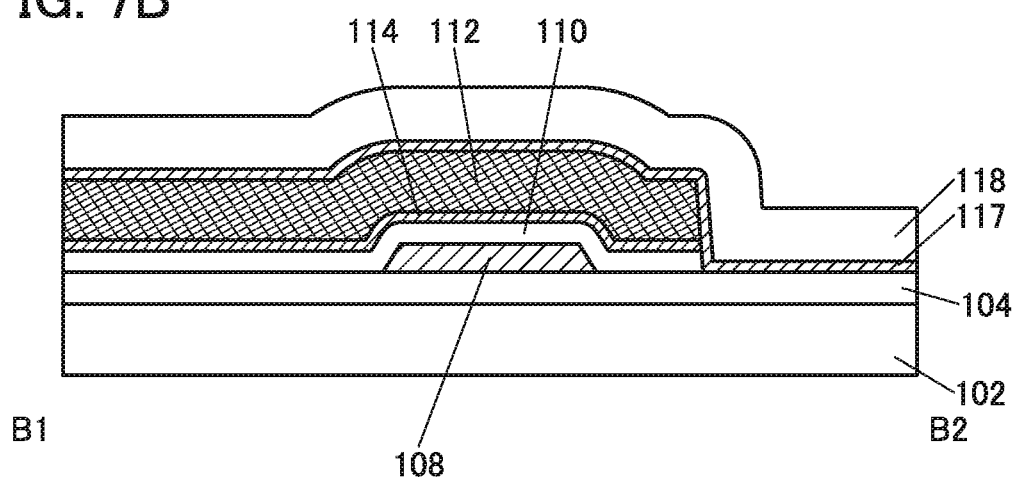

FIGS. 7A and 7B are cross-sectional views of a transistor 100F shown below as an example. FIG. 7A is a cross-sectional view of the transistor 100F in the channel length direction. FIG. 7B is a cross-sectional view of the transistor 100F in the channel width direction. Note that FIG. 1A can be referred to for the top view.

The transistor 100F differs from the transistor 100 shown in Structure Example 1 mainly in that the transistor 100F does not include the first layer 116.

This structure can be obtained in such a manner, for example, that a first layer (a first layer 116$a$ described later) is removed after heat treatment for lowering the resistance of the regions 108$n$ in the semiconductor layer 108.

With the manufacturing method in one embodiment of the present invention, the conductivity of the region 108$n$, whose resistance has been lowered using the first layer 116$a$, does not decrease even if the metal oxide layer 117 is formed on the region 108$n$ in an atmosphere containing oxygen and thus oxygen is supplied to the region 108$n$. Consequently, even when a conductive film is used as the first layer 116$a$ for lowering the resistance of the region 108$n$, the first layer 116$a$ can be removed.

The above is the description of Variation Example 1.

Variation Example 2

Figure 8A:
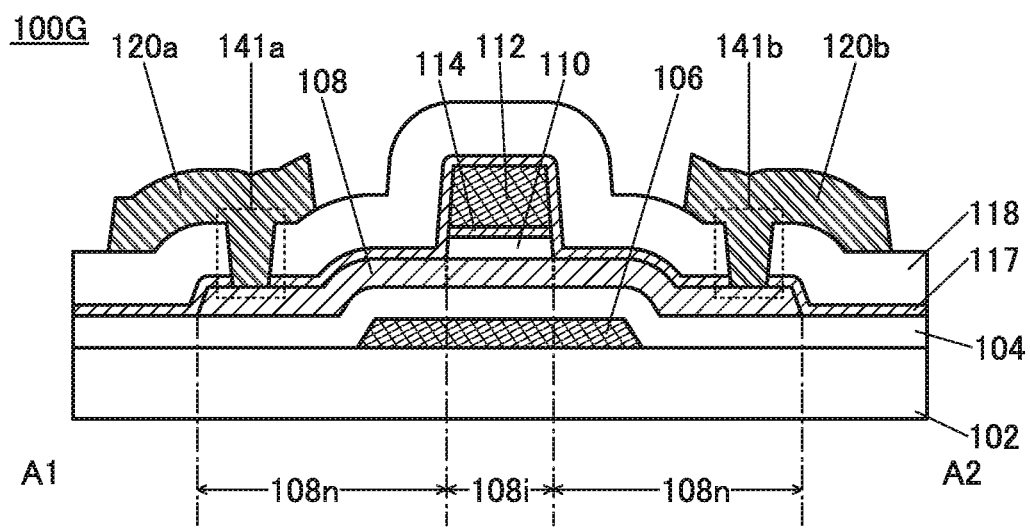
FIGS. 8A and 8B illustrate a structure example of a transistor.
Figure 8B:
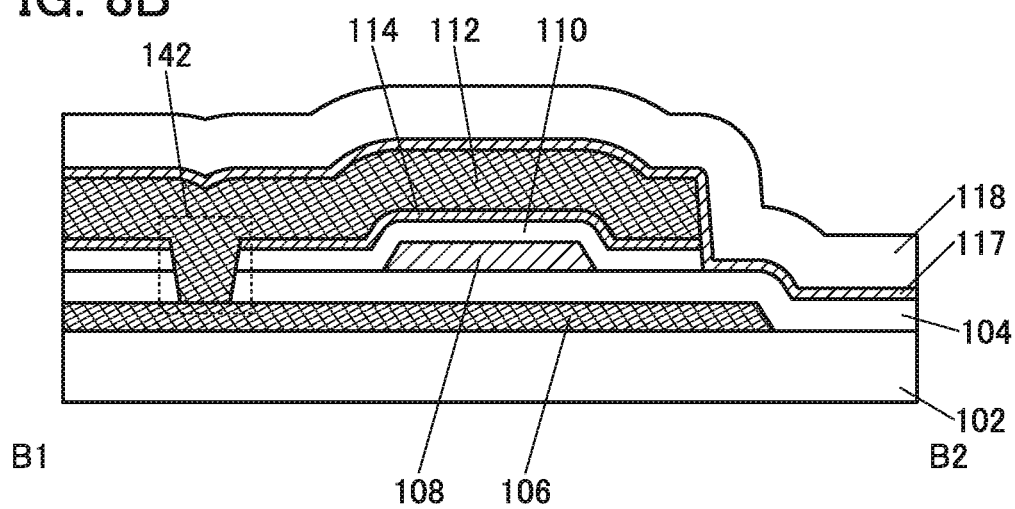

FIGS. 8A and 8B are cross-sectional views of a transistor 100G shown below as an example. FIG. 8A is a cross-sectional view of the transistor 100G in the channel length direction. FIG. 8B is a cross-sectional view of the transistor 100G in the channel width direction. Note that FIG. 2A can be referred to for the top view.

The transistor 100G is different from the transistor 100F of Variation Example 1 mainly in that the transistor 100G includes the conductive layer 106 functioning as the second gate electrode.

The transistor with such a structure allows a larger amount of current to flow therethrough and can be highly reliable.

The above is the description of Variation Example 2.

The description will be made on structure examples in which one electrode of a capacitor is formed using a low-resistance metal oxide layer that is formed on the same surface as the semiconductor layer 108 in any of the above Structure Examples.

Capacitor Structure Example 1

Figure 9A:
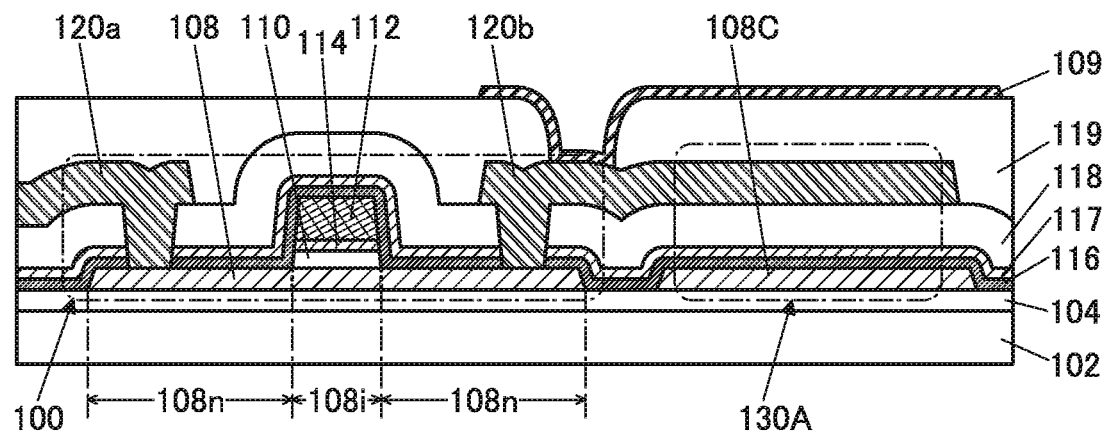

FIG. 9A is a cross-sectional view of the transistor 100 shown in Structure Example 1 and a capacitor 130A that can be formed in the same steps as the transistor 100.

The capacitor 130A is composed of a metal oxide layer 108C functioning as one electrode; the conductive layer 120$b$ functioning as the other electrode; and part of the first layer 116, part of the metal oxide layer 117, and part of the insulating layer 118 that are positioned between the metal oxide layer 108C and the conductive layer 120$b$ and function as the dielectric.

The metal oxide layer 108C is formed by processing a metal oxide film part of which is to be the semiconductor layer 108. The resistance of the metal oxide layer 108C is lowered as in the regions 108$n$ of the semiconductor layer 108.

FIG. 9A illustrates an example in which an insulating layer 119 is provided to cover the conductive layer 120$a$, the conductive layer 120$b$, and the insulating layer 118, and a conductive layer 109 is provided over the insulating layer 119.

The conductive layer 109 can be used as one electrode (a pixel electrode) of a display element. The conductive layer 109 can be formed using a material that reflects visible light, a material that transmits visible light, or the like depending on the structure of the display element.

The conductive layer 109 is electrically connected to the conductive layer 120$b$ through an opening provided in the insulating layer 119.

The insulating layer 119 functions as a planarization film. This can increase the flatness of the surface where the conductive layer 109 serving as the pixel electrode is formed, resulting in improved optical performance of the display element.

Capacitor Structure Example 2

Figure 9B:
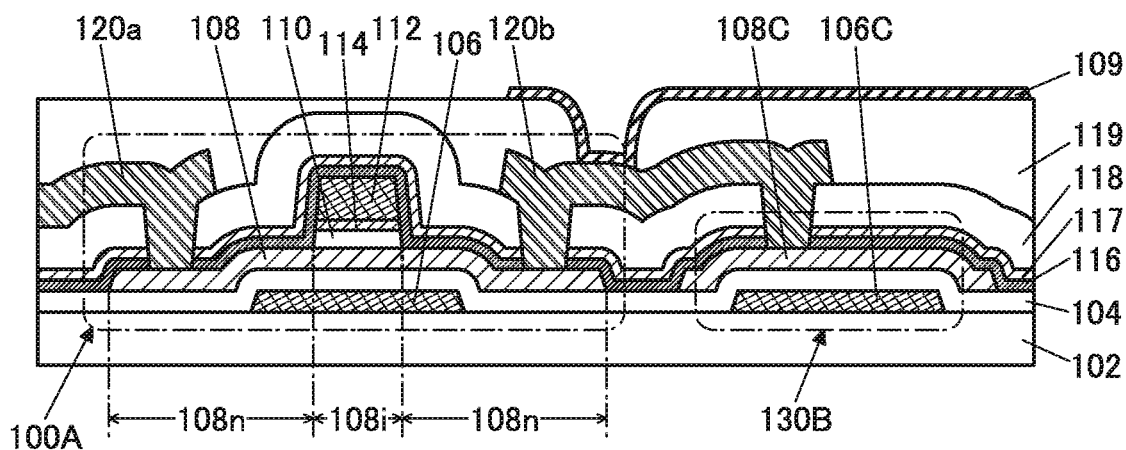

FIG. 9B is a cross-sectional view of the transistor 100A shown in Structure Example 2 and a capacitor 130B that can be formed in the same steps as the transistor 100A.

The capacitor 130B is composed of the metal oxide layer 108C functioning as one electrode, a conductive layer 106C functioning as the other electrode, and part of the insulating layer 104 that is positioned between the metal oxide layer 108C and the conductive layer 106C and functions as the dielectric.

The conductive layer 106C is formed by processing a conductive film part of which is to be the conductive layer 106 serving as the first gate electrode of the transistor 100A.

The conductive layer 120b is electrically connected to the metal oxide layer 108C through an opening provided in the insulating layer 118, the metal oxide layer 117, and the first layer 116. Thus, one of a source and a drain of the transistor 100A and the capacitor 130B are electrically connected to each other.

Capacitor Structure Example 3

Figure 9C:
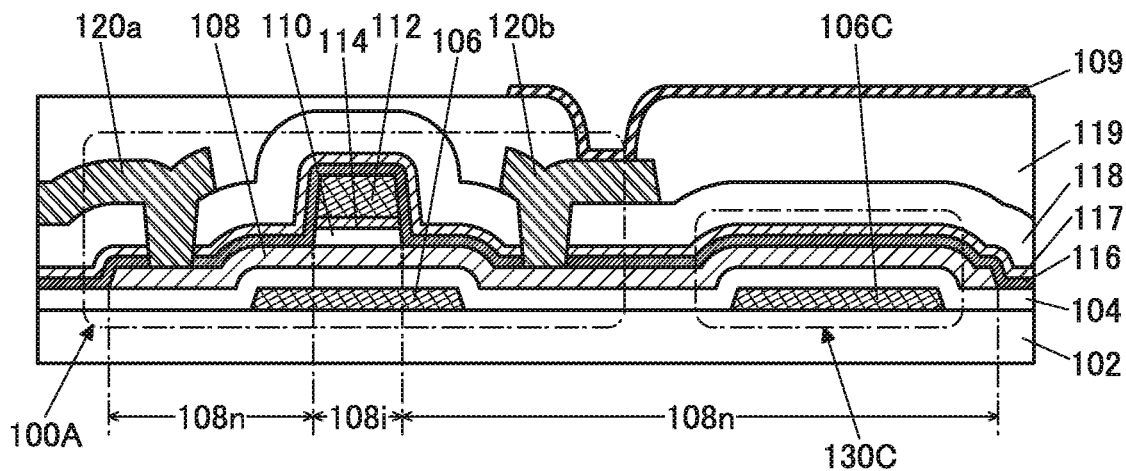

FIG. 9C is a cross-sectional view of the transistor 100A shown in Structure Example 2 and a capacitor 130C that can be formed in the same steps as the transistor 100A.

The capacitor 130C is composed of part of the region 108n in the semiconductor layer 108 functioning as one electrode, the conductive layer 106C functioning as the other electrode, and part of the insulating layer 104 that is positioned between the part of the region 108n and the conductive layer 106C and functions as the dielectric.

The structure illustrated in FIG. 9C can be regarded as a structure where the region 108n of the semiconductor layer 108 and the metal oxide layer serving as the one electrode of the capacitor 130C are seamlessly continuous.

The part of the semiconductor layer 108 (specifically, the region 108n) in the transistor 100A extends beyond a region overlapping the conductive layer 106C and forms the one electrode of the capacitor 130C. Accordingly, the transistor 100A and the capacitor 130C are electrically connected to each other.

Although FIG. 9C illustrates an example where the conductive layer 109 is electrically connected to the region 108n through the conductive layer 120b, the conductive layer 109 and the region 108n may be in direct contact with each other while the conductive layer 120b is not provided.

The transistor 100 illustrated in FIG. 9A can be replaced with the transistor 100B, the transistor 100D, or the transistor 100F.

Figure 10A:
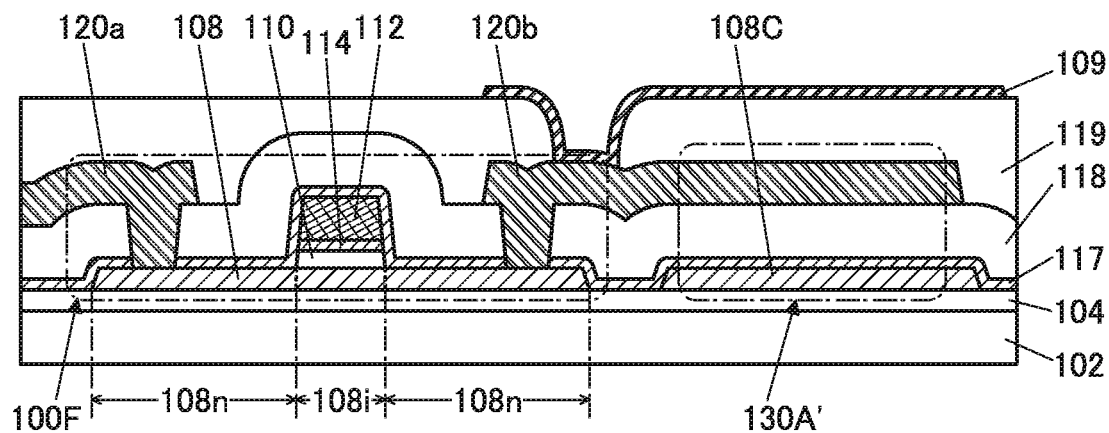

FIG. 10A illustrates an example of using the transistor 100F. A capacitor 130A' illustrated in FIG. 10A has a structure where the first layer 116 is omitted from the capacitor 130A in FIG. 9A.

The transistor 100A illustrated in FIGS. 9B and 9C can be replaced with the transistor 100C, the transistor 100E, or the transistor 100G.

Figure 10B:
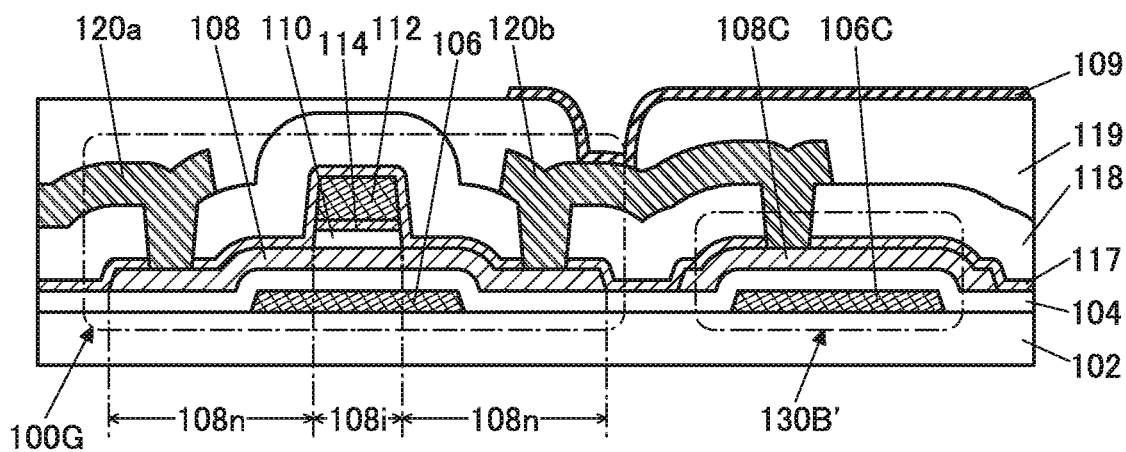
Figure 10C:
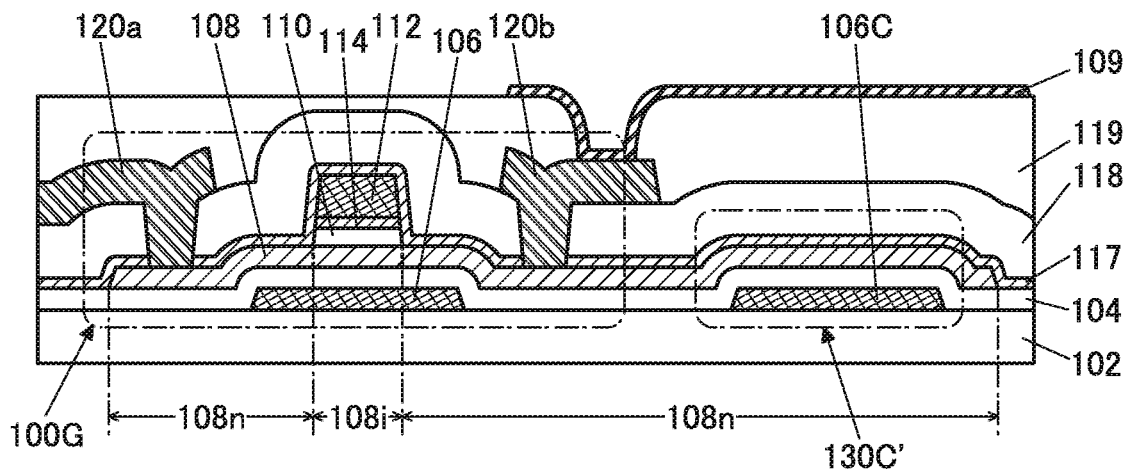

FIGS. 10B and 10C illustrate examples of using the transistor 100G. A capacitor 130B' illustrated in FIG. 10B has a structure where the first layer 116 is omitted from the capacitor 130B. A capacitor 130C' illustrated in FIG. 10C has a structure where the first layer 116 is omitted from the capacitor 130C.

The above is the description of the structure examples of the capacitor.

[Components of Semiconductor Device]

Next, components of the semiconductor device of this embodiment will be described in detail.

<Substrate>

There is no particular limitation on the properties of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon or silicon carbide, a compound semiconductor substrate made of silicon germanium or the like, an SOI substrate, or the like can be used, or any of these substrates provided with a semiconductor element may be used as the substrate 102. When a glass substrate is used as the substrate 102, a large-size display device can be manufactured with any of the following-generation large glass substrates: the 6th generation (1500 mm×1850 mm), 7th generation (1870 mm×2200 mm), 8th generation (2200 mm×2400 mm), 9th generation (2400 mm×2800 mm), 10th generation (2950 mm×3400 mm), 10.5th generation, 11th generation, and 12th generation.

Alternatively, a flexible substrate may be used as the substrate 102, and the transistor 100 and the like may be formed directly on the flexible substrate. Alternatively, a separation layer may be provided between the substrate 102 and the transistor 100 and the like. The separation layer can be used to separate part or all of a semiconductor device formed thereover from the substrate 102 and transfer the separated semiconductor device onto another substrate. In such a case, the transistor 100 and the like can be transferred to a substrate having low heat resistance or a flexible substrate as well.

<Insulating Layer 104>

The insulating layer 104 can be formed by a sputtering method, a CVD method, an evaporation method, a pulsed laser deposition (PLD) method, a printing method, a coating method, or the like as appropriate. The insulating layer 104 can be formed with a single layer or a stack using an oxide insulating film or a nitride insulating film, for example. To improve the properties of the interface between the insulating layer 104 and the semiconductor layer 108, at least a region of the insulating layer 104 that is in contact with the semiconductor layer 108 is preferably formed using an oxide insulating film. When the insulating layer 104 is formed using an oxide insulating film from which oxygen is released by heating, oxygen contained in the insulating layer 104 can be moved to the semiconductor layer 108 by heat treatment.

The thickness of the insulating layer 104 can be greater than or equal to 50 nm, greater than or equal to 100 nm and less than or equal to 3000 nm, or greater than or equal to 200 nm and less than or equal to 1000 nm. By increasing the thickness of the insulating layer 104, the amount of oxygen released from the insulating layer 104 can be increased, and interface states at the interface between the insulating layer 104 and the semiconductor layer 108 and oxygen vacancy included in the semiconductor layer 108 can be reduced.

For example, the insulating layer 104 can be formed to have a single-layer structure or a stacked-layer structure using silicon oxide, silicon oxynitride, silicon nitride oxide, silicon nitride, aluminum oxide, hafnium oxide, gallium oxide, Ga—Zn oxide, or the like. In this embodiment, the insulating layer 104 has a stacked-layer structure of a silicon nitride film and a silicon oxynitride film. With the insulating layer 104 having such a stacked-layer structure including a silicon nitride film as a lower layer and a silicon oxynitride film as an upper layer, oxygen can be efficiently introduced into the semiconductor layer 108.

A film other than an oxide film (e.g., a silicon nitride film) can be used in the part of the insulating layer 104 that is in contact with the semiconductor layer 108. In that case, pretreatment such as oxygen plasma treatment is preferably performed on a surface of the insulating layer 104 that is in contact with the semiconductor layer 108 to oxidize the surface of the insulating layer 104 or the part near the surface.

<Conductive Layer>

The conductive layers 112 and 106 functioning as the gate electrodes and the conductive layers 120a and 120b functioning as the source electrode and the drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy containing any of these metal elements as its component; an alloy containing a combination of any of these metal elements; or the like.

Furthermore, each of the conductive layers 112, 106, 120a, and 120b can be formed using an oxide conductor or a metal oxide such as oxide containing indium and tin (In—Sn oxide), oxide containing indium and tungsten (In—W oxide), oxide containing indium, tungsten, and zinc (In—W—Zn oxide), oxide containing indium and titanium (In—Ti oxide), oxide containing indium, titanium, and tin (In—Ti—Sn oxide), oxide containing indium and zinc (In—Zn oxide), oxide containing indium, tin, and silicon (In—Sn—Si oxide), or oxide containing indium, gallium, and zinc (In—Ga—Zn oxide).

Here, an oxide conductor is described. In this specification and the like, an oxide conductor can also be referred to as OC. For example, an oxide conductor is obtained in the following manner. Oxygen vacancies are formed in a metal oxide, and then hydrogen is added to the oxygen vacancies, so that a donor level is formed in the vicinity of the conduction band. As a result, the conductivity of the metal oxide is increased, and thus, the metal oxide becomes a conductor. The metal oxide having become a conductor can be referred to as an oxide conductor. A metal oxide generally has a visible light transmitting property because of its large energy gap. An oxide conductor is a metal oxide having a donor level in the vicinity of the conduction band. Since the influence of absorption due to the donor level is small in an oxide conductor, an oxide conductor has a visible light transmitting property comparable to that of a metal oxide.

The conductive layer 112 may have a stacked-layer structure of a conductive film containing the above-described oxide conductor (metal oxide) and a conductive film containing a metal or an alloy. The use of the conductive film containing a metal or an alloy can reduce the wiring resistance. At this time, the conductive film in contact with the insulating layer serving as a gate insulating film is preferably a conductive film containing an oxide conductor.

A Cu—X alloy film (X is Mn, Ni, Cr, Fe, Co, Mo, Ta, or Ti) may be used as the conductive layers 112, 106, 120a, and 120b. The use of a Cu—X alloy film results in lower fabrication cost because the film can be processed by wet etching.

Among the above-mentioned metal elements, any one or more elements selected from titanium, tungsten, tantalum, and molybdenum are preferably contained in the conductive layers 112, 106, 120a, and 120b. In particular, a tantalum nitride film is preferably used as the conductive layers 112, 106, 120a, and 120b. A tantalum nitride film has conductivity and high barrier properties against copper and hydrogen. Moreover, a tantalum nitride film releases a small amount of hydrogen from itself, and thus can be favorably used as a conductive film in contact with the semiconductor layer 108 or a conductive film near the semiconductor layer 108.

<Insulating Layer 110>

The insulating layer 110 serving as a gate insulating film of the transistor 100 and the like can be an insulating layer including at least one of the following films formed by a plasma enhanced chemical vapor deposition (PECVD) method, a sputtering method, or the like: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating layer 110 may have a two-layer structure or a stacked-layer structure including three or more layers.

The insulating layer 110, which is in contact with the semiconductor layer 108 serving as a channel region of the transistor 100 and the like, is preferably an oxide insulating film and particularly preferably includes a region including oxygen in excess of the stoichiometric composition (oxygen excess region). In other words, the insulating layer 110 is an insulating film capable of releasing oxygen. In order to provide the oxygen excess region in the insulating layer 110, the insulating layer 110 is formed in an oxygen atmosphere, or the formed insulating layer 110 is subjected to heat treatment in an oxygen atmosphere, for example.

In the case of using hafnium oxide for the insulating layer 110, the following effects are attained. Hafnium oxide has a higher dielectric constant than silicon oxide and silicon oxynitride. Accordingly, the insulating layer 110 using hafnium oxide can have a larger thickness than an insulating layer using silicon oxide; thus, leakage current due to tunneling current can be low. That is, it is possible to provide a transistor with a low off-state current. Moreover, hafnium oxide with a crystal structure has a higher dielectric constant than hafnium oxide with an amorphous structure. Therefore, it is preferable to use hafnium oxide with a crystal structure in order to provide a transistor with a low off-state current. Examples of the crystal structure include a monoclinic crystal system and a cubic crystal system. Note that one embodiment of the present invention is not limited to the above examples.

Preferably, the insulating layer 110 has few defects and typically has as few signals observed by electron spin resonance (ESR) spectroscopy as possible. Examples of the signals include a signal due to an E' center observed at a g-factor of 2.001. Note that the E' center is due to the dangling bond of silicon. As the insulating layer 110, it is possible to use a silicon oxide film or a silicon oxynitride film whose spin density of a signal due to the E' center is lower than or equal to $3\times10^{17}$ spins/cm$^3$, preferably lower than or equal to $5\times10^{16}$ spins/cm$^3$.

<Semiconductor Layer>

When the semiconductor layer 108 contains an In-M-Zn oxide, the atomic ratio of the metal elements in a sputtering target used to form the In-M-Zn oxide preferably satisfies In>M. The atomic ratio of the metal elements in such a sputtering target is, for example, In:M:Zn=1:1:1, 1:1:1.2, 2:1:3, 3:1:2, 4:2:4.1, 5:1:6, 5:1:7, 5:1:8, 6:1:6, or 5:2:5.

When the semiconductor layer 108 contains an In-M-Zn oxide, the sputtering target is preferably a target containing a polycrystalline In-M-Zn oxide. The use of the target containing a polycrystalline In-M-Zn oxide facilitates formation of the semiconductor layer 108 having crystallinity. Note that the atomic ratio of the metal elements in the formed semiconductor layer 108 varies in the range of ±40% from any of the above atomic ratios of the metal elements of the sputtering target. For example, when a sputtering target with an atomic ratio of In:Ga:Zn=4:2:4.1 is used to form the semiconductor layer 108, the atomic ratio of the formed semiconductor layer 108 may sometimes be 4:2:3 or in the neighborhood of 4:2:3.

The energy gap of the semiconductor layer 108 is 2 eV or more, preferably 2.5 eV or more. With the use of a metal oxide having such a wide energy gap, the off-state current of the transistor can be reduced.

The semiconductor layer 108 preferably has a non-single-crystal structure. Examples of the non-single-crystal structure include a c-axis-aligned crystalline oxide semiconductor (CAAC-OS), a polycrystalline structure, a microcrystalline structure, and an amorphous structure. Among the non-single-crystal structure, the amorphous structure has the highest density of defect states, whereas the CAAC-OS has the lowest density of defect states.

Manufacturing Method Example

A method for manufacturing a transistor and a capacitor in one embodiment of the present invention will be described below. Here, the description will be made using the transistor 100A and the capacitor 130B illustrated in FIG. 9B as an example.

Note that thin films (e.g., an insulating film, a semiconductor film, and a conductive film) included in a semiconductor device can be formed by any of a sputtering method, a chemical vapor deposition (CVD) method, a vacuum evaporation method, a pulsed laser deposition (PLD) method, an atomic layer deposition (ALD) method, and the like. As a CVD method, a plasma-enhanced chemical vapor deposition (PECVD) method or a thermal CVD method can be used. An example of a thermal CVD method includes a metal organic CVD (MOCVD) method.

Alternatively, the thin films (e.g., the insulating film, the semiconductor film, and the conductive film) constituting the semiconductor device can be formed by a method such as spin coating, dipping, spray coating, inkjet printing, dispensing, screen printing, or offset printing or with a doctor knife, a slit coater, a roll coater, a curtain coater, or a knife coater.

To process thin films included in the semiconductor device, a photolithography method or the like can be used. Besides, a nanoimprinting method, a sandblasting method, a lift-off method, or the like may be used to process thin films. Alternatively, island-shaped thin films may be formed by a film formation method using a shielding mask such as a metal mask.

There are two typical examples of photolithography methods. In one of the methods, a resist mask is formed over a thin film that is to be processed, the thin film is processed by etching, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet light (EUV) or X-rays may also be used. Instead of the light for exposure, an electron beam can be used. It is preferable to use EUV, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

FIGS. 11A to 11F, FIGS. 12A to 12E, and FIGS. 13A and 13B are cross-sectional views in the channel length direction that illustrate a method for manufacturing the transistor 100A and the capacitor 130B.

<Formation of Conductive Layer 106 and Conductive Layer 106C>

Figure 11A:

A conductive film is formed over the substrate 102 and is processed by etching, so that the conductive layer 106 functioning as a gate electrode and the conductive layer 106C functioning as one electrode of the capacitor are formed at the same time (FIG. 11A).

<Formation of Insulating Layer 104>

Figure 11B:
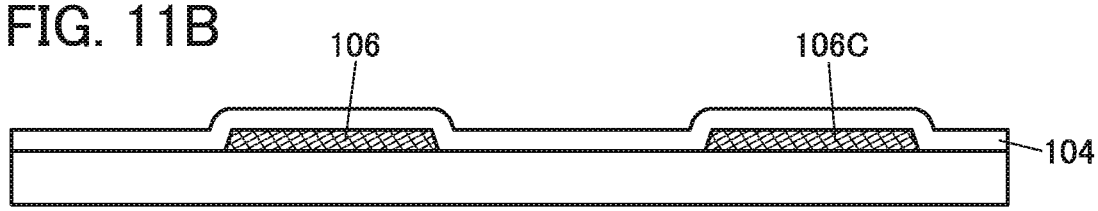

Next, the insulating layer 104 is formed to cover the substrate 102, the conductive layer 106, and the conductive layer 106C (FIG. 11B). The insulating layer 104 can be formed by a plasma CVD method, an ALD method, a sputtering method, or the like.

<Formation of Semiconductor Layer 108 and Metal Oxide Layer 108C>

Figure 11C:
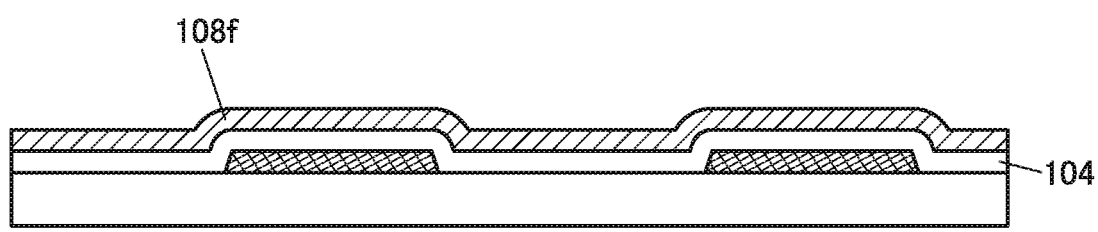

Then, a metal oxide film 108f is formed over the insulating layer 104 (FIG. 11C).

The metal oxide film 108f is preferably formed by a sputtering method using a metal oxide target.

When the metal oxide film 108f is formed, an oxygen gas and an inert gas (e.g., a helium gas, an argon gas, or a xenon gas) may be mixed. Note that the proportion of the oxygen gas in the whole deposition gas (hereinafter also referred to as oxygen flow rate ratio) in forming the metal oxide film 108f is preferably higher than or equal to 0% and lower than or equal to 100%, further preferably higher than or equal to 5% and lower than or equal to 20%. When the oxygen flow rate ratio is reduced to make the metal oxide film 108f have relatively low crystallinity, a transistor with a higher on-state current can be obtained.

The metal oxide film 108f is formed at a substrate temperature higher than or equal to room temperature and lower than or equal to 180° C., preferably higher than or equal to room temperature and lower than or equal to 140° C. The substrate temperature at the time of forming the metal oxide film 108f is preferably, for example, higher than or equal to room temperature and lower than 140° C. because the productivity is increased. When the metal oxide film 108f is formed with the substrate temperature set at room temperature or without intentional heating, the metal oxide film 108f is likely to have low crystallinity.

The thickness of the metal oxide film 108f ranges from 3 nm to 200 nm, preferably from 3 nm to 100 nm, further preferably from 3 nm to 60 nm.

When a large-size glass substrate (e.g., the 6th generation to the 12th generation) is used as the substrate 102 and the metal oxide film 108f is formed at a substrate temperature higher than or equal to 200° C. and lower than or equal to 300° C., the substrate 102 might be changed in shape (distorted or warped). Therefore, when a large-size glass substrate is used, the change in the shape of the glass substrate can be suppressed by forming the metal oxide film 108f at a substrate temperature higher than or equal to room temperature and lower than 200° C.

In addition, increasing the purity of a sputtering gas is necessary. For example, as an oxygen gas or an argon gas used as a sputtering gas, a gas that is highly purified to have a dew point of −40° C. or lower, preferably −80° C. or lower, further preferably −100° C. or lower, still further preferably −120° C. or lower is used, whereby entry of moisture or the like into the metal oxide film 108f can be minimized.

When the metal oxide film 108f is formed by a sputtering method, a chamber in a sputtering apparatus is preferably evacuated to be a high vacuum state (to a degree of about $5 \times 10^{-7}$ Pa to $1 \times 10^{-4}$ Pa) with an adsorption vacuum evacuation pump such as a cryopump in order to remove water and the like, which serve as impurities for the metal oxide, as much as possible. In particular, the partial pressure of gas molecules corresponding to H₂O (gas molecules corresponding to m/z=18) in the chamber of the sputtering apparatus in the standby mode is preferably lower than or equal to $1×10^{-4}$ Pa, further preferably $5×10^{-5}$ Pa.

Before the formation of the metal oxide film 108f, it is preferable to perform heat treatment for releasing water and hydrogen adsorbed on the surface of the insulating layer 104. For example, heat treatment can be performed at a temperature of 70° C. to 200° C. in a reduced-pressure atmosphere. At that time, the metal oxide film 108f is preferably formed successively without exposure of the surface of the insulating layer 104 to the air. For instance, a deposition apparatus is preferably configured so that a heating chamber where the substrate is heated and a deposition chamber where the metal oxide film 108f is formed are connected through a gate valve or the like.

Figure 11D:
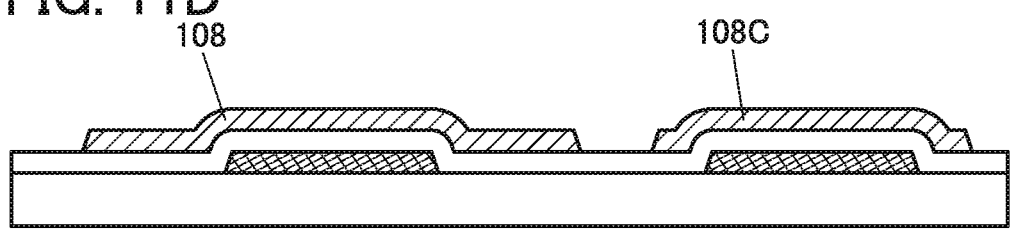

Next, the metal oxide film 108f is processed, so that the island-shaped semiconductor layer 108 and the island-shaped metal oxide layer 108C are formed at the same time (FIG. 11D).

To process the metal oxide film 108f, a wet etching method and/or a dry etching method can be used.

After the metal oxide film 108f is formed or after the semiconductor layer 108 is formed by processing the metal oxide film 108f, heat treatment may be performed to dehydrogenate or dehydrate the metal oxide film 108f or the semiconductor layer 108. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert atmosphere containing nitrogen or a rare gas such as helium, neon, argon, xenon, or krypton. Alternatively, the heat treatment may be performed in an inert atmosphere first, and then performed in an oxygen atmosphere. Preferably, the inert gas atmosphere and the oxygen atmosphere do not contain hydrogen, water, and the like. The treatment time is longer than or equal to 3 minutes and shorter than or equal to 24 hours.

An electric furnace, a rapid thermal annealing (RTA) apparatus, or the like can be used for the heat treatment. The use of an RTA apparatus allows the heat treatment to be performed at a temperature higher than or equal to the strain point of the substrate if the heating time is short. Thus, the heat treatment time can be shortened.

When the metal oxide film 108f is formed while heating is performed or when heat treatment is performed after the metal oxide film 108f is formed, the hydrogen concentration in the metal oxide film 108f, which is measured by secondary ion mass spectrometry (SIMS), can be $5×10^{19}$ atoms/cm³ or lower, $1×10^{19}$ atoms/cm³ or lower, $5×10^{18}$ atoms/cm³ or lower, $1×10^{18}$ atoms/cm³ or lower, $5×10^{17}$ atoms/cm³ or lower, or $1×10^{16}$ atoms/cm³ or lower.

<Formation of Insulating Film 110f>

Next, an insulating film 110f to be the insulating layer 110 is formed over the semiconductor layer 108, the metal oxide layer 108C, and the insulating layer 104.

As the insulating film 110f, an oxide film such as a silicon oxide film or a silicon oxynitride film is preferably formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

As the insulating film 110f, a silicon oxynitride film having few defects can be formed with a PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

Alternatively, as the insulating film 110f, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 350° C., the pressure in the treatment chamber into which a source gas is introduced is set higher than or equal to 20 Pa and lower than or equal to 250 Pa, preferably higher than or equal to 100 Pa and lower than or equal to 250 Pa, and high-frequency power is supplied to an electrode provided in the treatment chamber.

The insulating film 110f may be formed by a PECVD method using a microwave. A microwave refers to a wave in the frequency range of 300 MHz to 300 GHz. In a microwave, the electron temperature and electron energy are low. Furthermore, in supplied power, the proportion of power used for acceleration of electrons is low, and therefore, power can be used for dissociation and ionization of more molecules. Thus, plasma with high density (high-density plasma) can be excited. This method causes little plasma damage to the deposition surface or the deposit, so that the insulating film 110f having few defects can be formed.

Alternatively, the insulating film 110f can be formed by a CVD method using an organosilane gas. As the organosilane gas, any of the following compounds containing silicon can be used, for example: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (SiH(OC₂H₅)₃), and trisdimethylaminosilane (SiH(N(CH₃)₂)₃). By a CVD method using an organosilane gas, the insulating film 110f having high coverage can be formed.

<Formation of Metal Oxide Film 114f>

Then, a metal oxide film 114f to be the metal oxide layer 114 is formed over the insulating film 110f.

The metal oxide film 114f is preferably formed in an atmosphere containing oxygen, for example, and particularly preferably formed by a sputtering method in an atmosphere containing oxygen. Thus, oxygen can be supplied to the insulating film 110f at the time of forming the metal oxide film 114f.

For example, the metal oxide film 114f is preferably formed by a reactive sputtering method with a metal target using oxygen as a deposition gas. When aluminum is used for the metal target, for instance, an aluminum oxide film can be formed.

At the time of forming the metal oxide film 114f, a larger amount of oxygen can be supplied to the insulating film 110f with a higher proportion of the oxygen flow rate to the total flow rate of the deposition gas introduced into a deposition chamber of a deposition apparatus (i.e., with a higher oxygen flow rate ratio), or with a higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferred that the oxygen flow rate ratio be 100% and the oxygen partial pressure be as close to 100% as possible.

When the metal oxide film 114f is formed by a sputtering method in an atmosphere containing oxygen in the above manner, oxygen can be supplied to the insulating film 110f and release of oxygen from the insulating film 110f can be prevented during the formation of the metal oxide film 114f. As a result, an extremely large amount of oxygen can be enclosed in the insulating film 110f. Moreover, a large amount of oxygen can be supplied to the semiconductor layer 108 by heat treatment performed later. Thus, the amount of oxygen vacancy in the semiconductor layer 108 can be reduced, leading to a highly reliable transistor.

Then, after the formation of the metal oxide film 114f, the metal oxide film 114f, the insulating film 110f, and the insulating layer 104 are partly removed by etching to form an opening that reaches the conductive layer 106. Accordingly, the conductive layer 112 that is formed later can be electrically connected to the conductive layer 106 through the opening.

<Formation of Conductive Film 112f>

Figure 11E:
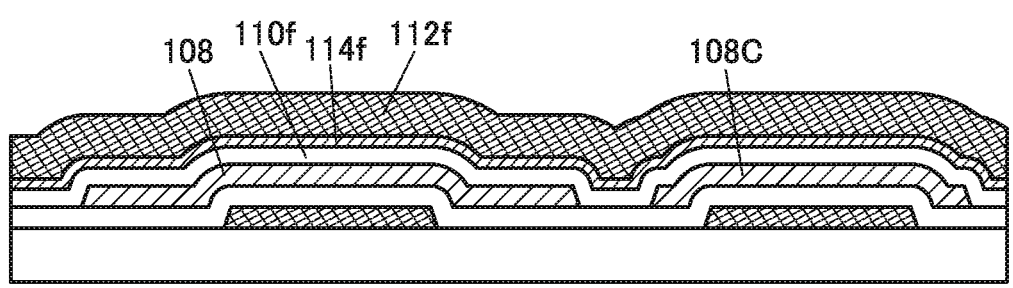

Subsequently, a conductive film 112f to be the conductive layer 112 is formed over the metal oxide film 114f (FIG. 11E).

The conductive film 112f is preferably formed by a sputtering using a sputtering target made of a metal or an alloy.

<Etching of Conductive Film 112f, Metal Oxide Film 114f, and Insulating Film 110f>

Figure 11F:
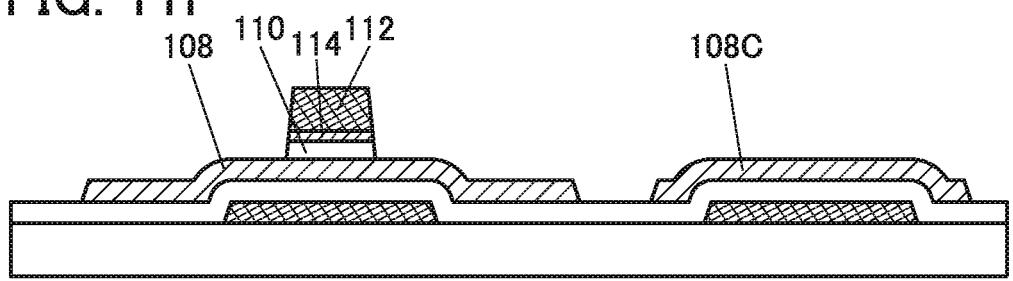

Then, the conductive film 112f, the metal oxide film 114f, and the insulating film 110f are partly removed by etching so that the metal oxide layer 108C and part of the semiconductor layer 108 are exposed (FIG. 11F).

Here, the conductive film 112f, the metal oxide film 114f, and the insulating film 110f are preferably processed using one resist mask. Alternatively, the conductive layer 112 obtained by etching may be used as a hard mask for subsequent etching to obtain the metal oxide layer 114 and the insulating layer 110.

In such a manner, the island-shaped conductive layer 112, metal oxide layer 114, and insulating layer 110 that have approximately the same top surface shapes can be formed.

Note that during etching of the conductive film 112f, the metal oxide film 114f, and the insulating film 110f, the metal oxide layer 108C and part of the semiconductor layer 108 that is not covered with the insulating layer 110 may sometimes be etched and reduced in thickness.

<Formation of First Layer 116>

Figure 12A:
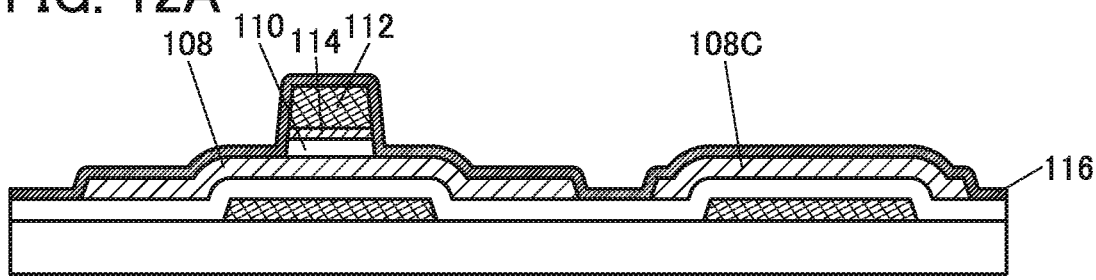

Next, the first layer 116 is formed (FIG. 12A).

Here, a film with insulating properties is formed as the first layer 116. Note that when the first layer 116 is insulated in a later step such as heat treatment, the first layer 116 at the time of formation may have conductivity.

As the first layer 116, a film containing at least one of metal elements such as aluminum, titanium, tantalum, tungsten, chromium, and ruthenium is formed. The first layer 116 preferably contains at least one of aluminum, titanium, tantalum, and tungsten. Moreover, it is preferable to use a nitride containing at least one of these metal elements or an oxide containing at least one of these metal elements. As the film with insulating properties, a nitride film such as an aluminum titanium nitride film, a titanium nitride film, or an aluminum nitride film or an oxide film such as an aluminum titanium oxide film is preferably used, for example.

Here, the first layer 116 is preferably formed by a sputtering method using a nitrogen gas or an oxygen gas as a deposition gas. In such a case, the film quality can be easily controlled by control of the flow rate of the deposition gas, even without change of a sputtering target.

<Heat Treatment>

Figure 12B:
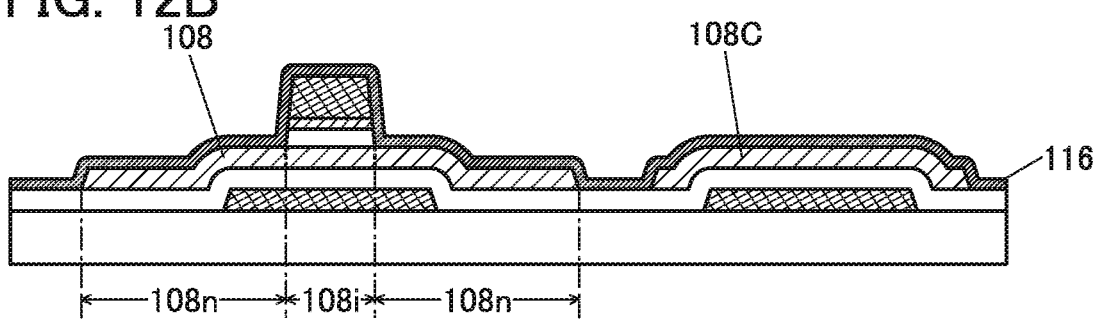

Then, heat treatment is performed (FIG. 12B). By the heat treatment, the resistance of regions of the semiconductor layer 108 that are in contact with the first layer 116 is lowered, and the low-resistance regions 108n are formed in the semiconductor layer 108. At the same time, the resistance of the metal oxide layer 108C can also be lowered.

The heat treatment is preferably performed in an inert gas atmosphere such as nitrogen or a rare gas. The temperature of the heat treatment is preferably as high as possible and can be set in consideration of the heat resistance of the substrate 102, the conductive layer 106, and the conductive layer 112, for example. The temperature can range from 120° C. to 500° C., preferably from 150° C. to 450° C., further preferably from 200° C. to 400° C., still further preferably from 250° C. to 400° C., for instance. When the temperature of the heat treatment is approximately 350° C., for example, the semiconductor device can be manufactured at a high yield with production facilities using a large glass substrate.

Since the first layer 116 is not removed in this manufacturing method, the heat treatment can be performed any time after the formation of the first layer 116. In addition, this heat treatment may also serve as another heat treatment.

By the heat treatment, oxygen in the semiconductor layer 108 and the metal oxide layer 108C is extracted into the first layer 116; thus, oxygen vacancy is generated. The oxygen vacancy and hydrogen in the semiconductor layer 108 or the metal oxide layer 108C are combined, thereby increasing the carrier concentration and lowering the resistance of portions of the semiconductor layer 108 and the metal oxide layer 108C that are in contact with the first layer 116.

Alternatively, a metal element contained in the first layer 116 is sometimes diffused into the semiconductor layer 108 and the metal oxide layer 108C by the heat treatment, whereby the semiconductor layer 108 and the metal oxide layer 108C are partly alloyed and reduced in resistance in some cases.

Alternatively, nitrogen and hydrogen contained in the first layer 116 or nitrogen or the like included in the atmosphere for the heat treatment are sometimes diffused into the semiconductor layer 108 and the metal oxide layer 108C by the heat treatment, whereby the resistance of the semiconductor layer 108 and the metal oxide layer 108C is lowered in some cases.

The regions 108n of the semiconductor layer 108 and the metal oxide layer 108C, whose resistance has been lowered because of the above complex factors, are highly stable low-resistance regions. The regions 108n and the metal oxide layer 108C formed in the above manner feature in that their resistance is not increased again even if treatment for supplying oxygen is performed in a later step, for example.

<Formation of Metal Oxide Layer 117>

Figure 12C:
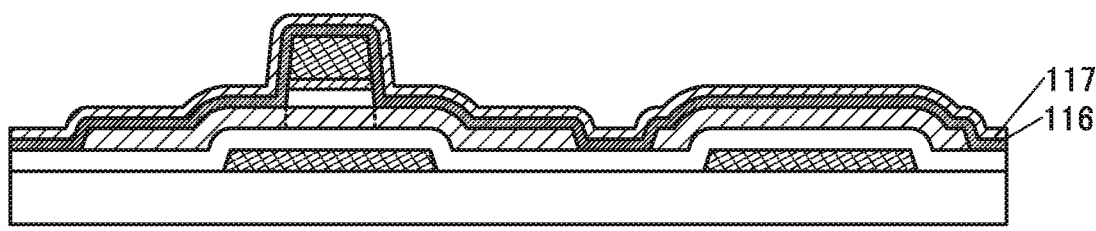

Next, the metal oxide layer 117 is formed over the first layer 116 (FIG. 12C). The metal oxide layer 117 can be formed by a method similar to that for the metal oxide film 114f.

At the time of forming the metal oxide layer 117, oxygen is sometimes added to the regions 108n of the semiconductor layer 108 and the metal oxide layer 108C through the first layer 116; as described above, the resistance of the regions 108n and the metal oxide layer 108C is not increased again and is kept low.

Furthermore, at the time of forming the metal oxide layer 117, oxygen can be supplied to the insulating layer 104 through the first layer 116 and the semiconductor layer 108. Moreover, oxygen can be supplied from the side surface of the insulating layer 110, which serves as a gate insulating layer, to the insulating layer 104 through the first layer 116.

Heat treatment may be carried out after the formation of the metal oxide layer 117. With heat treatment performed while the metal oxide layer 117 serving as a barrier layer covers the semiconductor layer 108, oxygen can be supplied in a favorable manner to the region 108i, which is the channel formation region in the semiconductor layer 108, from the insulating layer 110 and the insulating layer 104.

<Formation of Insulating Layer 118>

Figure 12D:
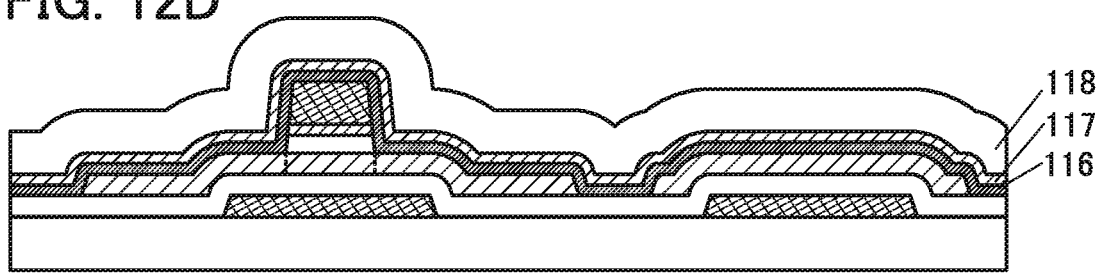

Then, the insulating layer 118 is formed to cover the metal oxide layer 117 (FIG. 12D).

The insulating layer 118 can be formed by a plasma CVD method, a sputtering method, or the like.

<Formation of Openings 141a, 141b, and 141c>

Subsequently, a mask is formed at an intended position on the insulating layer 118 by lithography, and then the insulating layer 118, the metal oxide layer 117, and the first layer 116 are partly removed by etching to form the openings 141a and 141b that reach the regions 108n and an opening 141c that reaches the metal oxide layer 108C.

<Formation of Conductive Layers 120a and 120b>

Figure 12E:
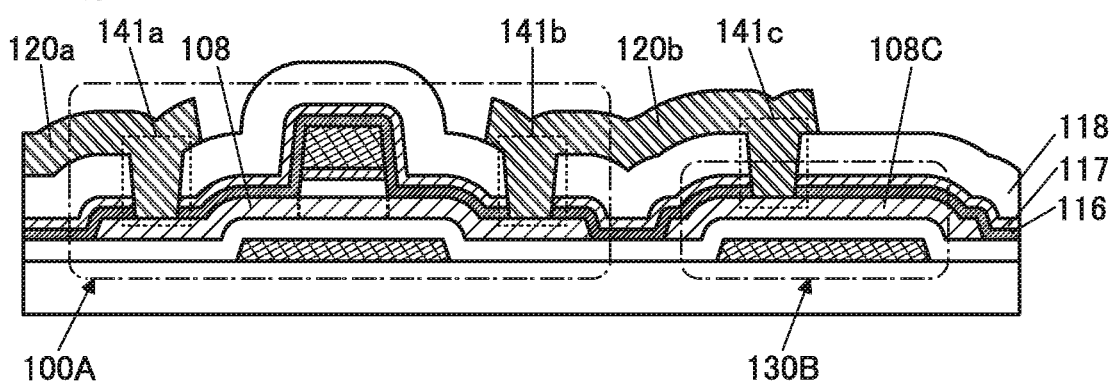

Next, a conductive film is formed over the insulating layer 118 so as to fill the openings 141a, 141b, and 141c, and the conductive film is processed into desired shapes, so that the conductive layer 120a and the conductive layer 120b are formed (FIG. 12E).

The transistor 100A and the capacitor 130B that are electrically connected to each other can be fabricated through the above-described steps. Subsequent steps including formation of a pixel electrode of a display element will be described below.

<Formation of Insulating Layer 119>

Figure 13A:
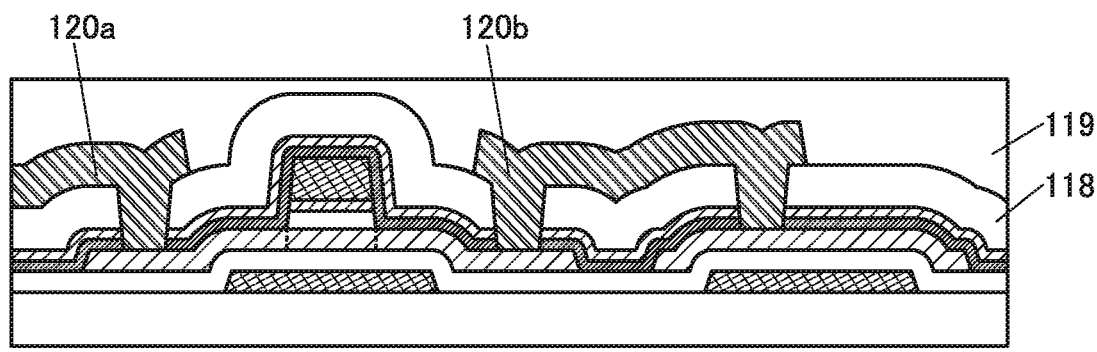

Then, the insulating layer 119 is formed to cover the conductive layer 120a, the conductive layer 120b, and the insulating layer 118 (FIG. 13A).

The insulating layer 119 is preferably formed using an organic resin, in which case its flatness is increased. The insulating layer 119 can be formed typically by spin coating, dispensing, screen printing, slit coating, or the like.

Note that the insulating layer 119 may be formed using an inorganic insulating material. In that case, the insulating layer 119 can be formed by a method similar to that for the insulating layer 118.

When the insulating layer 119 is formed using a photosensitive resin material, an opening that reaches the conductive layer 120b can be formed at the same time as the formation of the insulating layer 119. Note that when the insulating layer 119 is formed using a non-photosensitive material, the opening can be formed by etching.

<Formation of Conductive Layer 109>

Figure 13B:
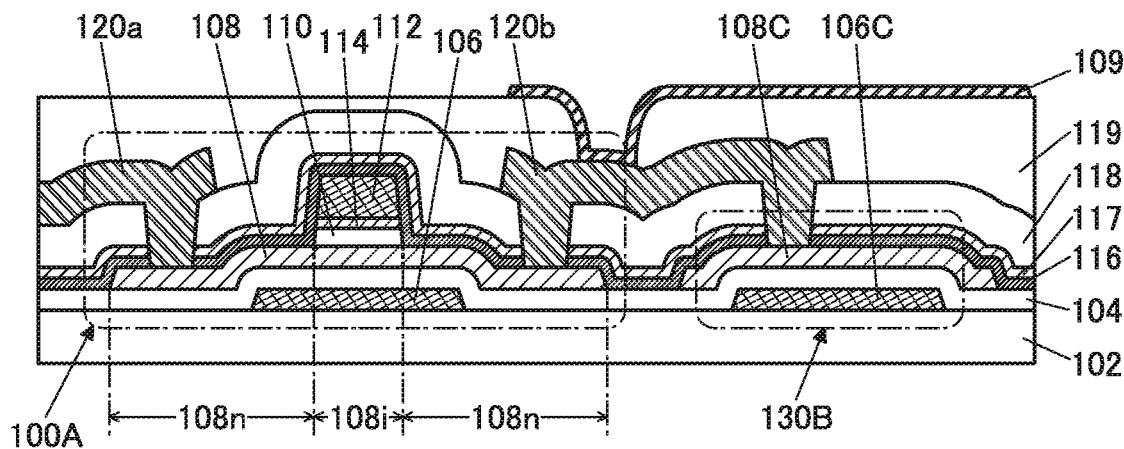

Next, the conductive layer 109 is formed (FIG. 13B). The conductive layer 109 can be formed by a method similar to that for the conductive film 112 or the like.

Through the above steps, the pixel electrode, the transistor 100A, and the capacitor 130B can be fabricated. Note that FIG. 13B is the same as FIG. 9B.

Note that the capacitor 130A illustrated in FIG. 9A can be fabricated in such a manner that the conductive layer 120b is processed to overlap the metal oxide layer 108C.

The capacitor 130C illustrated in FIG. 9C can be fabricated as follows: a photomask used to obtain the semiconductor layer 108 and the metal oxide layer 108C in the above manufacturing method is changed so that these layers can be formed as one island-shaped layer.

The above is the description of Manufacturing Method Example.

Variation Example of Manufacturing Method Example

An example of a method for manufacturing the transistor 100G and the capacitor 130B' illustrated in FIG. 10B will be described below. Note that the description of the portions common to Manufacturing Method Example is omitted, and differences from the above example are mainly described.

First, the conductive layer 106, the conductive layer 106C, the insulating layer 104, the semiconductor layer 108, the metal oxide layer 108C, the insulating layer 110, the metal oxide layer 114, and the conductive layer 112 are formed over the substrate 102 as in Manufacturing Method Example.

Then, the first layer 116a is formed.

Since the first layer 116a is removed in a later step, the first layer 116a can be a film with conductivity as well as a film with insulating properties, which is exemplified in Manufacturing Method Example, or a film to be insulated.

In addition to the above, a metal film or an alloy film containing at least one of metal elements such as aluminum, titanium, tantalum, tungsten, chromium, and ruthenium, for example, can be formed as the first layer 116a. The first layer 116a preferably contains at least one of aluminum, titanium, tantalum, and tungsten.

Figure 14A:
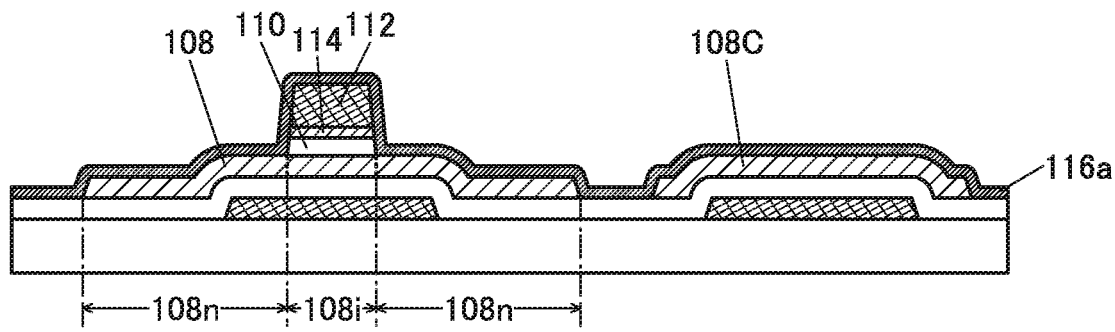

Next, heat treatment is performed, whereby the low-resistance regions 108n and the low-resistance metal oxide layer 108C are formed (FIG. 14A).

Figure 14B:
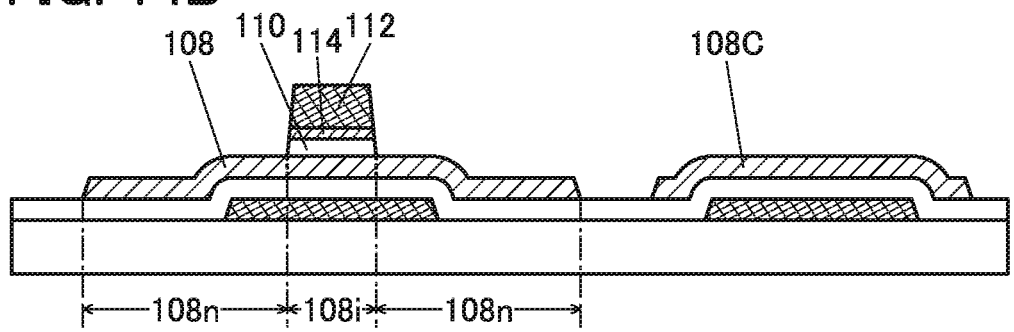

Subsequently, the first layer 116a is removed by etching (FIG. 14B).

In etching of the first layer 116a, part of the conductive layer 112, the metal oxide layer 114, the insulating layer 110, the semiconductor layer 108, the metal oxide layer 108C, or the like is also etched in some cases. Particularly when the first layer 116a is a metal film or an alloy film, it is preferable to form the first layer 116a using a material different from that for the conductive layer 112 and select an etching method with a high etching selectivity ratio of the first layer 116a with respect to the conductive layer 112.

Figure 14C:
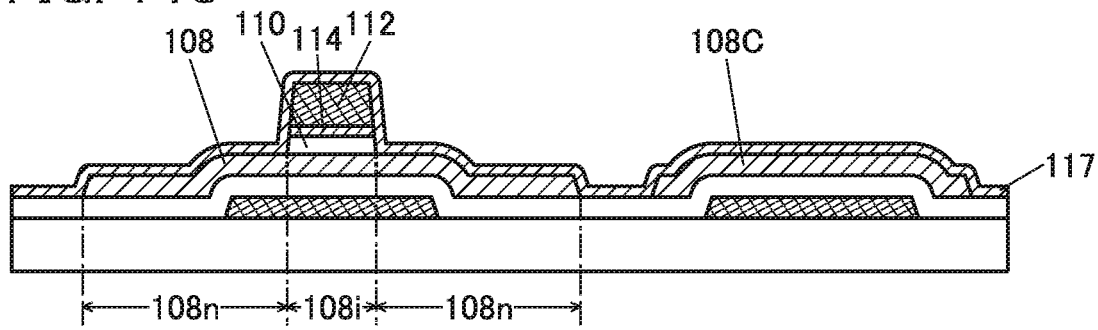

Then, the metal oxide layer 117 is formed by a method similar to the above (FIG. 14C). Here, the metal oxide layer 117 is provided in contact with the regions 108n and the metal oxide layer 108C, and thus the regions 108n and the metal oxide layer 108C are sometimes supplied with oxygen during the formation of the metal oxide layer 117; as described above, the resistance of the regions 108n and the metal oxide layer 108C is not increased again and is kept low.

Manufacturing Method Example can be referred to for the subsequent steps.

Figure 14D:
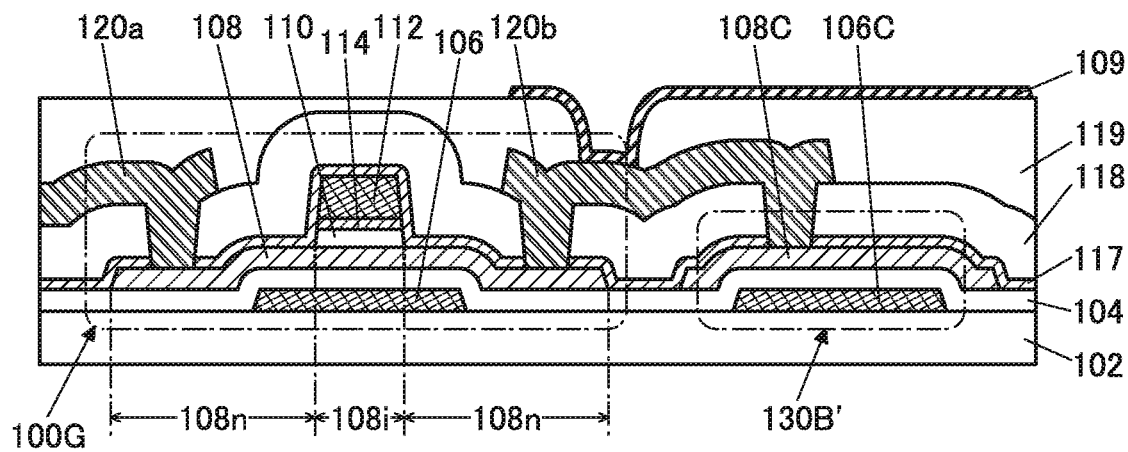

By the method described above, the transistor 100G, the capacitor 130B', and the conductive layer 109 can be formed as illustrated in FIG. 14D. Note that FIG. 14D is the same as FIG. 10B.

The above is the description of the variation example of Manufacturing Method Example.

At least part of any of the structure examples, the manufacturing method examples, the drawings corresponding thereto, and the like described in this embodiment can be implemented in combination with any of the other structure examples, the other manufacturing method examples, the other drawings corresponding thereto, and the like as appropriate.

At least part of this embodiment can be implemented in combination with any of the other embodiments described in this specification as appropriate.

Embodiment 2

In this embodiment, examples of a display device that includes any of the transistors described in Embodiment 1 will be described.

Structure Examples

Figure 15A:
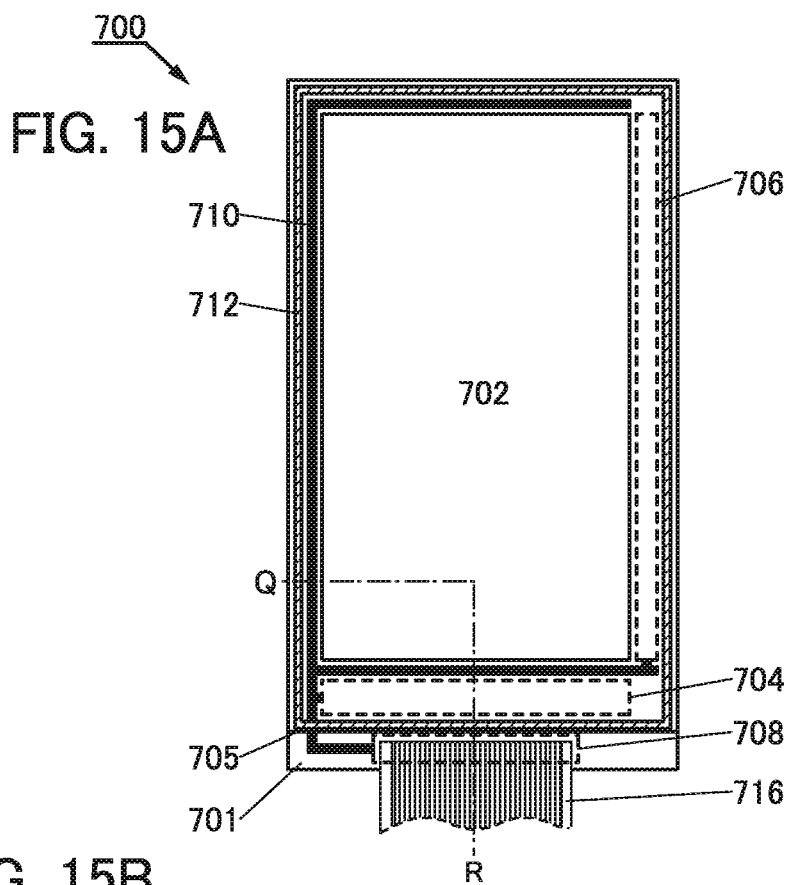
FIGS. 15A and 15B are top views of display devices.

FIG. 15A is a top view illustrating an example of a display device. A display device 700 in FIG. 15A includes a pixel portion 702 over a first substrate 701; a source driver circuit portion 704 and a gate driver circuit portion 706 over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are bonded to each other with the sealant 712. That is, the pixel portion 702, the source driver circuit portion 704, and the gate driver circuit portion 706 are sealed with the first substrate 701, the sealant 712, and the second substrate 705. Although not illustrated in FIG. 15A, a display element is provided between the first substrate 701 and the second substrate 705.

In the display device 700, a flexible printed circuit (FPC) terminal portion 708 is provided over the first substrate 701 in a region different from the region surrounded by the sealant 712. The FPC terminal portion 708 is electrically connected to the pixel portion 702, the source driver circuit portion 704, and the gate driver circuit portion 706. An FPC 716 is connected to the FPC terminal portion 708, and a variety of signals and the like are supplied from the FPC 716 to the pixel portion 702, the source driver circuit portion 704, and the gate driver circuit portion 706. A signal line 710 is connected to the pixel portion 702, the source driver circuit portion 704, the gate driver circuit portion 706, and the FPC terminal portion 708. A variety of signals and the like from the FPC 716 are supplied to the pixel portion 702, the source driver circuit portion 704, the gate driver circuit portion 706, and the FPC terminal portion 708 via the signal line 710.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701, or only the source driver circuit portion 704 may be formed over the first substrate 701. In such a case, an IC including a substrate where the source driver circuit, the gate driver circuit, or the like is formed (e.g., a driver circuit board formed using a single crystal semiconductor film or a polycrystalline semiconductor film) may be provided on the first substrate 701 or the FPC 716. There is no particular limitation on a method for connecting such a separately formed driver circuit substrate; for example, a chip on glass (COG) method or a wire bonding method can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. Examples of the elements include an electroluminescent (EL) element (e.g., an EL element containing organic and inorganic materials, an organic EL element, an inorganic EL element, and an LED), a light-emitting transistor element (a transistor that emits light depending on current), an electron emitter, a liquid crystal element, an electronic ink display, an electrophoretic element, an electrowetting element, a plasma display panel (PDP), a microelectromechanical systems (MEMS) display (e.g., a grating light valve (GLV), a digital micromirror device (DMD), a digital micro shutter (DMS) element, and an interferometric modulator display (IMOD) element), and a piezoelectric ceramic display.

An example of a display device including an EL element is an EL display. Examples of display devices including electron emitters are a field emission display (FED) and an SED-type flat panel display (SED: surface-conduction electron-emitter display). Examples of display devices including liquid crystal elements include liquid crystal displays (e.g., a transmissive liquid crystal display, a transflective liquid crystal display, a reflective liquid crystal display, a direct-view liquid crystal display, and a projection liquid crystal display). An example of a display device including an electronic ink display or an electrophoretic element is electronic paper. In a transflective liquid crystal display or a reflective liquid crystal display, some or all of pixel electrodes function as reflective electrodes. For example, some or all of the pixel electrodes are formed to contain aluminum, silver, or the like. In such a case, a memory circuit such as an SRAM can be provided under the reflective electrodes, which can further reduce power consumption.

As a display method in the display device 700, a progressive method, an interlace method, or the like can be employed. Furthermore, color elements controlled in pixels for color display are not limited to three colors of R (red), G (green), and B (blue). For example, four pixels of the R pixel, the G pixel, the B pixel, and a W (white) pixel may be employed. Alternatively, a color element may be composed of two colors among R, G, and B as in PenTile layout; the two colors may differ among color elements. Alternatively, one or more colors of yellow, cyan, magenta, and the like may be added to RGB. Furthermore, the size of a display region may be different depending on respective dots of the color elements. Note that one embodiment of the disclosed invention is not limited to a display device for color display; the disclosed invention can also be applied to a display device for monochrome display.

A coloring layer (also referred to as color filter) may be used to obtain a color display device in which white light (W) is used for a backlight or a front light (e.g., an organic EL element, an inorganic EL element, an LED, or a fluorescent lamp). For example, a red (R) coloring layer, a green (G) coloring layer, a blue (B) coloring layer, and a yellow (Y) coloring layer can be used in combination as appropriate. With the use of the coloring layer, higher color reproducibility can be obtained than without the coloring layer. Here, by providing a region with a coloring layer and a region without a coloring layer, white light in the region without the coloring layer may be directly utilized for display. By partly providing the region without the coloring layer, a decrease in luminance of a bright image due to the coloring layer can be suppressed, and power consumption can sometimes be reduced by approximately 20% to 30%. In the case where full-color display is performed using a self-luminous element such as an organic EL element or an inorganic EL element, elements may emit light of their respective colors R, G, B, Y, and W. By using a self-luminous element, power consumption can sometimes be further reduced compared to the case of using the coloring layer.

As a coloring method, any of the following methods may be used: the above-described color filter method in which part of white light is converted into red light, green light, and blue light through color filters; a three-color method in which red light, green light, and blue light are used; and a color conversion method or a quantum dot method in which part of blue light is converted into red light or green light.

Figure 15B:
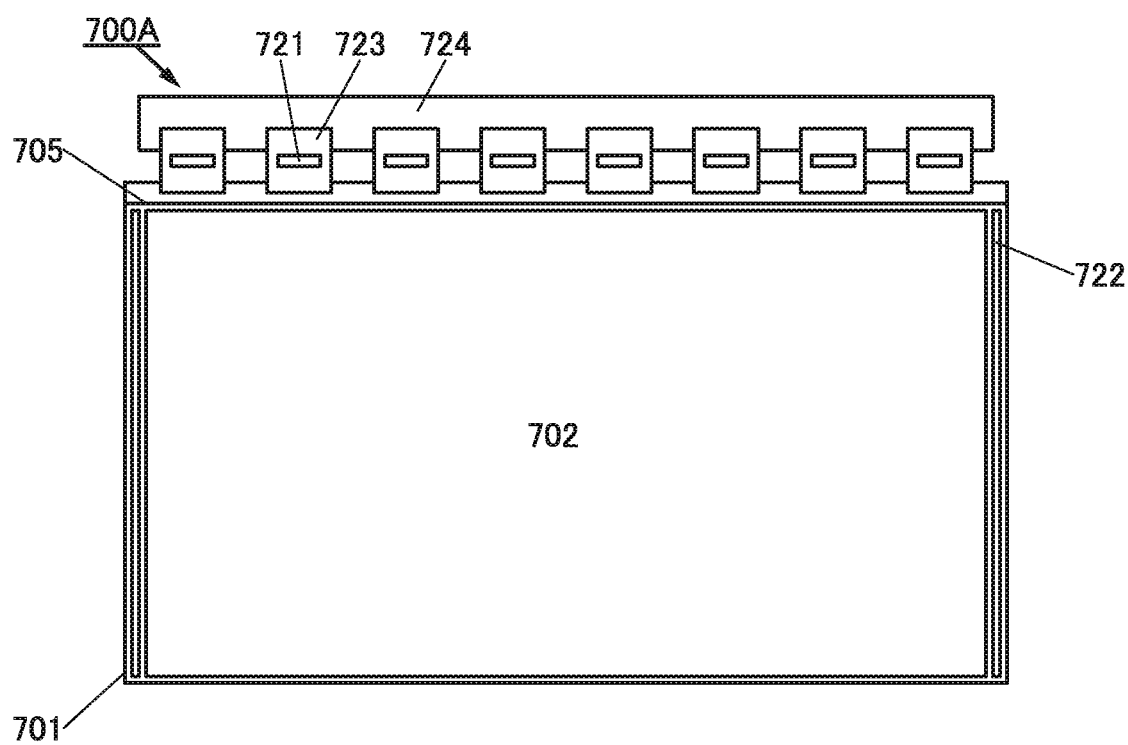

A display device 700A illustrated in FIG. 15B is a display device that can be favorably used for an electronic device with a large screen. The display device 700A is suitable for a television device, a monitor, or digital signage, for example.

The display device 700A includes a plurality of source driver ICs 721 and a pair of gate driver circuits 722.

The plurality of source driver ICs 721 are attached to respective FPCs 723. In each of the FPCs 723, one of terminals is connected to the first substrate 701, and the other terminal is connected to a printed circuit board 724. By bending the FPCs 723, the printed circuit board 724 can be placed on the back of the pixel portion 702 to be mounted on an electrical device; thus, a space-saving electronic device can be achieved.

On the other hand, the gate driver circuits 722 are provided over the first substrate 701. Thus, an electronic device with a narrow bezel can be fabricated.

With such a structure, a large-size and high-resolution display device can be provided. For example, such a structure can be adopted to a display device whose screen size (diagonal) is 30 inches or more, 40 inches or more, 50 inches or more, or 60 inches or more. Furthermore, a display device with extremely high resolution such as full high definition, 4K2K, or 8K4K can be provided.

Cross-Sectional Structure Examples

Figure 16:
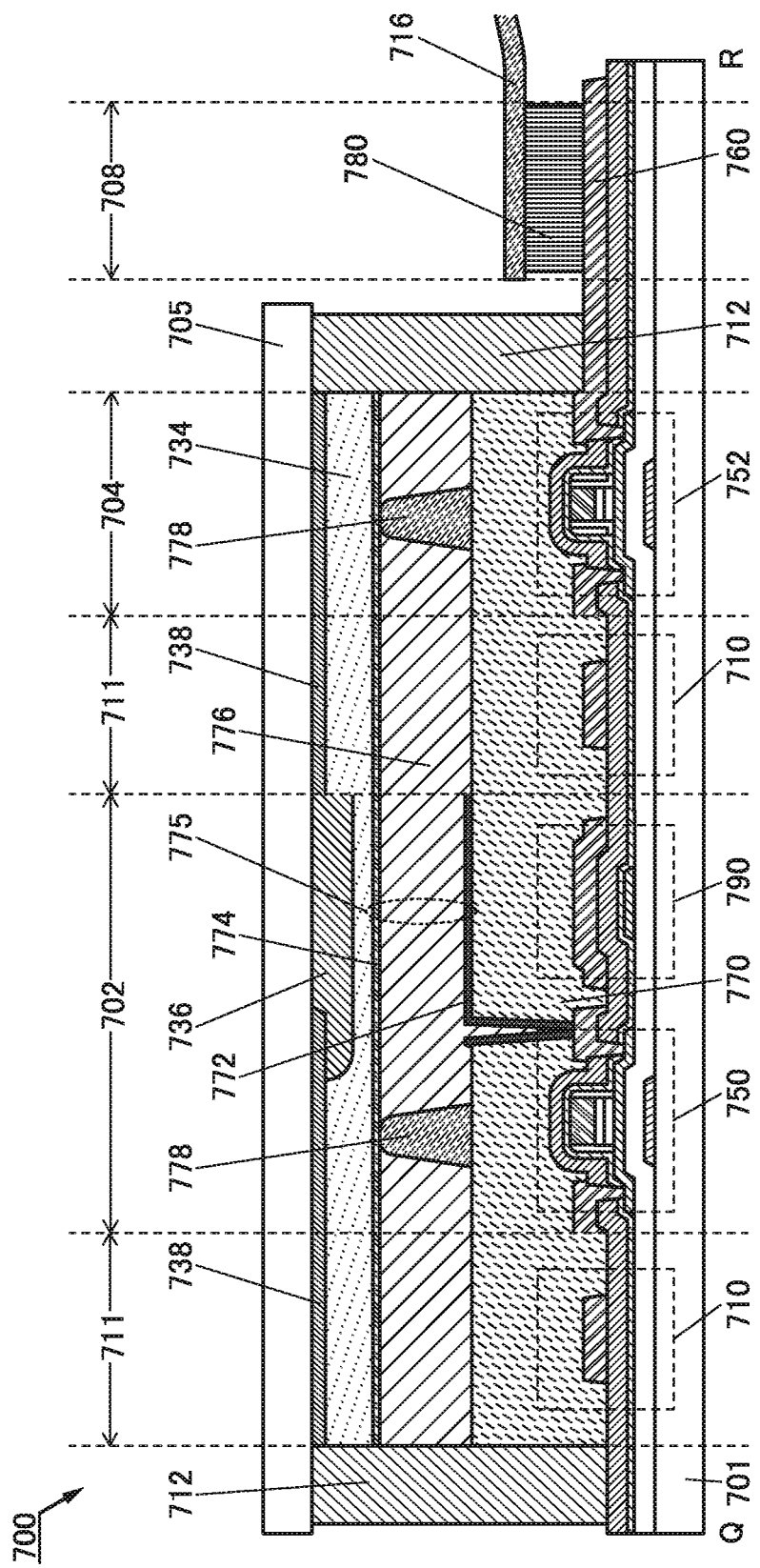
FIG. 16 is a cross-sectional view of a display device.
Figure 17:
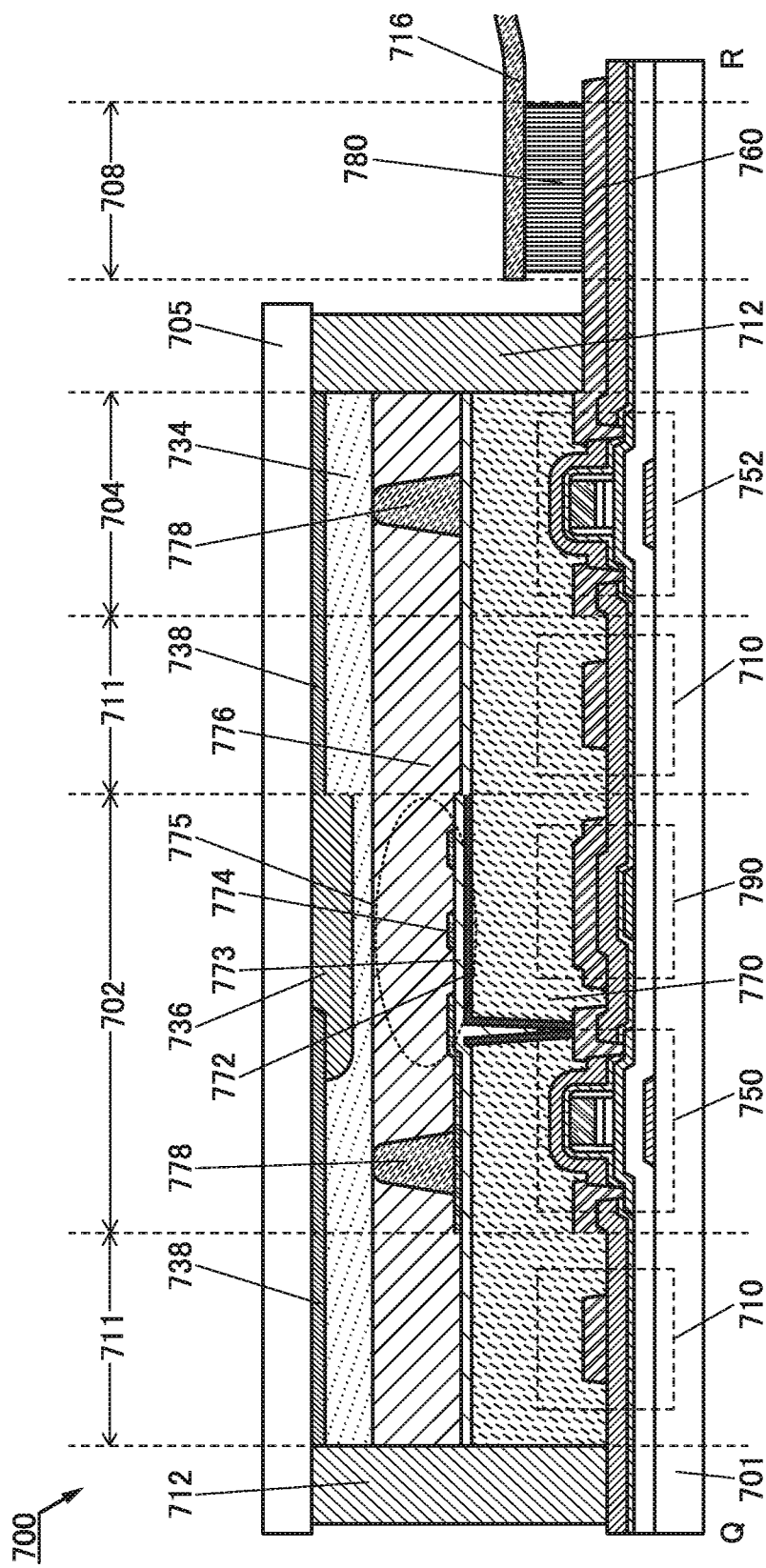
FIG. 17 is a cross-sectional view of a display device.
Figure 18:
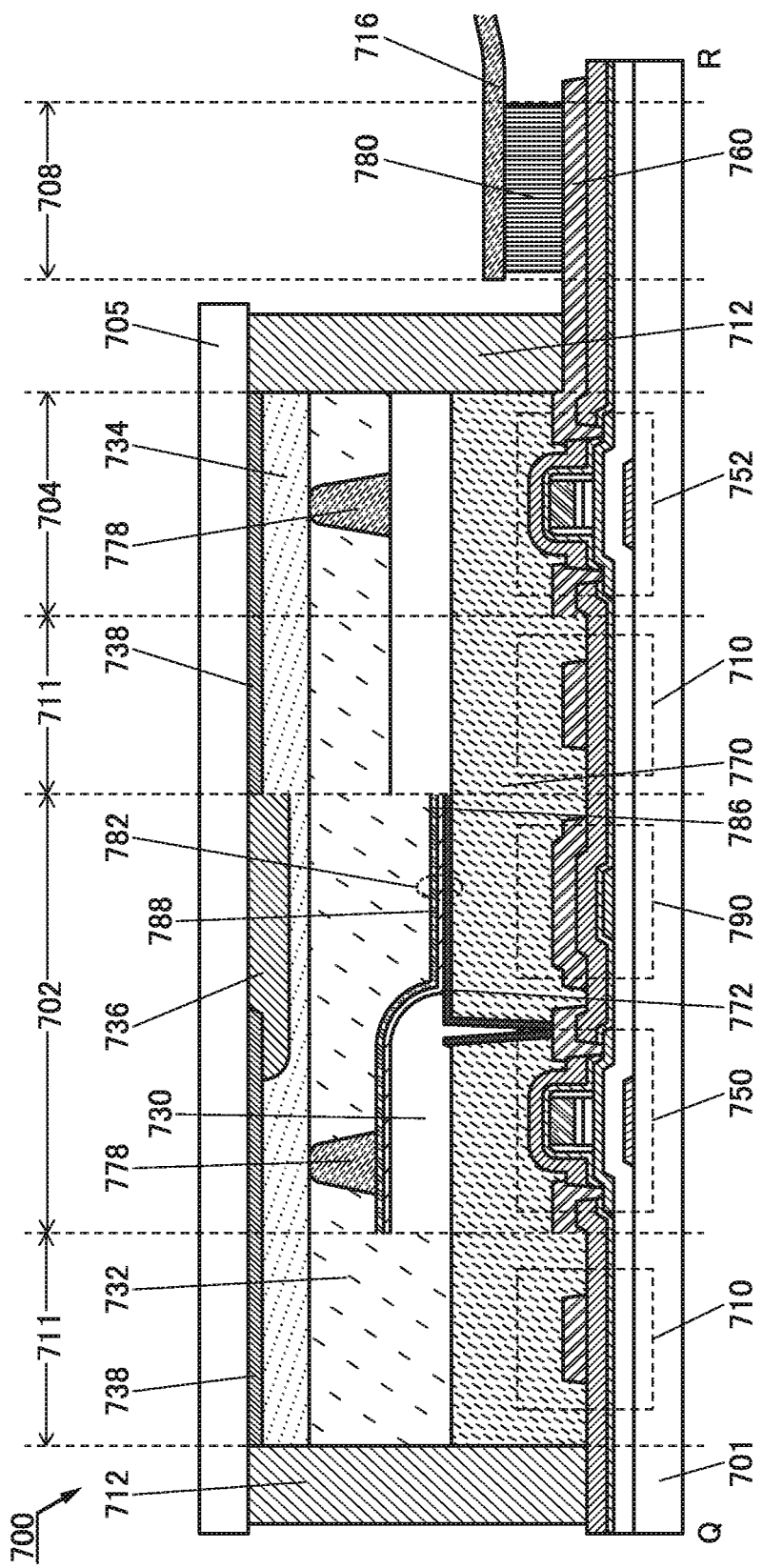
FIG. 18 is a cross-sectional view of a display device.

Structures including a liquid crystal element or an EL element as a display element will be described below with reference to FIG. 16, FIG. 17, and FIG. 18. FIG. 16 and FIG. 17 are each a cross-sectional view along the dashed-dotted line Q-R in FIG. 15A and illustrate a structure including a liquid crystal element as a display element. FIG. 18 is a cross-sectional view along the dashed-dotted line Q-R in FIG. 15A and illustrates a structure including an EL element as a display element.

Hereinafter, common components among FIGS. 16, 17, and 18 will be described first, and then, components that are different between FIGS. 16, 17, and 18 will be described.
<Common Components in Display Devices>

The display devices 700 in FIGS. 16 to 18 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

As the transistors 750 and 752, any of the transistors described in Embodiment 1 can be used.

The transistor used in this embodiment includes a highly purified oxide semiconductor film in which formation of oxygen vacancy is suppressed. The transistor can have a low off-state current. Accordingly, an electrical signal such as a video signal can be held for a longer period, and intervals between write operations of video signals or the like can be set longer. Thus, the frequency of refresh operations can be decreased, resulting in lower power consumption.

In addition, the transistor used in this embodiment can have relatively high field-effect mobility and thus is capable of high-speed operation. For example, with such a high-speed transistor used for a display device, a switching transistor in a pixel portion and a driver transistor in a driver circuit portion can be formed over one substrate. That is, a semiconductor device formed using a silicon wafer or the like is not additionally needed as a driver circuit, by which the number of components of the display device can be reduced. Moreover, the use of the high-speed transistor in the pixel portion can provide a high-quality image.

The capacitor 790 includes a lower electrode and an upper electrode. The lower electrode is formed through the same step as source and drain regions provided in a semiconductor layer of the transistor 750. The upper electrode is formed through a step of processing a conductive film to be a conductive film functioning as source and drain electrodes of the transistor 750. Part of an insulating film functioning as a protective insulating film over the transistor 750 is positioned between the lower electrode and the upper electrode. That is, the capacitor 790 has a stacked-layer structure in which the insulating films functioning as dielectric films are positioned between a pair of electrodes.

In FIGS. 16 to 18, a planarization insulating film 770 is provided over the transistor 750, the transistor 752, and the capacitor 790.

Note that the term "source driver circuit portion 704" can be replaced by the term "gate driver circuit portion".

The signal line 710 is formed through the same process as the conductive films functioning as source and drain electrodes of the transistors 750 and 752. When the signal line 710 is formed using a material containing a copper element, for example, signal delay or the like due to wiring resistance is reduced, which enables display on a large screen.

The FPC terminal portion 708 includes a connection electrode 760, an anisotropic conductive film 780, and the FPC 716. The connection electrode 760 is formed through the same process as the conductive films functioning as the source and drain electrodes of the transistors 750 and 752. The connection electrode 760 is electrically connected to a terminal of the FPC 716 through the anisotropic conductive film 780.

For example, a glass substrate can be used as the first substrate 701 and the second substrate 705. Alternatively, a flexible substrate may be used as the first substrate 701 and the second substrate 705. An example of the flexible substrate includes a plastic substrate.

A structure body 778 is provided between the first substrate 701 and the second substrate 705. The structure body 778 is a columnar spacer and is provided to control the distance (cell gap) between the first substrate 701 and the second substrate 705. Note that a spherical spacer may be used as the structure body 778.

A light-blocking film 738 functioning as a black matrix, a coloring film 736 functioning as a color filter, and an insulating film 734 in contact with the light-blocking film 738 and the coloring film 736 are provided on the second substrate 705.

<Structure Examples of Display Device Using Liquid Crystal Element>

The display device 700 illustrated in FIG. 16 includes a liquid crystal element 775. The liquid crystal element 775 includes a conductive film 772, a conductive film 774, and a liquid crystal layer 776. The conductive film 774 is provided on the second substrate 705 and functions as a counter electrode. The display device 700 in FIG. 16 is capable of displaying an image in such a manner that transmission or non-transmission of light is controlled by change in the alignment state of the liquid crystal layer 776 depending on a voltage applied to the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that transmits visible light or a conductive film that reflects visible light can be used as the conductive film 772. The conductive film that transmits visible light is preferably formed using a material containing one of indium (In), zinc (Zn), and tin (Sn), for example. The conductive film that reflects visible light is preferably formed using a material containing aluminum or silver, for example.

When a conductive film that reflects visible light is used as the conductive film 772, the display device 700 is a reflective liquid crystal display device. When a conductive film that transmits visible light is used as the conductive film 772, the display device 700 is a transmissive liquid crystal display device. For a reflective liquid crystal display device, a polarizing plate is provided on the viewer side. On the other hand, for a transmissive liquid crystal display device, a pair of polarizing plates are provided so that the liquid crystal element is placed therebetween.

A method for driving a liquid crystal element can vary with the change in the structure over the conductive film 772. FIG. 17 shows an example in that case. The display device 700 illustrated in FIG. 17 is an example of employing a horizontal electric field mode (e.g., an FFS mode) as a driving mode of the liquid crystal element. In the structure illustrated in FIG. 17, an insulating film 773 is provided over the conductive film 772, and the conductive film 774 is provided over the insulating film 773. In this structure, the conductive film 774 functions as a common electrode, and an electric field generated between the conductive film 772 and the conductive film 774 through the insulating film 773 can control the alignment state in the liquid crystal layer 776.

Although not illustrated in FIG. 16 and FIG. 17, the conductive film 772 and/or the conductive film 774 may be provided with an alignment film on a side in contact with the liquid crystal layer 776. Although not illustrated in FIG. 16 and FIG. 17, an optical member (optical substrate) such as a polarizing member, a retardation member, or an anti-reflection member, for example, may be provided as appropriate. For example, circular polarization may be employed by using a polarizing substrate and a retardation substrate. In addition, a backlight, a side light, or the like may be used as a light source.

When the liquid crystal element is used as the display element, a thermotropic liquid crystal, a low-molecular liquid crystal, a high-molecular liquid crystal, a polymer dispersed liquid crystal, a polymer network liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case of employing a horizontal electric field mode, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal layer in order to widen the temperature range. The liquid crystal composition that contains a liquid crystal exhibiting the blue phase and a chiral material has a short response time and optical isotropy, which makes the alignment process unneeded. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material that exhibits the blue phase has small viewing angle dependence.

When the liquid crystal element is used as the display element, it is possible to employ a twisted nematic (TN) mode, an in-plane switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, an electrically controlled birefringence (ECB) mode, a guest-host mode, or the like.

The display device may also be a normally black liquid crystal display device such as a transmissive liquid crystal display device utilizing a vertical alignment (VA) mode. Examples of a vertical alignment mode to be employed are a multi-domain vertical alignment (MVA) mode, a patterned vertical alignment (PVA) mode, and an advanced super view (ASV) mode.

<Display Device Using Light-Emitting Element>

The display device 700 illustrated in FIG. 18 includes a light-emitting element 782. The light-emitting element 782 includes the conductive film 772, an EL layer 786, and a conductive film 788. The display device 700 illustrated in FIG. 18 can display an image by utilizing light emission from the EL layer 786 of the light-emitting element 782 provided in each pixel. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16 may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 18, an insulating film 730 is provided over the planarization insulating film 770 and the conductive film 772. The insulating film 730 covers part of the conductive film 772. Note that the light-emitting element 782 has a top-emission structure; hence, the conductive film 788 has light-transmitting properties and transmits light emitted from the EL layer 786. Although the top-emission structure is described as an example in this embodiment, one embodiment of the present invention is not limited thereto. For example, a bottom-emission structure in which light is emitted to the conductive film 772 side, or a dual-emission structure in which light is emitted to both the conductive film 772 side and the conductive film 788 side may also be employed.

The coloring film 736 is provided to overlap the light-emitting element 782. The light-blocking film 738 is provided in the lead wiring portion 711 and the source driver circuit portion 704 to overlap the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 18, in which the coloring film 736 is provided. For example, a structure without the coloring film 736 may also be employed when the EL layer 786 is formed into an island shape for each pixel (i.e., formed by separate coloring).

<Structure Examples of Display Device Provided with Input/output Device>

An input/output device may be provided in the display device 700 illustrated in each of FIGS. 16 to 18. An example of the input/output device is a touch panel.

Figure 19:
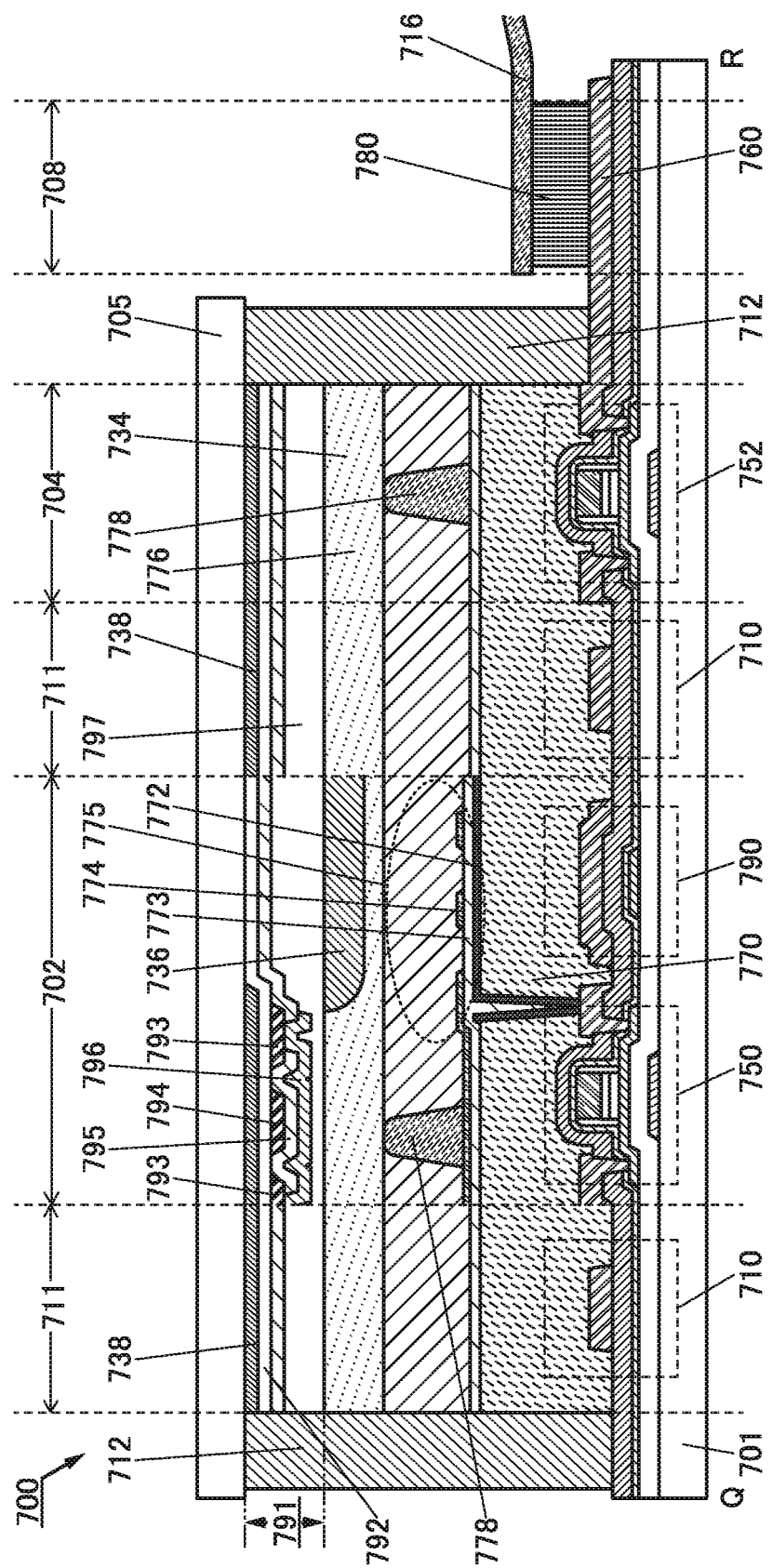
FIG. 19 is a cross-sectional view of a display device.
Figure 20:
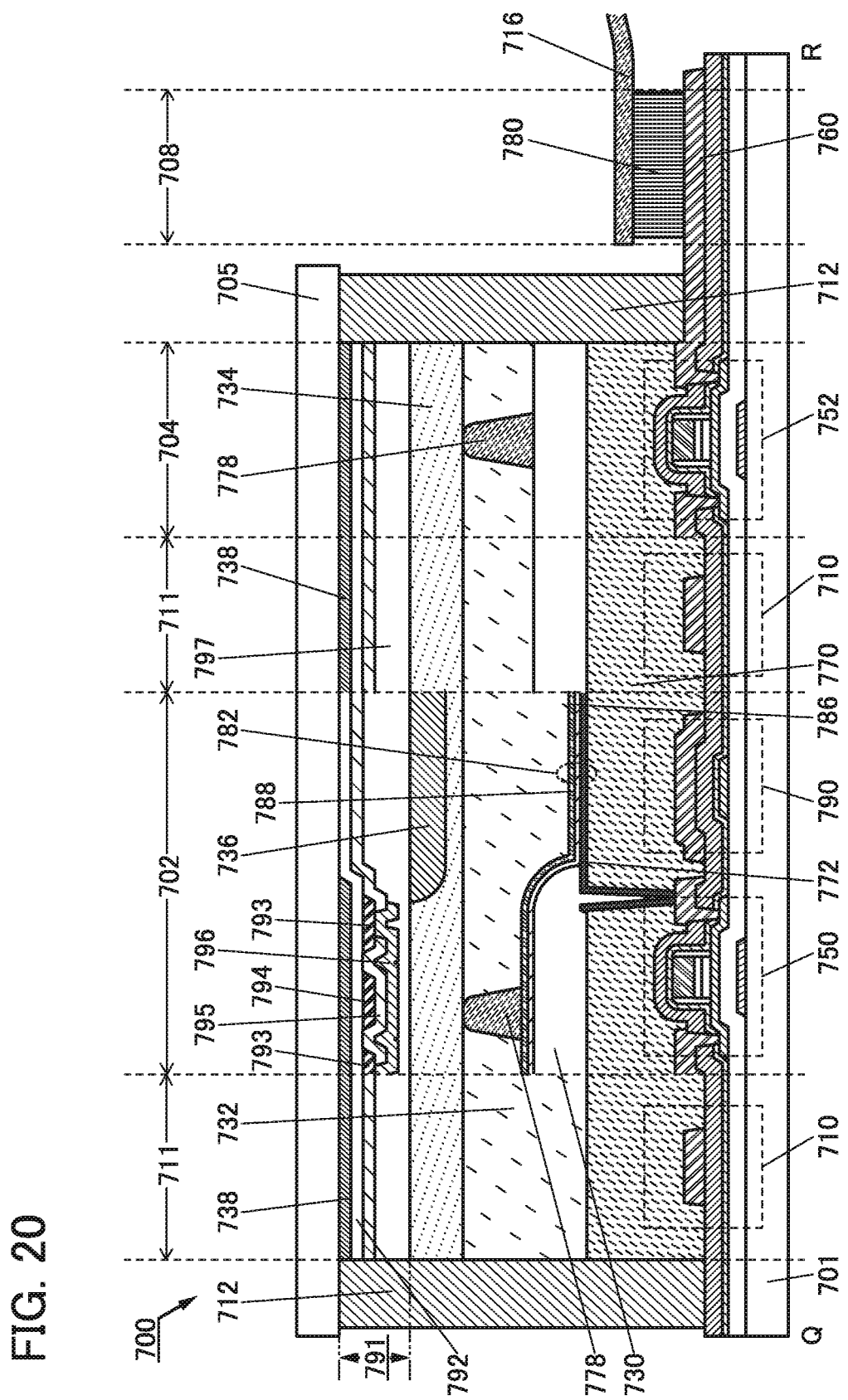
FIG. 20 is a cross-sectional view of a display device.

FIG. 19 illustrates a structure in which the display device 700 shown in FIG. 17 includes a touch panel 791. FIG. 20 illustrates a structure in which the display device 700 shown in FIG. 18 includes the touch panel 791.

FIG. 19 is a cross-sectional view of the structure in which the touch panel 791 is provided in the display device 700 shown in FIG. 17. FIG. 20 is a cross-sectional view of the structure in which the touch panel 791 is provided in the display device 700 shown in FIG. 18.

First, the touch panel 791 illustrated in FIGS. 19 and 20 will be described below.

The touch panel 791 illustrated in FIGS. 19 and 20 is an in-cell touch panel provided between the substrate 705 and the coloring film 736. The touch panel 791 is formed on the substrate 705 before the coloring film 736 is formed.

The touch panel 791 includes an insulating film 792, an electrode 793, an electrode 794, an insulating film 795, an electrode 796, and an insulating film 797. The touch panel 791 can sense a change in the capacitance between the electrodes 793 and 794 that can be caused by approach of an object such as a finger or a stylus, for example.

FIGS. 19 and 20 illustrate an intersection of the electrodes 793 and 794 above the transistor 750. Through openings formed in the insulating film 795, the electrode 796 is electrically connected to two electrodes 793 between which the electrode 794 is positioned. Note that FIGS. 19 and 20 illustrate examples of a structure in which a region where the electrode 796 is formed is provided in the pixel portion 702; however, one embodiment of the present invention is not limited thereto. For example, the region where the electrode 796 is formed may be provided in the source driver circuit portion 704.

The electrodes 793 and 794 are provided in a region overlapping the light-blocking film 738. As illustrated in FIGS. 19 and 20, the electrode 793 is preferably provided not to overlap the liquid crystal element 775 or the light-emitting element 782. In other words, the electrode 793 has an opening in a region overlapping the light-emitting element 782 or the liquid crystal element 775. That is, the electrode 793 has a mesh shape. With such a structure, the electrode 793 does not block light emitted from the light-emitting element 782 or light transmitted through the liquid crystal element 775. Thus, since luminance is hardly reduced even when the touch panel 791 is placed, a display device with high visibility and low power consumption can be achieved. Note that the electrode 794 can have a similar structure.

Since the electrodes 793 and 794 do not overlap the light-emitting element 782 or the liquid crystal element 775, the electrodes 793 and 794 can be formed using a metal material with low visible light transmittance.

Accordingly, the resistance of the electrodes 793 and 794 can be reduced compared with an electrode using an oxide material with high visible light transmittance, so that the sensitivity of the touch panel can be increased.

For example, a conductive nanowire may be used for the electrodes 793, 794, and 796. The nanowire has a mean diameter of 1 nm to 100 nm, preferably 5 nm to 50 nm, further preferably 5 nm to 25 nm. As the nanowire, a carbon nanotube or a metal nanowire such as an Ag nanowire, a Cu nanowire, or an Al nanowire can be used. For example, in the case of using an Ag nanowire for one or all of the electrodes 793, 794, and 796, it is possible to achieve a visible light transmittance of 89% or more and a sheet resistance of 40 Ω/square or more and 100 Ω/square or less.

Although the structure of the in-cell touch panel is illustrated in FIGS. 19 and 20, one embodiment of the present invention is not limited thereto. For example, a touch panel formed over the display device 700 (i.e., an on-cell touch panel) or a touch panel attached to the display device 700 (i.e., an out-cell touch panel) may be used.

In this manner, the display device of one embodiment of the present invention can be combined with various types of touch panel.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification as appropriate.

Embodiment 3

In this embodiment, a display device that includes a semiconductor device of one embodiment of the present invention is described with reference to FIGS. 21A to 21C.

The display device illustrated in FIG. 21A includes a region including pixels (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit that outputs a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as gate lines GL_1 to GL X). Note that a plurality of gate drivers 504a may be provided to control the gate lines GL_1 to GL X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the gate line GL_m, and a data signal is input from the source driver 504b through the data line DL_n in accordance with the potential of the gate line GL_m.

Figure 21A:
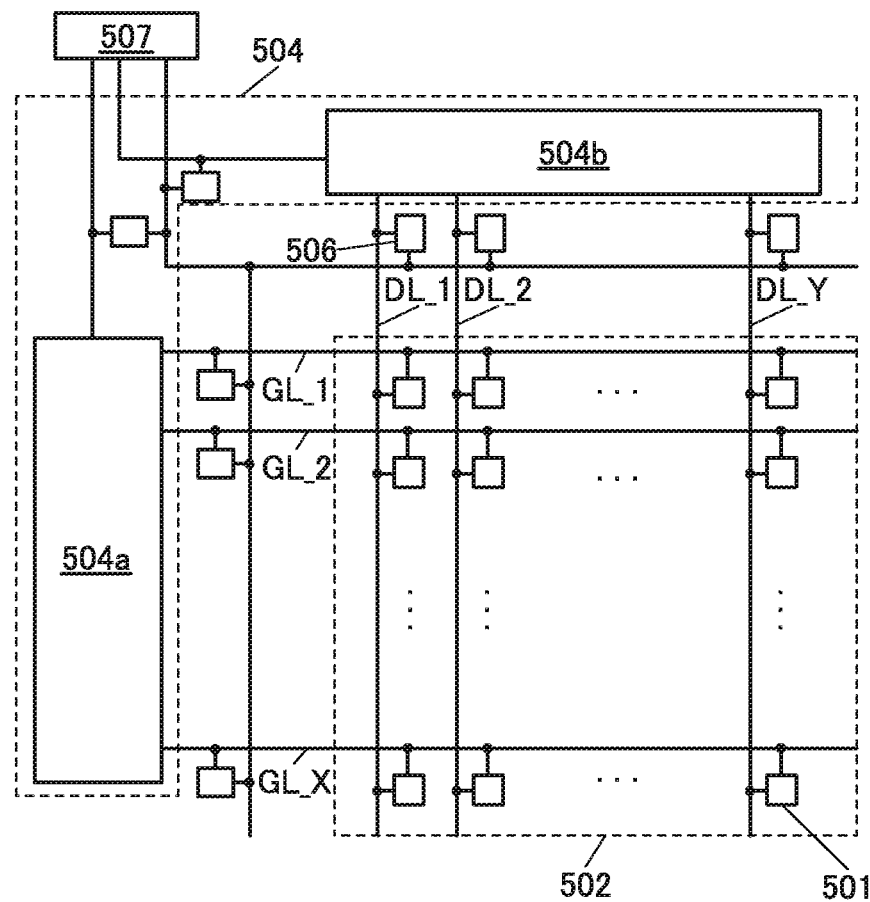
FIGS. 21A to 21C are a block diagram and circuit diagrams of a display device.

The protection circuit 506 shown in FIG. 21A is connected to, for example, the gate line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 21A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

In FIG. 21A, an example in which the driver circuit portion 504 includes the gate driver 504a and the source driver 504b is shown; however, the configuration is not limited thereto. For example, only the gate driver 504a may be formed, and a separately prepared substrate over which a source driver circuit is formed (e.g., a driver circuit board formed using a single crystal semiconductor film or a polycrystalline semiconductor film) may be mounted.

Figure 22:
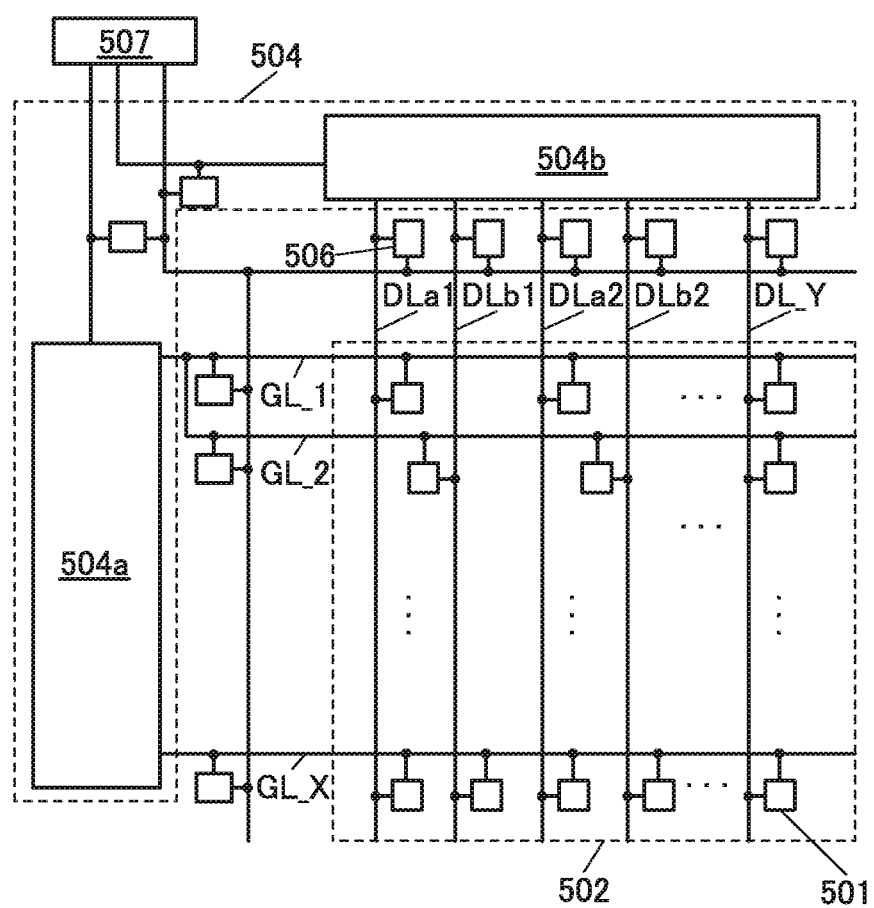
FIG. 22 is a block diagram of a display device.

FIG. 22 illustrates a configuration different from that in FIG. 21A. In FIG. 22, a pair of source lines (for example, a source line DLa1 and a source line DLb1) is provided so that a plurality of pixels arranged in the source line direction are sandwiched therebetween. In addition, two adjacent gate lines (for example, the gate line GL_1 and the gate line GL_2) are electrically connected to each other.

Pixels connected to the gate line GL_1 are connected to one source line (such as the source line DLa1 or a source line DLa2). Pixels connected to the gate line GL_2 are connected to the other source line (such as the source line DLb1 or a source line DLb2).

In such a configuration, two gate lines can be selected concurrently, which enables one horizontal period to have a length twice that in the configuration in FIG. 21A. This facilitates an increase in resolution and an increase in screen size of a display device.

Figure 21B:
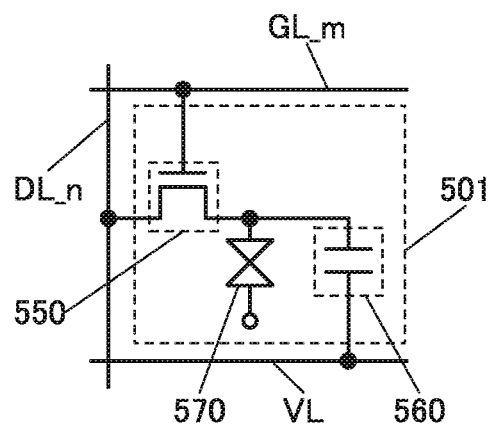

Each of the plurality of pixel circuits 501 in FIG. 21A and FIG. 22 can have the configuration illustrated in FIG. 21B, for example.

The pixel circuit 501 illustrated in FIG. 21B includes a liquid crystal element 570, a transistor 550, and a capacitor 560. As the transistor 550, any of the transistors described in the above embodiments can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

Examples of a method for driving the display device including the liquid crystal element 570 include a TN mode, a super twisted nematic (STN) mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the gate line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 21B, the pixel circuits 501 are sequentially selected row by row by the gate driver 504a illustrated in FIG. 21A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 21C:
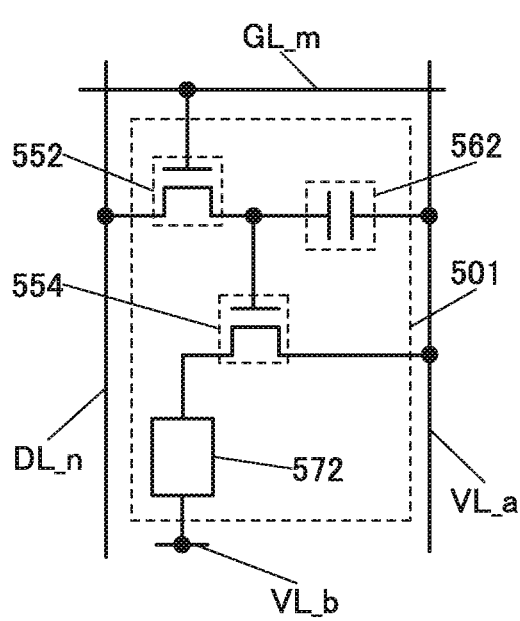

Alternatively, each of the plurality of pixel circuits 501 in FIG. 21A can have a configuration illustrated in FIG. 21C, for example.

The pixel circuit 501 illustrated in FIG. 21C includes transistors 552 and 554, a capacitor 562, and a light-emitting element 572. Any of the transistors described in the above embodiments can be used as one or both of the transistors 552 and 554.

One of a source electrode and a drain electrode of the transistor 552 is electrically connected to the data line DL_n, and a gate electrode of the transistor 552 is electrically connected to the gate line GL_m.

The transistor 552 has a function of controlling whether to write a data signal by being turned on or off.

One of a pair of electrodes of the capacitor 562 is electrically connected to a potential supply line VL_a, and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

Note that a high power supply potential VDD is supplied to one of the potential supply line VL_a and the potential supply line VL_b, and a low power supply potential VSS is supplied to the other.

For example, in the display device including the pixel circuit 501 in FIG. 21C, the pixel circuits 501 are sequentially selected row by row by the gate driver 504a illustrated in FIG. 21A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image can be displayed.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification as appropriate.

Embodiment 4

An electronic device in which the display device of one embodiment of the present invention can be used is described below. Here, an electronic device including a power generating device and a power receiving device is described as an example.

As an example of the electrical device, a portable information terminal is described with reference to FIGS. 23A to 23C.

Figure 23A:
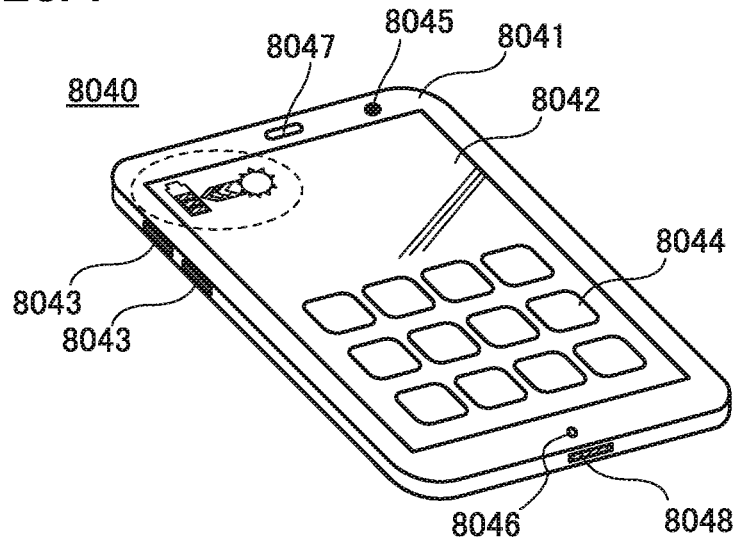
FIGS. 23A to 23C illustrate an electrical device.

FIG. 23A is a perspective view illustrating a front surface and a side surface of a portable information terminal 8040. The portable information terminal 8040 is capable of executing a variety of applications such as mobile phone calls, e-mailing, viewing and editing texts, music reproduction, Internet communication, and a computer game. In the portable information terminal 8040, a housing 8041 includes a display portion 8042, a camera 8045, a microphone 8046, and a speaker 8047 on its front surface, a button 8043 for operation on its left side, and a connection terminal 8048 on its bottom surface.

A display module or a display panel of one embodiment of the present invention is used for the display portion 8042.

The portable information terminal 8040 illustrated in FIG. 23A is an example of providing one display portion 8042 in the housing 8041; however, one embodiment of the present invention is not limited to this example. The display portion 8042 may be provided on a rear surface of the portable information terminal 8040. Furthermore, the portable information terminal 8040 may be a foldable portable information terminal in which two or more display portions are provided.

A touch panel with which data can be input by an instruction means such as a finger or a stylus is provided as an input means on the display portion 8042. Thus, icons

8044 displayed on the display portion 8042 can be easily operated by the instruction means. Since the touch panel is provided, a region for a keyboard on the portable information terminal 8040 is not needed and thus the display portion can be provided in a large region. Furthermore, since data can be input with a finger or a stylus, a user-friendly interface can be obtained. Although the touch panel may be of any of various types such as a resistive type, a capacitive type, an infrared ray type, an electromagnetic induction type, and a surface acoustic wave type, the resistive type or the capacitive type is particularly preferable because the display portion 8042 can be curved. Furthermore, such a touch panel may be what is called an in-cell touch panel, in which a touch panel is integral with the display module or the display panel.

The touch panel may also function as an image sensor. In this case, for example, an image of a palm print, a fingerprint, or the like is taken with the display portion 8042 touched with the palm or the finger, whereby personal authentication can be performed. Furthermore, with the use of backlight or a sensing light source emitting near-infrared light for the display portion 8042, an image of a finger vein, a palm vein, or the like can also be taken.

Instead of the touch panel, a keyboard may be provided in the display portion 8042. Alternatively, both the touch panel and the keyboard may be provided.

The button 8043 for operation can have various functions in accordance with the intended use. For example, the button 8043 may be used as a home button so that a home screen is displayed on the display portion 8042 by pressing the button 8043. Furthermore, the portable information terminal 8040 may be configured such that main power source thereof is turned off with a press of the button 8043 for a predetermined time. A structure may also be employed in which a press of the button 8043 brings the portable information terminal 8040 which is in a sleep mode out of the sleep mode. Besides, the button can be used as a switch for starting a variety of functions depending on the length of time for pressing or by pressing the button at the same time as another button, for example.

Furthermore, the button 8043 may be used as a volume control button or a mute button to have a function of adjusting the volume of the speaker 8047 for outputting sound, for example. The speaker 8047 outputs various kinds of sound, examples of which are sound set for predetermined processing, such as startup sound of an operating system (OS), sound from sound files executed in various applications, such as music from music reproduction application software, and an incoming e-mail alert. Although not illustrated, a connector for outputting sound to a device such as headphones, earphones, or a headset may be provided together with or instead of the speaker 8047 for outputting sound.

As described above, the button 8043 can have various functions. Although two buttons 8043 are provided on the left side of the portable information terminal 8040 in FIG. 23A, it is needless to say that the number, arrangement, position, and the like of the buttons 8043 are not limited to this example and can be designed as appropriate.

The microphone 8046 can be used for sound input and recording. Images obtained with the use of the camera 8045 can be displayed on the display portion 8042.

In addition to the operation with the touch panel provided on the display portion 8042 or the button 8043, the portable information terminal 8040 can be operated by recognition of user's movement (gesture) (also referred to as gesture input) using the camera 8045, a sensor provided in the portable information terminal 8040, or the like. Alternatively, with the use of the microphone 8046, the portable information terminal 8040 can be operated by recognition of user's voice (also referred to as voice input). By introducing a natural user interface (NUI) technique which enables data to be input to an electrical device by natural behavior of a human, the operational performance of the portable information terminal 8040 can be further improved.

The connection terminal 8048 is a terminal for inputting a signal at the time of communication with an external device or inputting electric power at the time of power supply. For example, the connection terminal 8048 can be used for connecting an external memory drive to the portable information terminal 8040. Examples of the external memory drive are storage medium drives such as an external hard disk drive (HDD), a flash memory drive, a digital versatile disk (DVD) drive, a DVD-recordable (DVD-R) drive, a DVD-rewritable (DVD-RW) drive, a compact disc (CD) drive, a compact disc recordable (CD-R) drive, a compact disc rewritable (CD-RW) drive, a magneto-optical (MO) disc drive, a floppy disk drive (FDD), and other nonvolatile solid state drive (SSD) devices. Although the portable information terminal 8040 has the touch panel on the display portion 8042, a keyboard may be provided on the housing 8041 instead of the touch panel or may be externally added.

Although one connection terminal 8048 is provided in the portable information terminal 8040 in FIG. 23A, it is needless to say that the number, arrangement, position, and the like of the connection terminals 8048 are not limited to this example and can be designed as appropriate.

Figure 23B:
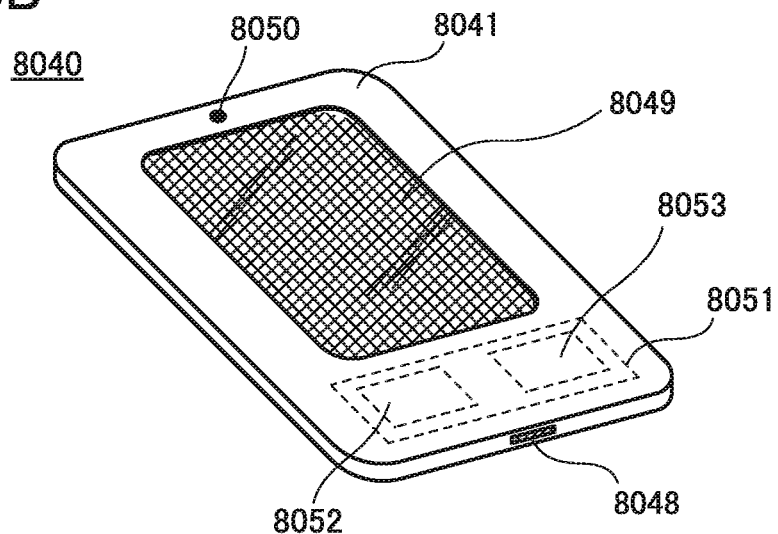

FIG. 23B is a perspective view illustrating the rear surface and the side surface of the portable information terminal 8040. In the portable information terminal 8040, the housing 8041 includes a solar cell 8049 and a camera 8050 on its rear surface; the portable information terminal 8040 further includes a charge and discharge control circuit 8051, a battery 8052, a DC-DC converter 8053, and the like.

The solar cell 8049 attached on the rear surface of the portable information terminal 8040 can supply electric power to the display portion, the touch panel, a video signal processor, and the like. Note that the solar cell 8049 can be provided on one or both surfaces of the housing 8041. By including the solar cell 8049 in the portable information terminal 8040, the battery 8052 in the portable information terminal 8040 can be charged even in a place where an electric power supply unit is not provided, such as outdoors.

As the solar cell 8049, it is possible to use any of the following: a silicon-based solar cell including a single layer or a stacked layer of single crystal silicon, polycrystalline silicon, microcrystalline silicon, or amorphous silicon; an InGaAs-based, GaAs-based, CIS-based, $Cu_2ZnSnS_4$-based, or CdTe—CdS-based solar cell; a dye-sensitized solar cell including an organic dye; an organic thin film solar cell including a conductive polymer, fullerene, or the like; a quantum dot solar cell having a pin structure in which a quantum dot structure is formed in an i-layer with silicon or the like; and the like.

Here, an example of a structure and operation of the charge and discharge control circuit 8051 illustrated in FIG. 23B is described with reference to a block diagram in FIG. 23C.

Figure 23C:
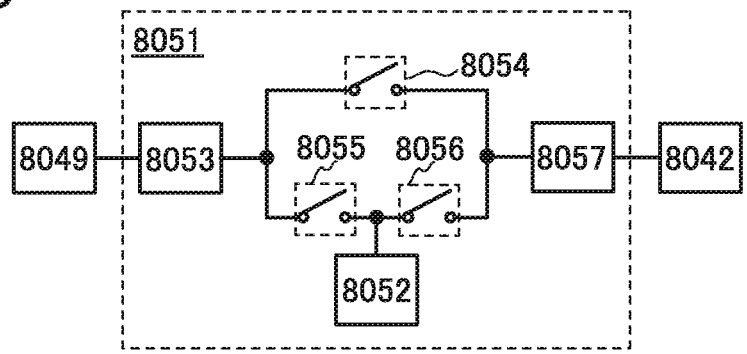

FIG. 23C illustrates the solar cell 8049, the battery 8052, the DC-DC converter 8053, a converter 8057, a switch 8054, a switch 8055, a switch 8056, and the display portion 8042. The battery 8052, the DC-DC converter 8053, the converter 8057, and the switches 8054 to 8056 correspond to the charge and discharge control circuit 8051 in FIG. 23B.

The voltage of electric power generated by the solar cell 8049 with the use of external light is raised or lowered by the DC-DC converter 8053 to be at a level needed for charging the battery 8052. When electric power from the solar cell 8049 is used for the operation of the display portion 8042, the switch 8054 is turned on and the voltage of the electric power is raised or lowered by the converter 8057 to a voltage needed for operating the display portion 8042. In addition, when display on the display portion 8042 is not performed, the switch 8054 is turned off and the switch 8055 is turned on so that the battery 8052 is charged.

Although the solar cell 8049 is described as an example of a power generation means, the power generation means is not limited thereto, and the battery 8052 may be charged by another power generation means such as a piezoelectric element or a thermoelectric conversion element (Peltier element). The charging method of the battery 8052 in the portable information terminal 8040 is not limited thereto, and the connection terminal 8048 may be connected to a power source to perform charge, for example. The battery 8052 may be charged by a contactless power transmission module performing charge by transmitting and receiving electric power wirelessly, or any of the above charging methods may be used in combination.

Here, the state of charge (SOC) of the battery 8052 is displayed on the upper left corner (in the dashed frame) of the display portion 8042. Thus, the user can check the state of charge of the battery 8052 and can accordingly select a power saving mode of the portable information terminal 8040. When the user selects the power saving mode, for example, the button 8043 or the icons 8044 can be operated to switch the components of the portable information terminal 8040, e.g., the display module or the display panel, an arithmetic unit such as CPU, and a memory, to the power saving mode. Specifically, in each of the components, the use frequency of a given function is decreased to stop the use. Further, the portable information terminal 8040 can be configured to be automatically switched to the power saving mode depending on the state of charge. Furthermore, by providing a sensor such as an optical sensor in the portable information terminal 8040, the amount of external light at the time of using the portable information terminal 8040 is sensed to optimize display luminance, which makes it possible to reduce the power consumption of the battery 8052.

In addition, when charging with the use of the solar cell 8049 or the like is performed, an image or the like showing that the charging is performed with the solar cell may be displayed on the upper left corner (in the dashed frame) of the display portion 8042 as illustrated in FIG. 23A.

At least part of this embodiment can be implemented in combination with any of the other embodiments described in this specification as appropriate.

Embodiment 5

In this embodiment, a display module that can be fabricated using one embodiment of the present invention is described.

Figure 24A:
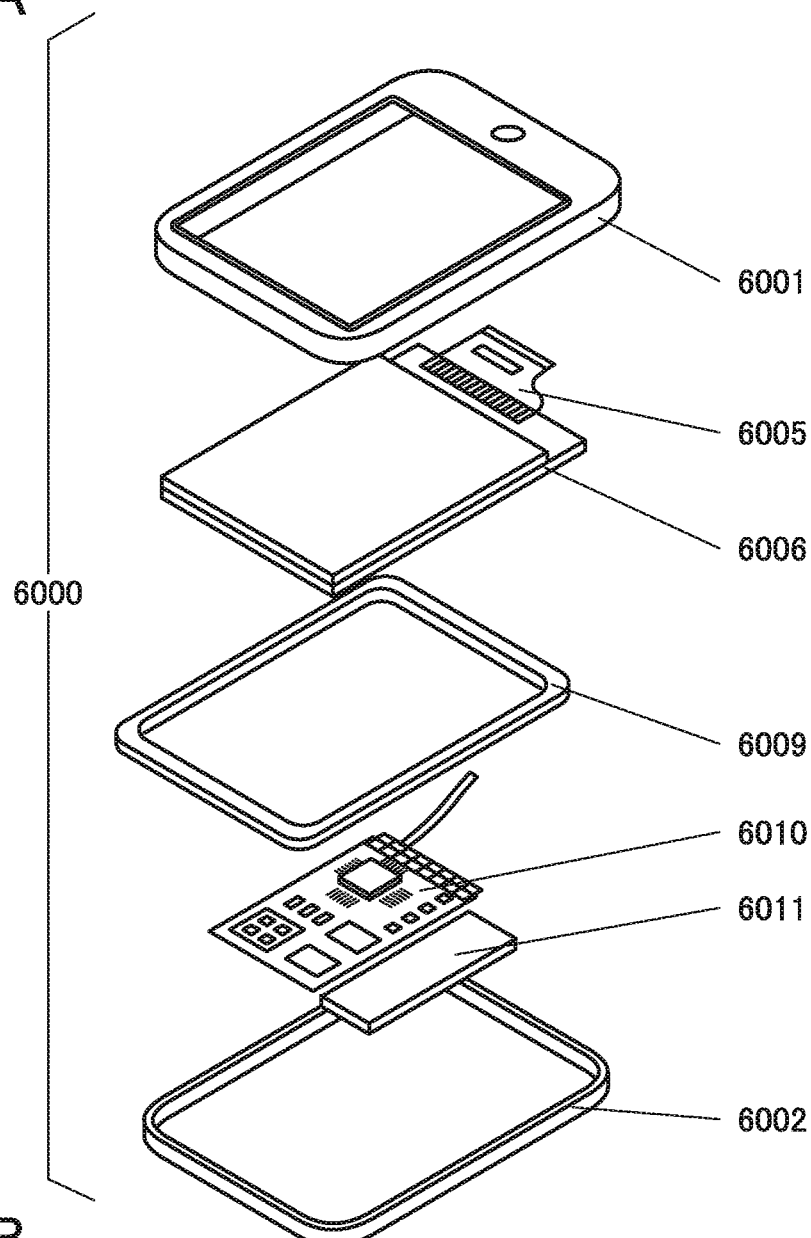
FIGS. 24A and 24B illustrate a structure example of a display module.

In a display module 6000 in FIG. 24A, a display device 6006 connected to an FPC 6005, a frame 6009, a printed circuit board 6010, and a battery 6011 are provided between an upper cover 6001 and a lower cover 6002.

For example, the display device fabricated using one embodiment of the present invention can be used as the display device 6006. With the display device 6006, a display module with extremely low power consumption can be fabricated.

The shapes and sizes of the upper cover 6001 and the lower cover 6002 can be changed as appropriate in accordance with the size of the display device 6006.

A touch panel may be provided so as to overlap with the display device 6006. The touch panel can be a resistive touch panel or a capacitive touch panel and may be formed to overlap with the display device 6006. Instead of providing the touch panel, the display device 6006 can have a touch panel function.

The frame 6009 protects the display device 6006 and also serves as an electromagnetic shield for blocking electromagnetic waves generated by the operation of the printed circuit board 6010. The frame 6009 may function as a radiator plate.

The printed circuit board 6010 has a power supply circuit and a signal processing circuit for outputting a video signal and a clock signal. As a power source for supplying power to the power supply circuit, an external commercial power source or the battery 6011 provided separately may be used. The battery 6011 can be omitted in the case of using a commercial power source.

Figure 24B:
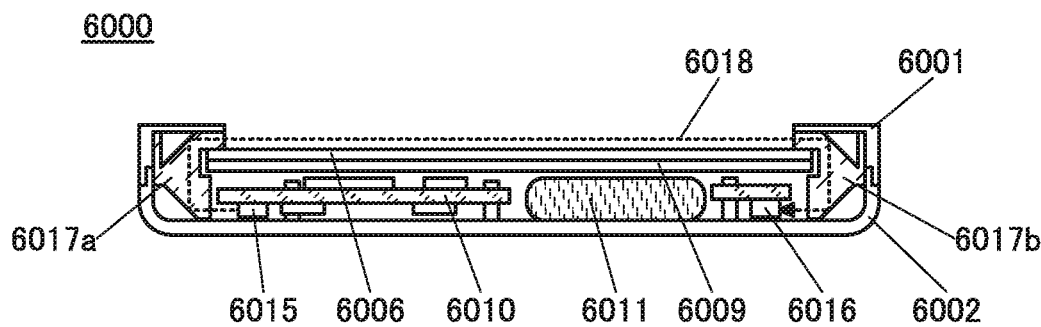

FIG. 24B is a schematic cross-sectional view of the display module 6000 with an optical touch sensor.

The display module 6000 includes a light-emitting portion 6015 and a light-receiving portion 6016 which are provided on the printed circuit board 6010. A pair of light guide portions (a light guide portion 6017a and a light guide portion 6017b) is provided in a region surrounded by the upper cover 6001 and the lower cover 6002.

For example, a plastic or the like can be used for the upper cover 6001 and the lower cover 6002. The upper cover 6001 and the lower cover 6002 can each be thin (e.g., more than or equal to 0.5 mm and less than or equal to 5 mm). Therefore, the display module 6000 can be significantly lightweight. In addition, the upper cover 6001 and the lower cover 6002 can be manufactured with a small amount of material, and therefore, manufacturing cost can be reduced.

The display device 6006 overlaps with the printed circuit board 6010 and the battery 6011 with the frame 6009 located therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus can be detected as touch operation.

A plurality of light-emitting portions 6015 are provided along two adjacent sides of the display device 6006, for example. A plurality of light-receiving portions 6016 are provided so as to face the light-emitting portions 6015. Accordingly, information about the position of touch operation can be obtained.

As the light-emitting portion 6015, a light source such as an LED element can be used. It is particularly preferable to use a light source that emits infrared light, which is not visually recognized by users and is harmless to users, as the light-emitting portion 6015.

As the light-receiving portion 6016, a photoelectric element that receives light emitted by the light-emitting portion 6015 and converts it into an electrical signal can be used. A photodiode that can receive infrared light can be favorably used.

For the light guide portions 6017a and 6017b, members that transmit at least the light 6018 can be used. With the use of the light guide portions 6017a and 6017b, the light-emitting portion 6015 and the light-receiving portion 6016 can be placed under the display device 6006, and a malfunction of the touch sensor due to external light reaching the light-receiving portion 6016 can be prevented. It is particularly preferable to use a resin which absorbs visible light and transmits infrared light. This is more effective in suppressing the malfunction of the touch sensor.

At least part of this embodiment can be implemented in combination with any of the other embodiments described in this specification as appropriate.

Embodiment 6

In this embodiment, electronic devices each including a display device fabricated using one embodiment of the present invention are described.

Figure 25A:
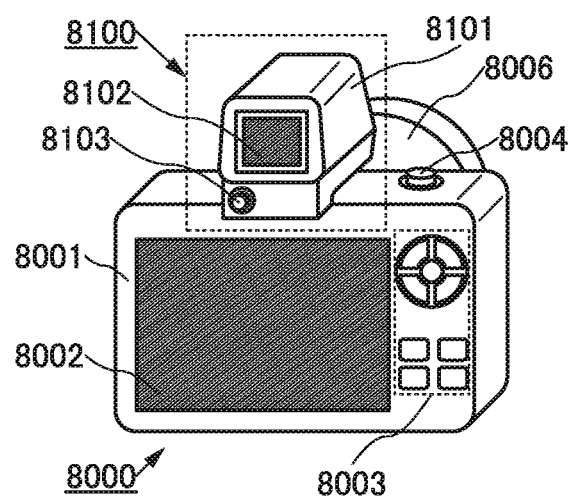
FIGS. 25A to 25E illustrate structure examples of electronic devices.

FIG. 25A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 which serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 functions as a power supply button. With the button 8103, the display portion 8102 can be turned on and off.

A display device of one embodiment of the present invention can be used in the display portion 8002 of the camera 8000 and the display portion 8102 of the finder 8100.

Although the camera 8000 and the finder 8100 are separate and detachable electronic devices in FIG. 25A, the housing 8001 of the camera 8000 may include a finder having a display device.

Figure 25B:
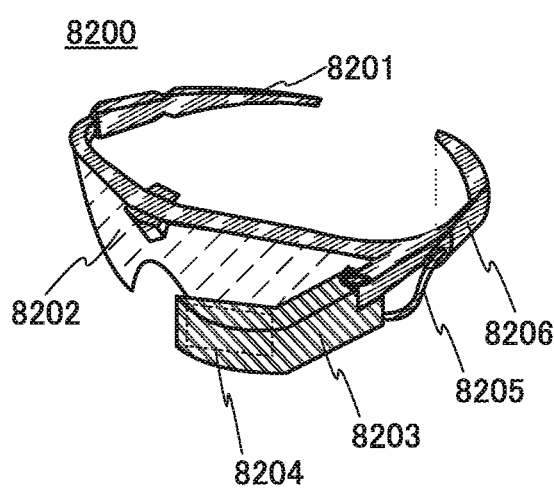

FIG. 25B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of a user's sight line are calculated using the captured data to utilize the user's sight line as an input means.

The mounting portion 8201 may include a plurality of electrodes so as to be in contact with the user. The main body 8203 may be configured to sense current flowing through the electrodes with the movement of the user's eyeball to recognize the user's sight line. The main body 8203 may be configured to sense current flowing through the electrodes to monitor the user's pulse. The mounting portion 8201 may include sensors, such as a temperature sensor, a pressure sensor, and an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 25C:
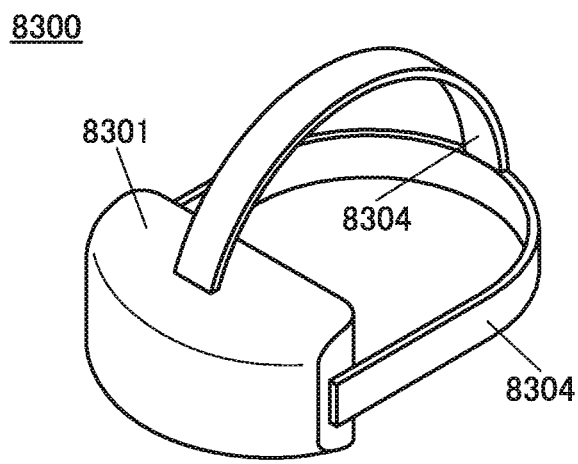
Figure 25D:
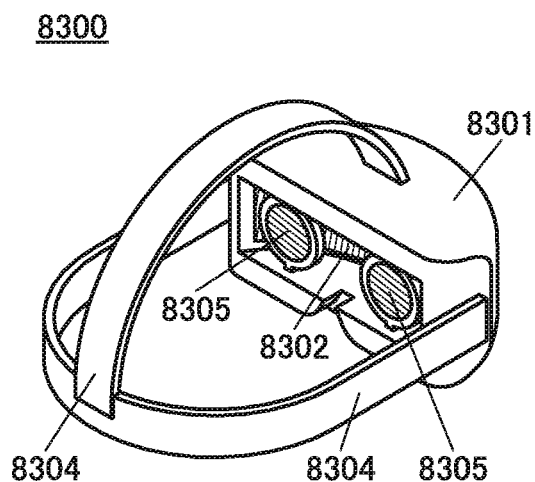
Figure 25E:
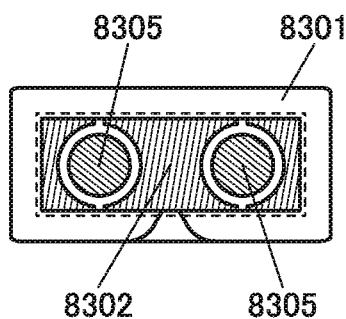

FIGS. 25C to 25E are external views of a head-mounted display 8300. The head-mounted display 8300 includes a housing 8301, a display portion 8302, a band-shaped object 8304 for fixing the display, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 25E, the user does not perceive pixels, and thus a more realistic image can be displayed.

Next, FIGS. 26A to 26G illustrate examples of electronic devices that are different from those illustrated in FIGS. 25A to 25E.

Electronic devices illustrated in FIGS. 26A to 26G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 26A to 26G have a variety of functions. For example, each of the electronic devices can have a variety of functions such as a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on the display portion. Note that functions that can be provided for the electronic devices illustrated in FIGS. 26A to 26G are not limited to those described above, and the electronic devices can have a variety of functions. Although not illustrated in FIGS. 26A to 26G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 26A to 26G are described in detail below.

Figure 26A:
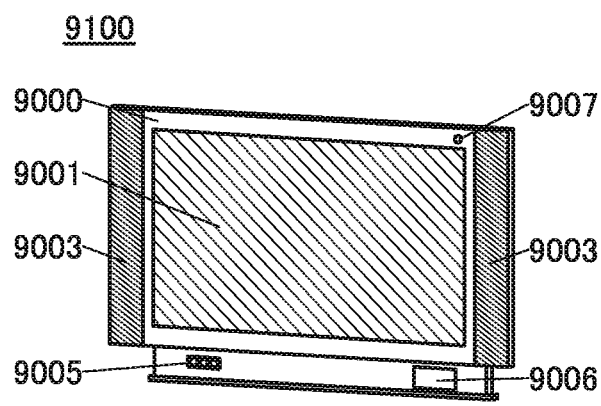
FIGS. 26A to 26G illustrate structure examples of electronic devices.

FIG. 26A is a perspective view illustrating a television device 9100. The television device 9100 can include the display portion 9001 having a large screen size of, for example, 50 inches or more, or 100 inches or more.

Figure 26D:
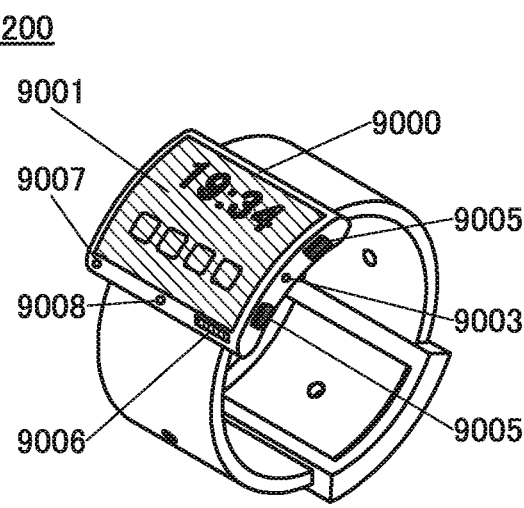
Figure 26B:
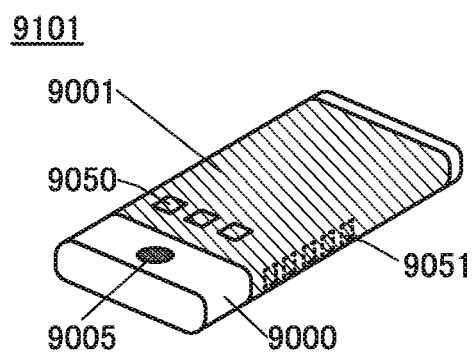

FIG. 26B is a perspective view of a portable information terminal 9101. The portable information terminal 9101 functions as, for example, one or more of a telephone set, a notebook, and an information browsing system. Specifically, the portable information terminal can be used as a smartphone. Note that the portable information terminal 9101 may include the speaker 9003, the connection terminal 9006, the sensor 9007, or the like. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include notification from a social networking service (SNS), display indicating reception of an e-mail and an incoming call, the title of the e-mail, the SNS and the like, the sender of the e-mail, the SNS, and the like, the date, the time, remaining battery, and the reception strength of an antenna. Instead of the information 9051, the operation buttons 9050 or the like may be displayed on the position where the information 9051 is displayed.

Figure 26E:
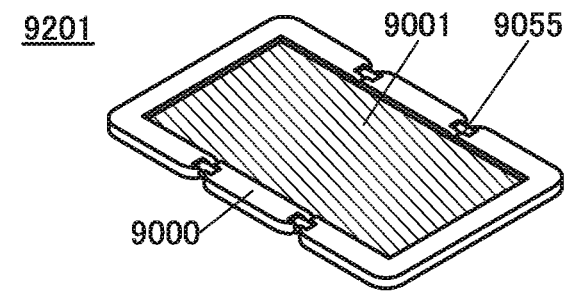
Figure 26C:
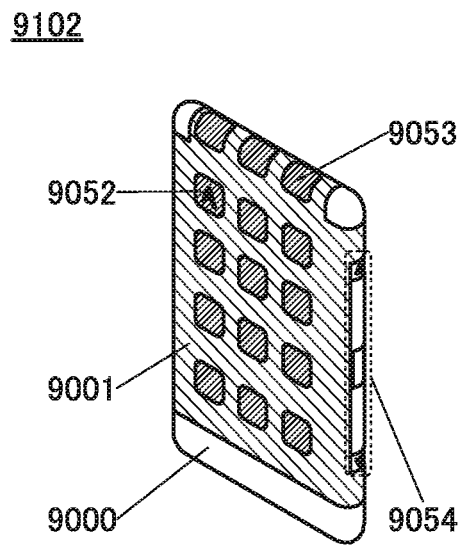

FIG. 26C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 26D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 26F:
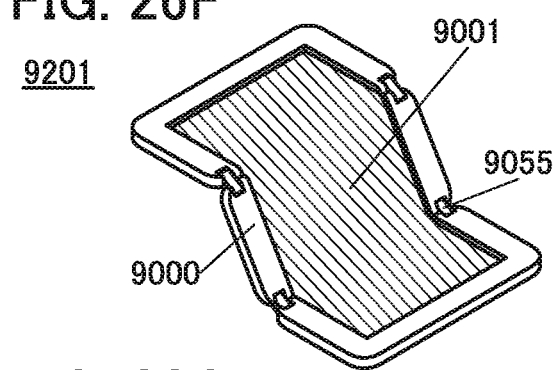
Figure 26G:
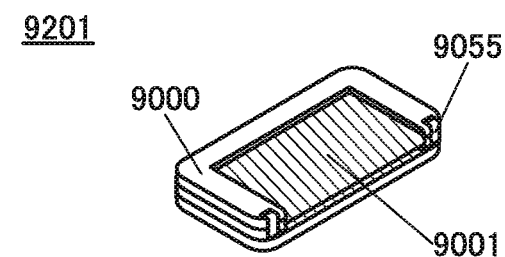

FIGS. 26E, 26F, and 26G are perspective views of a foldable portable information terminal 9201. FIG. 26E is a perspective view illustrating the portable information terminal 9201 that is opened. FIG. 26F is a perspective view illustrating the portable information terminal 9201 that is being opened or being folded. FIG. 26G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the semiconductor device of one embodiment of the present invention can also be used for an electronic device that does not have a display portion.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification as appropriate.

Embodiment 7

In this embodiment, electronic devices of one embodiment of the present invention are described with reference to drawings.

Electronic devices described below are provided with a display device of one embodiment of the present invention in a display portion. Thus, the electronic devices achieve high resolution. In addition, the electronic devices can achieve both high resolution and a large screen.

The display portion of the electronic device of one embodiment of the present invention can display, for example, an image with a resolution of full high definition, 4K2K, 8K4K, 16K8K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of electronic devices include electronic devices having relatively large screens such as a television device, a desktop or laptop personal computer, a monitor of a computer, digital signage, and a large game machine (e.g., a pachinko machine); a digital camera; a digital video camera;

a digital photo frame; a mobile phone; a portable game console; a portable information terminal; and an audio reproducing device.

The electronic device or the lighting device of one embodiment of the present invention can be incorporated along a curved inside/outside wall surface of a house or a building or a curved interior/exterior surface of a car.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 27A:
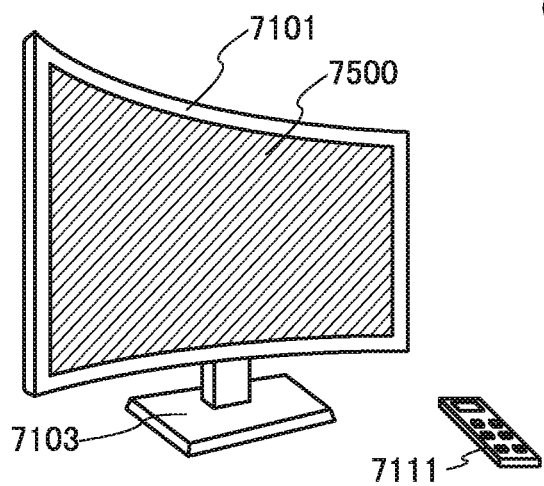
FIGS. 27A to 27D illustrate structure examples of electronic devices.

FIG. 27A illustrates an example of a television device. In a television device 7100, a display portion 7500 is incorporated in a housing 7101. Here, the housing 7101 is supported by a stand 7103.

The display device of one embodiment of the present invention can be used in the display portion 7500.

The television device 7100 illustrated in FIG. 27A can be operated with an operation switch provided in the housing 7101 or a separate remote controller 7111. The display portion 7500 may include a touch sensor. The television device 7100 can be operated by touching the display portion 7500 with a finger or the like. The remote controller 7111 may be provided with a display portion for displaying data outputted from the remote controller 7111. With operation keys or a touch panel of the remote controller 7111, channels and volume can be controlled and images displayed on the display portion 7500 can be controlled.

Note that the television device 7100 is provided with a receiver, a modem, and the like. With the use of the receiver, general television broadcasting can be received. When the television device is connected to a communication network with or without wires via the modem, one-way (from a transmitter to a receiver) or two-way (between a transmitter and a receiver or between receivers) data communication can be performed.

Figure 27B:
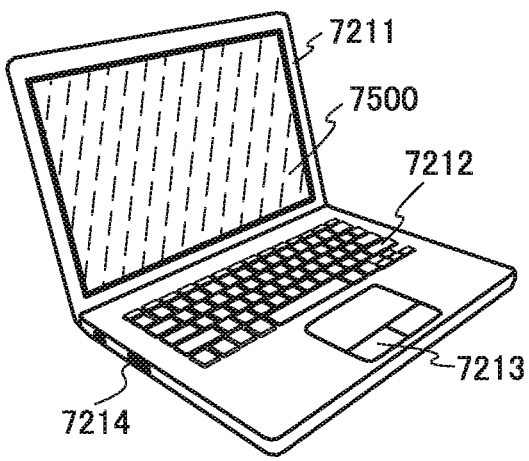

FIG. 27B illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

The display device of one embodiment of the present invention can be used in the display portion 7500.

Figure 27C:
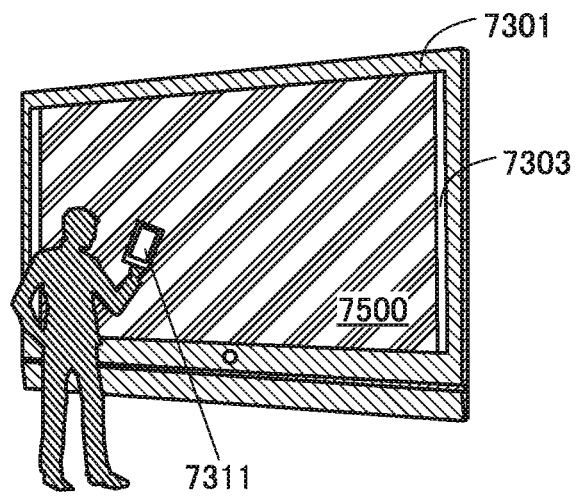
Figure 27D:
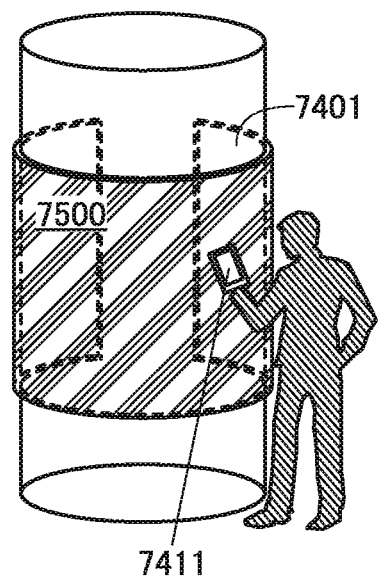

FIGS. 27C and 27D illustrate examples of digital signage.

A digital signage 7300 illustrated in FIG. 27C includes a housing 7301, the display portion 7500, a speaker 7303, and the like. Also, the digital signage can include an LED lamp, operation keys (including a power switch or an operation switch), a connection terminal, a variety of sensors, a microphone, and the like.

FIG. 27D illustrates a digital signage 7400 mounted on a cylindrical pillar 7401. The digital signage 7400 includes the display portion 7500 provided along a curved surface of the pillar 7401.

The display device of one embodiment of the present invention can be used for each of the display portions 7500 illustrated in FIGS. 27C and 27D.

A larger area of the display portion 7500 can provide more information at a time. In addition, the larger display portion 7500 attracts more attention, so that the effectiveness of the advertisement can be increased, for example.

It is preferable to use a touch panel in the display portion 7500 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Furthermore, as illustrated in FIGS. 27C and 27D, it is preferable that the digital signage 7300 or the digital signage 7400 work with an information terminal 7311 or an information terminal 7411 such as a smartphone a user has through wireless communication. For example, information of an advertisement displayed on the display portion 7500 can be displayed on a screen of the portable information terminal 7311 or 7411. Moreover, by operation of the information terminal 7311 or 7411, a displayed image on the display portion 7500 can be switched.

Furthermore, it is possible to make the digital signage 7300 or 7400 execute a game with use of the screen of the portable information terminal 7311 or 7411 as an operation means (controller). Thus, an unspecified number of people can join in and enjoy the game concurrently.

At least part of this embodiment can be implemented in combination with any of the other embodiments described in this specification as appropriate.

Embodiment 8

In this embodiment, an example of a television device for which a display device including the semiconductor device of one embodiment of the present invention can be used is described with reference to drawings.

Figure 28A:
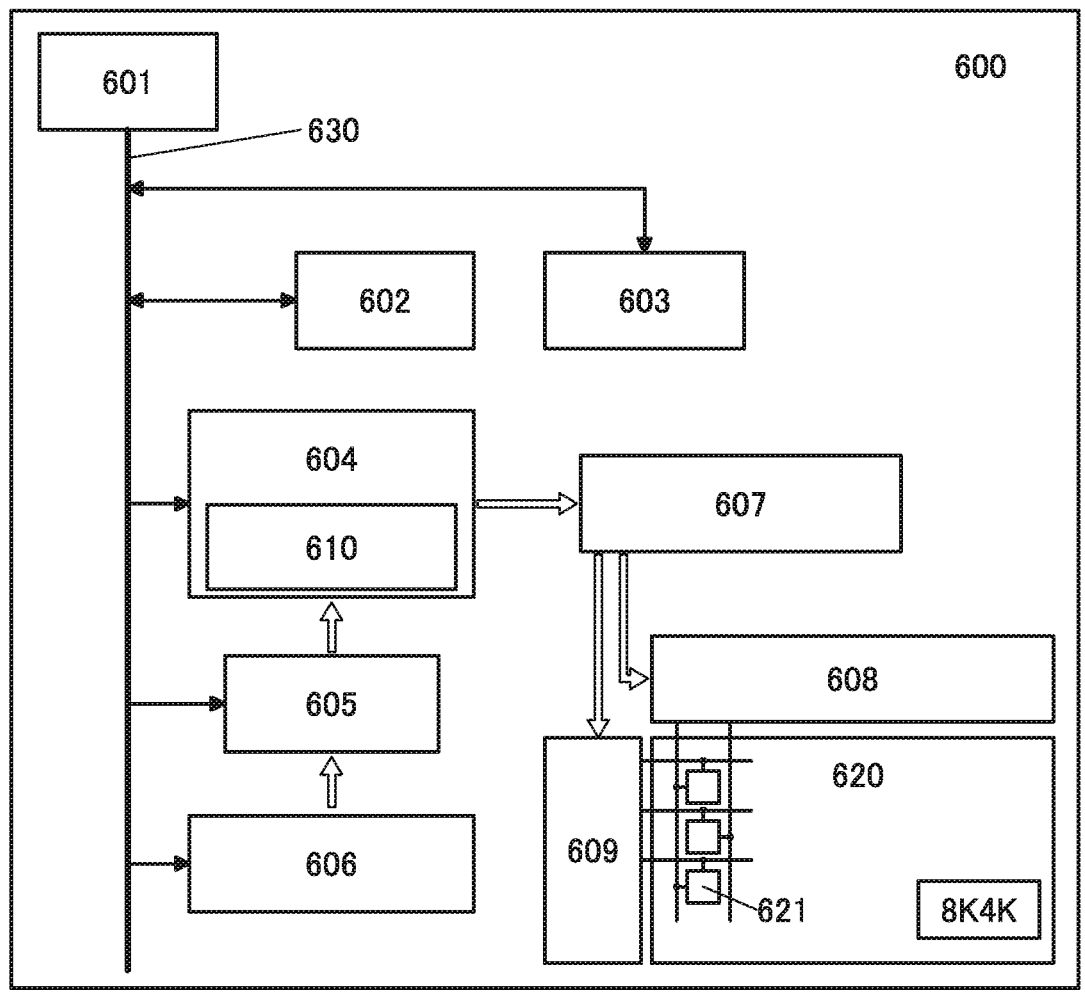
FIGS. 28A and 28B illustrate a structure example of a television device.

FIG. 28A is a block diagram illustrating a television device 600.

Note that in a block diagram attached to this specification, components are classified according to their functions and shown as independent blocks; however, it is practically difficult to completely separate the components according to their functions, and one component may have a plurality of functions.

The television device 600 includes a control portion 601, a memory portion 602, a communication control portion 603, an image processing circuit 604, a decoder circuit 605, a video signal reception portion 606, a timing controller 607, a source driver 608, a gate driver 609, a display panel 620, and the like.

The display device described in the above embodiment can be used for the display panel 620 illustrated in FIG. 28A. Thus, the television device 600 with a large size, high definition, and high visibility can be fabricated.

The control portion 601 can function as, for example, a central processing unit (CPU). For example, the control portion 601 has a function of controlling components such as the memory portion 602, the communication control portion 603, the image processing circuit 604, the decoder circuit 605, and the video signal reception portion 606 via a system bus 630.

Signals are transmitted between the control portion 601 and the components via the system bus 630. The control portion 601 has a function of processing signals inputted from the components which are connected via the system bus 630, a function of generating signals to be outputted to the components, and the like, so that the components connected to the system bus 630 can be controlled comprehensively.

The memory portion 602 functions as a register, a cache memory, a main memory, a secondary memory, or the like that can be accessed by the control portion 601 and the image processing circuit 604.

As a memory device that can be used as a secondary memory, a memory device that includes a rewritable non-volatile memory element can be used, for example. Examples of the memory device include a flash memory, a magnetoresistive random access memory (MRAM), a phase change RAM (PRAM), a resistive RAM (ReRAM), and a ferroelectric RAM (FeRAM).

As a memory device that can be used as a temporary memory such as a register, a cache memory, or a main memory, a volatile memory element such as a dynamic RAM (DRAM) or a static random access memory (SRAM) may be used.

For example, as a RAM provided in the main memory, a DRAM is used, in which case a memory space as a workspace for the control portion 601 is virtually allocated and used. An operating system, an application program, a program module, program data, and the like which are stored in the memory portion 602 are loaded into the RAM and executed. The data, program, and program module which are loaded into the RAM are directly accessed and operated by the control portion 601.

In the ROM, a basic input/output system (BIOS), firmware, and the like for which rewriting is not needed can be stored. As the ROM, a mask ROM, a one-time programmable read only memory (OTPROM), or an erasable programmable read only memory (EPROM) can be used. As an EPROM, an ultra-violet erasable programmable read only memory (UV-EPROM) which can erase stored data by irradiation with ultraviolet rays, an electrically erasable programmable read only memory (EEPROM), a flash memory, and the like can be given.

Besides the memory portion 602, a detachable memory device may be connected to the television device 600. For example, it is preferable to provide a terminal connected to a storage media drive functioning as a storage device such as a hard disk drive (HDD) or a solid state drive (SSD) or a storage medium such as a flash memory, a Blu-ray Disc, or a DVD. With such a structure, an image can be stored.

The communication control portion 603 has a function of controlling communication exchanged via a computer network. For example, the communication control portion 603 controls a control signal for connection to a computer network in response to instructions from the control portion 601 and transmits the signal to the computer network. Accordingly, communication can be performed by connecting to a computer network such as the Internet, which is an infrastructure of the World Wide Web (WWW), an intranet, an extranet, a personal area network (PAN), a local area network (LAN), a campus area network (CAN), a metropolitan area network (MAN), a wide area network (WAN), or a global area network (GAN).

The communication control portion 603 may have a function of communicating with a computer network or another electronic device with a communication standard such as Wi-Fi (registered trademark), Bluetooth (registered trademark), or ZigBee (registered trademark).

The communication control portion 603 may have a function of wireless communication. For example, an antenna and a high frequency circuit (an RF circuit) are provided to receive and transmit an RF signal. The high frequency circuit converts an electromagnetic signal into an electric signal in a frequency band in accordance with respective national laws and transmits the electromagnetic signal wirelessly to another communication device. Several tens of kilohertz to several tens of gigahertz is a practical frequency band which is generally used. The high frequency circuit connected to an antenna includes a high frequency circuit portion compatible with a plurality of frequency bands; the high frequency circuit portion can include an amplifier, a mixer, a filter, a DSP, an RF transceiver, or the like.

The video signal reception portion 606 includes, for example, an antenna, a demodulation circuit, and analog-digital conversion circuit (AD converter circuit), and the like. The demodulation circuit has a function of demodulating a signal inputted from the antenna. The AD converter circuit has a function of converting the demodulated analog signal into a digital signal. The signal processed in the video signal reception portion 606 is transmitted to the decoder circuit 605.

The decoder circuit 605 has a function of decoding video data included in a digital signal inputted from the video signal reception portion 606, in accordance with the specifications of the broadcasting standard for transmitting the video data, and a function of generating a signal transmitted to the image processing circuit. For example, as the broadcasting standard in 8K broadcasts, H.265|MPEG-H high efficiency video coding (HEVC) is given.

The antenna included in the video signal reception portion 606 can receive airwaves such as a ground wave and a satellite wave. The antenna can receive airwaves for analog broadcasting, digital broadcasting, and the like, and image-sound-only broadcasting, sound-only broadcasting, and the like. For example, the antenna can receive airwaves transmitted in a certain frequency band, such as a UHF band (about 300 MHz to 3 GHz) or a VHF band (30 MHz to 300 MHz). When a plurality of pieces of data received in a plurality of frequency bands is used, the transfer rate can be increased and more information can thus be obtained. Accordingly, the display panel 620 can display an image with a resolution higher than the full high definition, such as 4K2K, 8K4K, 16K8K, or more.

Alternatively, the video signal reception portion 606 and the decoder circuit 605 may generate a signal using the broadcasting data transmitted to the image processing circuit 604 with data transmission technology through a computer network. In the case where a digital signal is received, the video signal reception portion 606 does not necessarily include a demodulating circuit, an AD converter circuit, and the like.

The image processing circuit 604 has a function of generating a video signal outputted to the timing controller 607, on the basis of a video signal inputted from the decoder circuit 605.

The timing controller 607 has a function of generating a signal (e.g., a clock signal or a start pulse signal) outputted to the gate driver 609 and the source driver 608 on the basis of a synchronization signal included in a video signal or the like on which the image processing circuit 604 performs processing. In addition, the timing controller 607 has a function of generating a video signal outputted to the source driver 608, as well as the above signal.

The display panel 620 includes a plurality of pixels 621. Each pixel 621 is driven by a signal supplied from the gate driver 609 and the source driver 608. Here, an example of a display panel with the 7680×4320 pixels, i.e., the resolution corresponding to the standard of 8K4K, is shown. Note that the resolution of the display panel 620 is not limited to the above, and may have a resolution corresponding to the standard such as full high-definition (the number of pixels is 1920×1080) or 4K2K (the number of pixels is 3840×2160).

The control portion 601 or the image processing circuit 604 illustrated in FIG. 28A may include, for example, a processor. For example, a processor functioning as a central processing unit (CPU) can be used for the control portion 601. Another processor such as a digital signal processor (DSP) or a graphics processing unit (GPU) can be used, for example for the image processing circuit 604. Furthermore, such a processor obtained with a programmable logic device (PLD) such as a field programmable gate array (FPGA) or a field programmable analog array (FPAA) may be used for the control portion 601 or the image processing circuit 604.

The processor interprets and executes instructions from various programs to process various kinds of data and control programs. The programs executed by the processor may be stored in a memory region included in the processor or a memory device which is additionally provided.

Two or more functions among the functions of the control portion 601, the memory portion 602, the communication control portion 603, the image processing circuit 604, the decoder circuit 605, the video signal reception portion 606, and the timing controller 607 are aggregated in one IC chip to form a system LSI. For example, such a system LSI may include a processor, a decoder circuit, a tuner circuit, an AD converter circuit, a DRAM, an SRAM, and the like.

Note that a transistor that includes an oxide semiconductor in a channel formation region and that has an extremely low off-state current can be used in an IC or the like included in the control portion 601 or another component. With the use of the transistor having an extremely low off-state current as a switch for holding electric charge (data) which flows into a capacitor serving as a memory element, a long data retention period can be ensured. By utilizing this characteristic for a register or a cache memory of the control portion 601 or the like, normally-off computing is achieved where the control portion 601 operates only when needed and data on the previous processing is stored in the memory element in the rest of time; thus, power consumption of the television device 600 can be reduced.

Note that the structure of the television device 600 illustrated in FIG. 28A is just an example, and all of the components illustrated here are not necessarily included. The television device 600 may include at least necessary components among the components illustrated in FIG. 28A. Furthermore, the television device 600 may include a component other than the components illustrated in FIG. 28A.

For example, the television device 600 may include an external interface, a sound output portion, a touch panel unit, a sensor unit, a camera unit, or the like besides the components in FIG. 28A. Examples of the external interfaces include an external connection terminal such as an universal serial bus (USB) terminal, a local area network (LAN) connection terminal, a power reception terminal, a sound output terminal, a sound input terminal, a video output terminal, and a video input terminal, a transceiver for optical communication using infrared rays, visible light, ultraviolet rays, or the like, and a physical button provided on a housing. Examples of sound input/output portions include a sound controller, a microphone, and a speaker.

The image processing circuit 604 is described in detail below.

The image processing circuit 604 preferably has a function of performing image processing on the basis of a video signal inputted from the decoder circuit 605.

Examples of the image processing include noise removal, grayscale conversion, tone correction, and luminance correction. As the tone correction or the luminance correction, gamma correction can be given, for example.

Furthermore, the image processing circuit 604 preferably has a function of pixel interpolation in accordance with up-conversion of the resolution, a function of frame interpolation in accordance with up-conversion of the frame frequency, or the like.

The noise removing process is a process for removing various noise, such as mosquito noise which appears near outline of texts and the like, block noise which appears in high-speed moving images, random noise causing flicker, and dot noise caused by up-conversion of the resolution.

The grayscale conversion processing converts the grayscale of an image to a grayscale corresponding to output characteristics of the display panel 620. For example, in the case where the number of grayscale levels is increased, gradation values of pixels are interpolated to an input image with a small number of grayscale levels and assigned to the pixels, so that a smooth histogram can be obtained. In addition, a high-dynamic range (HDR) processing for increasing the dynamic range is also included in the grayscale conversion processing.

The pixel interpolation process interpolates data which does not actually exist when resolution is up-converted. For example, data is interpolated to display intermediate color between the colors of pixels with reference to pixels around the target pixel.

The tone correction process corrects the tone of an image. The luminance correction process corrects the brightness (luminance contrast) of an image. For example, these processes detect a type, luminance, color purity, and the like of lighting placed in a space where the television device 600 is provided, and corrects luminance and tone of images displayed on the display panel 620 to be optimal luminance and tone in accordance with the detection. These processes can have a function of referring a displayed image to various images of various scenes in an image list stored in advance, and then correcting luminance and tone of the displayed image to be suitable to the images in the closest scene of the image.

In the case where the frame frequency of the displayed video is increased, the frame interpolation generates an image for a frame that does not exist originally (interpolation frame). For example, an image for an interpolation frame which is interposed between two images is generated from a difference between the two images. Alternatively, images for a plurality of interpolation frames can be generated between two images. For example, when the frame frequency of a video signal inputted from the decoder circuit 605 is 60 Hz, a plurality of interpolation frames are generated, and the frame frequency of a video signal outputted to the timing controller 607 can be increased twofold (120 Hz), fourfold (240 Hz), eightfold (480 Hz), or the like.

The image processing circuit 604 preferably has a function of performing image processing utilizing a neural network. FIG. 28A illustrates an example in which the image processing circuit 604 includes a neural network 610.

For example, with the neural network 610, features can be extracted from image data included in a video. In addition, the image processing circuit 604 can select an optimal correction method in accordance with the extracted feature or select a parameter used for the correction.

Alternatively, the neural network 610 itself may have a function of performing image processing. In other words, the neural network 610 may receive image data on which image processing is not performed and output image data that has been subjected to image processing.

Data of a weight coefficient used for the neural network 610 is stored in the memory portion 602 as a data table. The data table including the weight coefficient can be updated, for example, by the communication control portion 603 through the computer network. Alternatively, the image processing circuit 604 may have a learning function and enable the update of the data table including the weight coefficient.

Figure 28B:
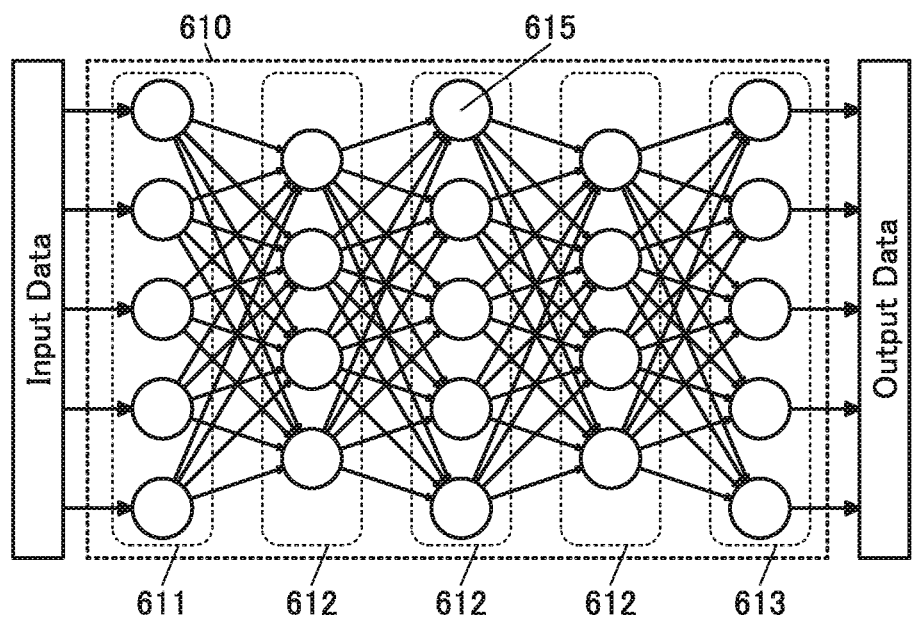

FIG. 28B is a schematic view illustrating the neural network 610 included in the image processing circuit 604.

In this specification and the like, the neural network indicates a general model having the capability of solving problems, which is modeled on a biological neural network and determines the connection strength of neurons by the learning. The neural network includes an input layer, a middle layer (also referred to as hidden layer), and an output layer. A neural network having two or more middle layers is referred to as a deep neural network (DNN).

In the description of the neural network in this specification and the like, to determine a connection strength of neurons (also referred to as weight coefficient) from the existing data is called "leaning" in some cases. In this specification and the like, to form a neural network using the connection strength obtained by the learning, to lead to a new conclusion, is called "inference" in some cases.

The neural network 610 includes an input layer 611, one or more middle layers 612, and an output layer 613. Input data is inputted to the input layer 611. Output data is outputted from the output layer 613.

Each of the input layer 611, the middle layer 612, and the output layer 613 includes neurons 615. The neuron 615 indicates a circuit element that performs product-sum operation (product-sum operation element). In FIG. 28B, directions of inputting/outputting data between the two neurons 615 in two layers are denoted by arrows.

The arithmetic processing in each layer is executed by the product-sum operation of an output of the neuron 615 in the previous layer and a weight coefficient. For example, when the output from an i-th neuron in the input layer 611 is denoted by $x_i$ and the connection strength (weight coefficient) between the output $x_i$ and a j-th neuron in the middle layer 612 next to the input layer 611 is denoted by $w_{ji}$, the output from the j-th neuron in the middle layer is denoted by $y_j = f(\Sigma w_{ji} \cdot x_i)$. Note that i and j are each an integer greater than or equal to 1. Here, f(x) represents an activation function, and a sigmoid function, a threshold function, or the like can be used therefor. In this manner, the output of the neuron 615 in each layer is a value obtained from the activation function with respect to the result of product-sum operation of the output from the neuron 615 in the previous layer and the weight coefficient. The connection between layers may be a full connection where all of the neurons are connected or a partial connection where part of neurons is connected. FIG. 28B shows the case where all of the neurons are connected.

FIG. 28B illustrates an example including three middle layers 612. The number of middle layers 612 is not limited to three, and a structure including at least one middle layer is acceptable. The number of neurons included in one middle layer 612 may be changed as appropriate depending on the specifications. For example, the number of neurons 615 included in one middle layer 612 may be larger or smaller than the number of neurons 615 included in the input layer 611 or the output layer 613.

The weight coefficient serving as an indicator of the connection strength between the neurons 615 is determined by learning. Although the learning may be executed by the processor in the television device 600, it is preferable to execute the learning with a calculator having high arithmetic processing properties, such as a dedicated server or a cloud. The weight coefficient determined by the learning is stored in the memory portion 602 as the data table and used when the weight coefficient is read out by the image processing circuit 604. The table can be updated as needed through the computer network.

The above is the description of the neural network.

At least part of this embodiment can be implemented in combination with any of the other embodiments described in this specification as appropriate.

(Supplementary Note)

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of different polarity is employed or a direction of current flow is changed in circuit operation, for example. Therefore, the terms "source" and "drain" can be switched in this specification and the like.

Note that in this specification and the like, the term "electrically connected" includes the case where components are connected through an object having any electric function. There is no particular limitation on the "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1 \times 10^{-9}$ A at a voltage $V_{gs}$ of 0.5 V, $1 \times 10^{-13}$ A at a voltage $V_{gs}$ of 0.1 V, $1 \times 10^{-19}$ A at a voltage $V_{gs}$ of −0.5 V, and $1 \times 10^{-22}$ A at a voltage $V_{gs}$ of −0.8 V. The drain current of the transistor is $1 \times 10^{-19}$ A or lower at $V_{gs}$ of −0.5 V or at $V_{gs}$ in the range of −0.8 V to −0.5 V; therefore, it can be said that the off-state current of the transistor is $1 \times 10^{-19}$ A or lower. Since there is $V_{gs}$ at which the drain current of the transistor is $1 \times 10^{-22}$ A or lower, it may be said that the off-state current of the transistor is $1 \times 10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to a current I" may mean that there is $V_{gs}$ at which the off-state current of the transistor is lower than or equal to the current I at a voltage $V_{ds}$ of 0.1 V, 0.8 V, 1 V, 1.2 V, 1.8 V, 2.5 V, 3 V, 3.3 V, 10 V, 12 V, 16 V, or 20 V, at a voltage $V_{ds}$ at which the reliability of a semiconductor device or the like including the transistor is ensured, or at a voltage $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g \sqrt{I_d}$ characteristics). Alternatively, the threshold voltage of a transistor may refer to a gate voltage ($V_g$) at which the value of $I_d$ [A]×L [μm]/W [μm] is $1 \times 10^{-9}$ [A] where L is channel length and W is channel width.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases, and vice versa.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases, and vice versa.

In this specification and the like, "In:Ga:Zn=4:2:3 or a neighborhood of In:Ga:Zn=4:2:3" refers to an atomic ratio where, when In is 4 with respect to the total number of In, Ga, and Zn atoms, Ga is greater than or equal to 1 and less than or equal to 3 and Zn is greater than or equal to 2 and less than or equal to 4. Furthermore, "In:Ga:Zn=5:1:6 or a neighborhood of In:Ga:Zn=5:1:6" refers to an atomic ratio where, when In is 5 with respect to the total number of In, Ga, and Zn atoms, Ga is greater than 0.1 and less than or equal to 2 and Zn is greater than or equal to 5 and less than or equal to 7. Furthermore, "In:Ga:Zn=1:1:1 or a neighborhood of In:Ga:Zn=1:1:1" refers to an atomic ratio where, when In is 1 with respect to the total number of In, Ga, and Zn atoms, Ga is greater than 0.1 and less than or equal to 2 and Zn is greater than 0.1 and less than or equal to 2.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. An "OS FET" refers to a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, a high on-state current and high field-effect mobility, can be obtained.

In other words, CAC-OS or CAC metal oxide can be called a matrix composite or a metal matrix composite.

An example of a crystal structure of a metal oxide is described. Note that a metal oxide deposited by a sputtering method using an In—Ga—Zn oxide target (In:Ga:Zn=4:2:4.1 in an atomic ratio) is described below as an example. A metal oxide formed by a sputtering method using the above-mentioned target at a substrate temperature of higher than or equal to 100° C. and lower than or equal to 130° C. is referred to as sIGZO, and a metal oxide formed by a sputtering method using the above-mentioned target with the substrate temperature set at room temperature (R.T.) is referred to as tIGZO. For example, sIGZO has one or both crystal structures of nanocrystal (nc) and CAAC. Furthermore, tIGZO has a crystal structure of nc. Note that room temperature (R.T.) herein also refers to a temperature of the time when a substrate is not heated intentionally.

Note that the CAAC structure is a crystal structure of a thin film or the like that has a plurality of nanocrystals (crystal regions each of which has a maximum diameter of less than 10 nm). The nanocrystals each have c-axis alignment in a particular direction. The nanocrystals each have neither a-axis alignment nor b-axis alignment, and have continuous crystal connection without a grain boundary in the a-axis and b-axis directions. In particular, in a thin film having the CAAC structure, the c-axes of nanocrystals are likely to be aligned in the film thickness direction, the normal direction of the surface where the thin film is formed, or the normal direction of the surface of the thin film.

Here, in crystallography, a general way of choosing a unit cell formed with three axes (crystal axes) of the a-axis, the b-axis, and the c-axis is to choose a unit cell in which a unique axis is used as the c-axis. In particular, in the case of a crystal having a layered structure, a general way of choosing a unit cell is to choose a unit cell in which two axes parallel to the plane direction of a layer are used as the a-axis and the b-axis and an axis intersecting with the layer is used as the c-axis. Typical examples of such a crystal having a layered structure include graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure can be classified as a hexagonal system, and, in a unit cell thereof, the a-axis and the b-axis are parallel to the plane direction of the layer and the c-axis is orthogonal to the layer (i.e., orthogonal to the a-axis and the b-axis).

In this specification and the like, a display panel as one embodiment of the display device has a function of displaying (outputting) an image or the like on (to) a display surface; hence, the display panel is one embodiment of an output device.

In this specification and the like, a structure in which a connector such as a flexible printed circuit (FPC) or a tape carrier package (TCP) is attached to a substrate of a display panel, or a structure in which an IC is mounted on a substrate by a chip on glass (COG) method or the like is referred to as a display panel module or a display module, or simply referred to as a display panel or the like in some cases.

In this specification and the like, a touch sensor has a function of sensing the contact, press, approach, or the like of an object such as a finger or a stylus. In addition, the touch sensor may have a function of sensing the positional information. Therefore, the touch sensor is one embodiment of an input device. For example, the touch sensor can include one or more sensor elements.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel which is one embodiment of the display device has a function of displaying (outputting) an image or the like on (to) a display surface and a function as a touch sensor capable of sensing contact, press, approach, or the like of an object such as a finger or a stylus on or to the display surface. Therefore, the touch panel is an embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel or on a surface of the display panel.

In this specification and the like, a structure in which a connector such as an FPC or a TCP is attached to a substrate of a touch panel, or a structure in which an IC is mounted on a substrate by a COG method or the like is referred to as a touch panel module or a display module, or simply referred to as a touch panel or the like in some cases.

Example 1

In this example, the resistance of each metal oxide film was reduced with the use of the first layer, and the evaluation results of the sheet resistance of the metal oxide films are described.

In Evaluation 1, a plurality of samples in which the first layers were formed using different materials were fabricated, and the sheet resistance of each of the metal oxide films was measured. In Evaluation 2, the sheet resistance of the metal oxide film was measured after each step of the fabrication of the sample, and the transition of the sheet resistance of the metal oxide film was evaluated. In Evaluation 3, a plurality of samples in which the metal oxide films were formed using different materials were fabricated, and the sheet resistance of each of the metal oxide films was measured.

[Evaluation 1]

In Evaluation 1, four samples and one comparative sample in which the first layers are formed using different materials were fabricated, and the sheet resistance of the metal oxide films was measured.

First, an approximately 40-nm-thick metal oxide film was formed over a glass substrate.

The metal oxide film was formed under the following conditions: the substrate temperature was 130° C.; an argon gas at a flow rate of 180 sccm and an oxygen gas at a flow rate of 20 sccm were introduced into a chamber of a sputtering apparatus; the pressure was 0.6 Pa; and an alternating-current power of 2.5 kW was applied to a metal oxide target containing indium, gallium, and zinc (In:Ga:Zn=4:2:4.1 [atomic ratio]). The proportion of oxygen in the whole deposition gas may be referred to as an oxygen flow rate ratio. The oxygen flow rate ratio at the time of the formation of the metal oxide film was 10%.

After that, a pair of measurement terminals was formed over the metal oxide film.

The measurement terminals were formed by depositing a 50-nm-thick titanium film, a 100-nm-thick aluminum film, and a 50-nm-thick titanium film in this order with a sputtering apparatus. The pair of measurement terminals was formed using a metal mask so that the diameter of each terminal was 1 mm and the distance between the terminals was 8 mm.

Next, the first layer was formed over the metal oxide film and the measurement terminals.

As the first layer of Sample A1, an approximately 5-nm-thick tungsten film was formed. As the first layer of Sample A2, an approximately 5-nm-thick aluminum film was formed. As the first layer of Sample A3, an approximately 5-nm-thick titanium film was formed. As the first layer of Sample A4, an approximately 5-nm-thick titanium nitride film was formed. As the first layer of Comparative Sample A, an approximately 100-nm-thick silicon nitride film containing hydrogen was formed. The first layers of Samples A1 to A4 were each formed by a sputtering method and the first layer of Comparative Sample A was formed by a plasma CVD method.

Then, heat treatment was performed at 350° C. for one hour in a nitrogen atmosphere.

Next, the first layer was removed by a dry etching method to expose the measurement terminals.

Then, with the measurement terminals, the sheet resistance of the metal oxide film was measured. In this example, the resistance between the pair of measurement terminals was measured.

Figure 29:
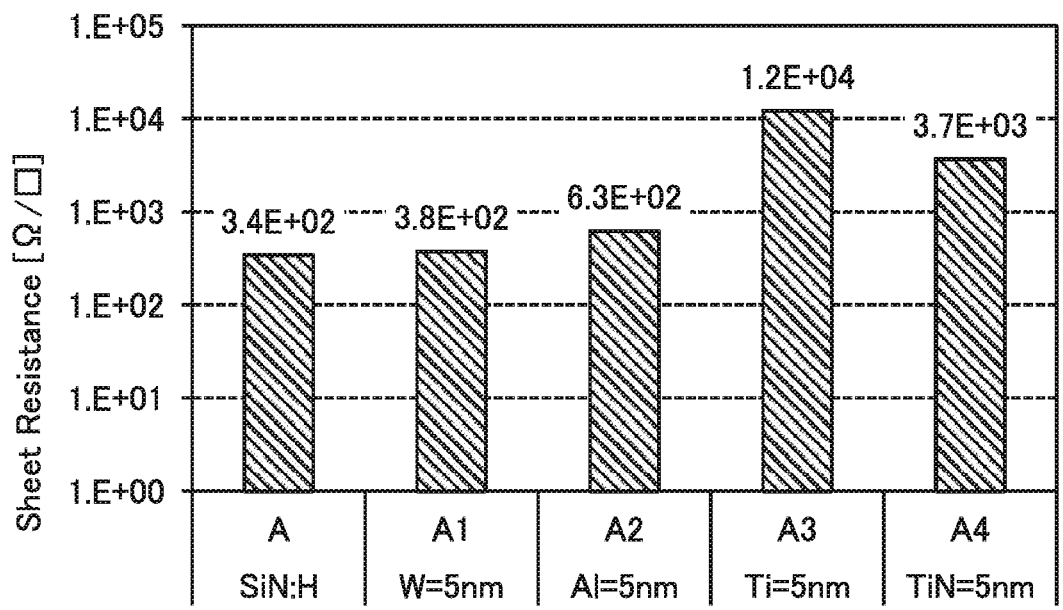
FIG. 29 shows measurement results of sheet resistance in Example 1.

FIG. 29 shows the sheet resistance of the metal oxide films of Samples.

As shown in FIG. 29, it is found that, in each of Samples A1 to A4, the resistance of the metal oxide film is reduced as in Comparative Sample A.

[Evaluation 2]

In Evaluation 2, the sheet resistance of the metal oxide film was measured after each step of the fabrication of the sample, and the transition of the sheet resistance of the metal oxide film was evaluated. Specifically, five kinds of samples subjected to measurement of the sheet resistance of the metal oxide films at different timings were fabricated.

First, an approximately 40-nm-thick metal oxide film was formed over a glass substrate.

The metal oxide film was formed under the following conditions: the substrate temperature was 130° C.; an argon gas at a flow rate of 180 sccm and an oxygen gas at a flow rate of 20 sccm were introduced into a chamber of a sputtering apparatus; the pressure was 0.6 Pa; and an alternating-current power of 2.5 kW was applied to a metal oxide target containing indium, gallium, and zinc (In:Ga:Zn=4:2:4.1 [atomic ratio]).

After that, measurement terminals were formed over the metal oxide film. A sample which was subjected to the measurement of the sheet resistance at this time was referred to as Sample B1.

The measurement terminals were formed by depositing a 50-nm-thick titanium film, a 100-nm-thick aluminum film, and a 50-nm-thick titanium film in this order with a sputtering apparatus. The measurement terminals were formed using a metal mask.

Next, as the first layer, an approximately 5-nm-thick tungsten film was formed over the metal oxide film and the measurement terminals. A sample which was subjected to the measurement of the sheet resistance at this time was referred to as Sample B2. Note that in Sample B2, the first layer was removed by a dry etching method to expose the measurement terminals for measuring the sheet resistance.

After that, heat treatment was performed at 350° C. for one hour in a nitrogen atmosphere.

Next, the first layer was removed by a dry etching method to expose the measurement terminals. A sample which was subjected to the measurement of the sheet resistance at this time was referred to as Sample B3.

Next, an approximately 20-nm-thick aluminum oxide film was formed over the metal oxide film and the measurement terminals. The aluminum oxide film was formed by a sputtering method in an atmosphere containing oxygen. A sample which was subjected to the measurement of the sheet resistance at this time was referred to as Sample B4.

After that, heat treatment was performed at 350° C. for one hour in a nitrogen atmosphere. A sample which was subjected to the measurement of the sheet resistance at this time was referred to as Sample B5.

Through the above steps, the five samples (Samples B1 to B5) were fabricated.

Figure 30:
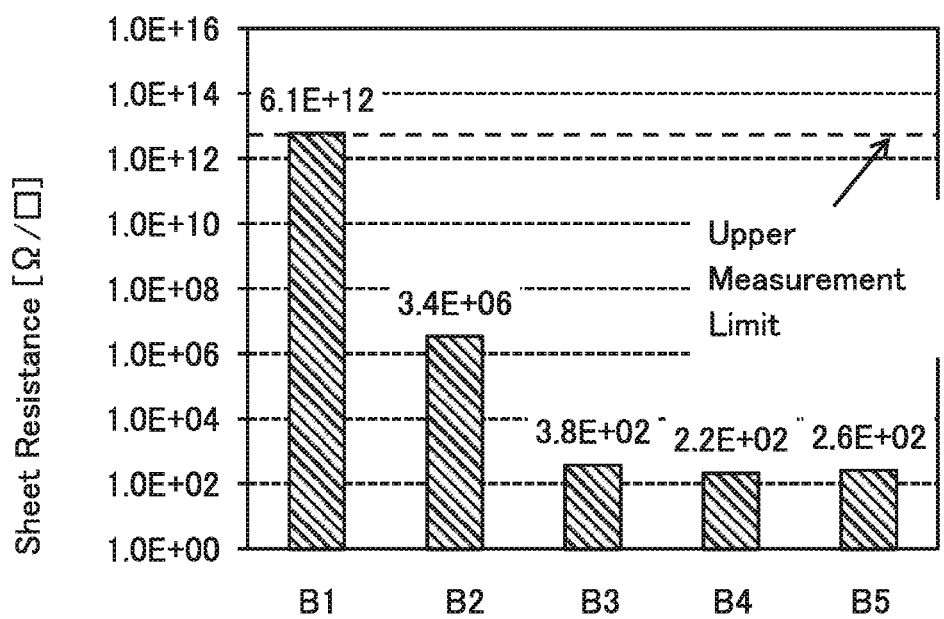
FIG. 30 shows measurement results of sheet resistance in Example 1.

FIG. 30 shows the sheet resistance of the metal oxide film in each sample.

From the measurement results of Sample B1, it is found that the sheet resistance of the metal oxide film immediately after the formation is extremely high and exceeds the upper measurement limit. From the measurement results of Sample B2, it is found that the first layer provided over the metal oxide film reduces the resistance. Furthermore, from the measurement results of Sample B3, it is found that when heat treatment is performed in the state where the first layer is provided over the metal oxide film, the sheet resistance of the metal oxide film can be further reduced.

From the measurement results of Sample B4, it is found that the resistance of the metal oxide film remains low even if the first layer over the low-resistance metal oxide film is removed and an oxide insulating film is formed over and in contact with the metal oxide film in an atmosphere containing oxygen. Furthermore, from the measurement results of Sample B5, it is found that the resistance of the metal oxide film remains low even if heat treatment is performed in the state where the oxide insulating film is provided over the metal oxide film.

The formation step of the oxide aluminum film and the heating step after the formation step correspond to the treatment for adding oxygen to the metal oxide film. However, from the results shown in FIG. 30, the low-resistance metal oxide film with the use of the first layer is stable and the resistance thereof is not easily increased even after the formation step and the heating step in which oxygen can be supplied.

[Evaluation 3]

In Evaluation 3, three samples in which the metal oxide films were formed using different materials were fabricated, and the sheet resistance of the metal oxide films was measured.

First, an approximately 40-nm-thick metal oxide film was formed over a glass substrate.

The metal oxide film of Sample C1 was formed under the following conditions: the substrate temperature was room temperature (25° C.); an argon gas at a flow rate of 180 sccm and an oxygen gas at a flow rate of 20 sccm were introduced into a chamber of a sputtering apparatus; the pressure was 0.6 Pa; and an alternating-current power of 2.5 kW was applied to a metal oxide target containing indium, gallium, and zinc (In:Ga:Zn=1:1:1 [atomic ratio]).

The metal oxide film of Sample C2 was formed under the following conditions: the substrate temperature was 130° C.; an argon gas at a flow rate of 180 sccm and an oxygen gas at a flow rate of 20 sccm were introduced into a chamber of a sputtering apparatus; the pressure was 0.6 Pa; and an alternating-current power of 2.5 kW was applied to a metal oxide target containing indium, gallium, and zinc (In:Ga:Zn=4:2:4.1 [atomic ratio]).

The metal oxide film of Sample C3 was formed under the following conditions: the substrate temperature was room temperature (25° C.); an argon gas at a flow rate of 200 sccm was introduced into a chamber of the sputtering apparatus; the pressure was 0.6 Pa; and an alternating-current power of 2.5 kW was applied to a metal oxide target containing indium, gallium, and zinc (In:Ga:Zn=5:1:7 [atomic ratio]).

After that, measurement terminals were formed over the metal oxide film.

The measurement terminals were formed by depositing a 50-nm-thick titanium film, a 100-nm-thick aluminum film, and a 50-nm-thick titanium film in this order with a sputtering apparatus. The measurement terminals were formed using a metal mask.

Next, as the first layer, an approximately 5-nm-thick tungsten film was formed over the metal oxide film and the measurement terminals.

After that, heat treatment was performed at 350° C. for one hour in a nitrogen atmosphere.

Next, the first layer was removed by a dry etching method to expose the measurement terminals.

Then, with the measurement terminals, the sheet resistance of the metal oxide film was measured.

Figure 31:
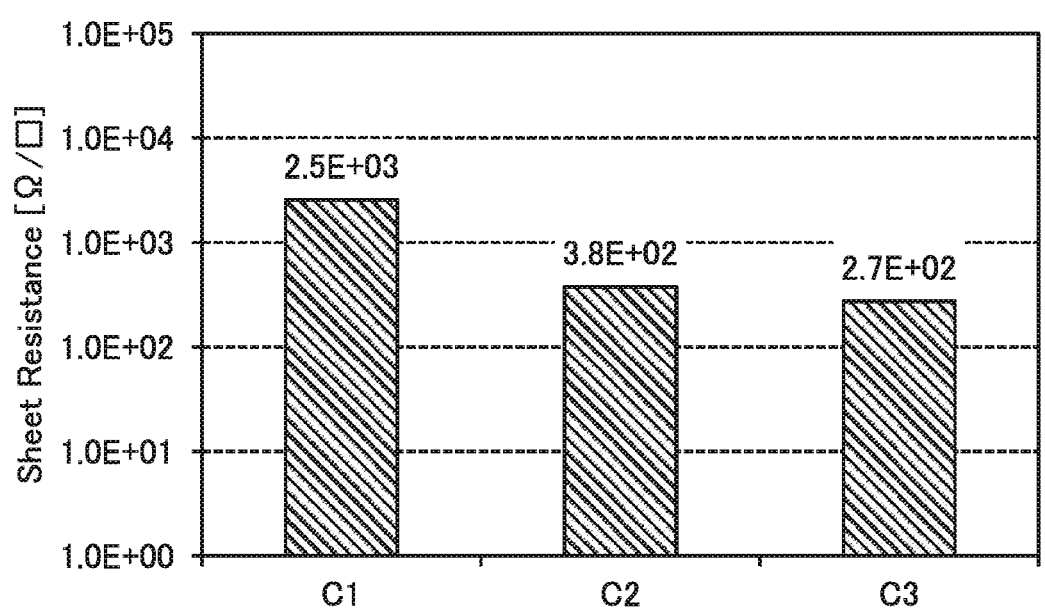
FIG. 31 shows measurement results of sheet resistance in Example 1.

FIG. 31 shows the sheet resistance of the metal oxide film in each sample.

As shown in FIG. 31, it is found that, in each of Samples C1 to C3, the resistance of the metal oxide film is reduced. In addition, it is found that as the proportion of indium contained in the metal oxide film is larger, the resistance of the metal oxide film becomes lower.

Example 2

In this example, transistors whose channel lengths are small were fabricated and the electrical characteristics thereof were evaluated.

[Sample Fabrication]

For the structures of the fabricated transistors, the transistor 100G described in Embodiment 1 and illustrated in FIGS. 8A and 8B can be referred to.

Here, the transistors including different second gate insulating layers, which were positioned in an upper portion, were fabricated.

<Sample Fabrication 1>

Here, a transistor including the second gate insulating layer which has the smallest thickness was fabricated.

First, an approximately 100-nm-thick tungsten film was formed over a glass substrate by a sputtering method, and the tungsten film was processed to form a first gate electrode. Then, as a first gate insulating layer, an approximately 300-nm-thick silicon nitride film and an approximately 5-nm-thick silicon oxynitride film were stacked by a plasma CVD method. At this time, plasma treatment was performed in vacuum in an atmosphere containing an oxygen gas successively after the silicon nitride film was deposited. The conditions of the plasma treatment were a temperature of 350° C., a pressure of 40 Pa, a power supply of 3000 W, an oxygen flow rate ratio of 100%, and a treatment time of 300 seconds.

Next, an approximately 40-nm-thick metal oxide film was formed over the first gate insulating layer, and the metal oxide film was processed to form a semiconductor layer. The metal oxide film was formed by a sputtering method using an In—Ga—Zn oxide target (In:Ga:Zn=4:2:4.1 [atomic ratio]). This was followed by heat treatment in a nitrogen atmosphere.

Then, a silicon oxynitride film to be a second gate insulating layer was formed by a plasma CVD method. Here, the thickness of the silicon oxynitride film was 20 nm.

After that, heat treatment was performed at 350° C. for one hour in a nitrogen atmosphere. Then, as oxygen supply treatment, plasma treatment was performed in an atmosphere containing oxygen. The conditions of the plasma treatment were a temperature of 350° C., a pressure of 40 Pa, a power supply of 3000 W, an oxygen flow rate ratio of 100%, and a treatment time of 300 seconds.

Next, an approximately 5-nm-thick metal oxide film was formed over the silicon oxynitride film by a sputtering method. As the metal oxide film, an approximately 5-nm-thick aluminum oxide film was formed by a reactive sputtering method using an aluminum target. The metal oxide film was formed under the following conditions: the substrate temperature was kept at 170° C.; a mixed gas of an argon gas and an oxygen gas was used as the deposition gas; the pressure was 0.6 Pa; and the power was 7.5 kW. Furthermore, the oxygen flow rate ratio at the time of deposition was 70%.

Next, an approximately 50-nm-thick titanium film, an approximately 200-nm-thick aluminum film, and an approximately 50-nm-thick titanium film were stacked over the metal oxide film by a sputtering method, and the films were processed to form the second gate electrode, the metal oxide layer, and the second gate insulating layer.

Then, as the first layer covering the transistor, an approximately 3-nm-thick aluminum nitride film was formed by a sputtering method. After that, heat treatment was performed at 350° C. for one hour in a nitrogen atmosphere, and then the aluminum nitride film was removed by a wet etching method.

Next, as a protective insulating layer covering the transistor, an approximately 20-nm-thick aluminum oxide film was formed by a sputtering method, and then an approximately 300-nm-thick silicon oxynitride film was formed by a plasma CVD method. After that, heat treatment was performed at 350° C. for one hour in a nitrogen atmosphere. Then, an opening was formed in the part of the insulating layer covering the transistor, a molybdenum film was formed by a sputtering method, and the film was processed to form a source electrode and a drain electrode. After that, an approximately 1.5-μm-thick acrylic film was formed as a planarization layer, and heat treatment was performed at 250° C. for one hour in a nitrogen atmosphere.

Through the above process, the transistor formed over a glass substrate was fabricated.

<Sample Fabrication 2>

Here, transistors including the second gate insulating layers which have thicknesses larger than that in the above transistor were fabricated.

First, the first gate electrode, the first gate insulating layer, and the semiconductor layer were formed, and heat treatment was performed in a nitrogen atmosphere in a manner similar to the above.

Then, a silicon oxynitride film to be a second gate insulating layer was formed by a plasma CVD method. Here, four samples in which the thicknesses of silicon oxynitride films were 150 nm, 100 nm, 80 nm, and 50 nm were fabricated.

After that, heat treatment was performed at 350° C. for one hour in a nitrogen atmosphere. Then, as oxygen supply treatment, plasma treatment was performed in an atmosphere containing oxygen. The conditions of the plasma treatment were a temperature of 350° C., a pressure of 40 Pa, a power supply of 3000 W, an oxygen flow rate ratio of 100%, and a treatment time of 300 seconds.

Next, an approximately 5-nm-thick metal oxide film was formed over the second gate insulating layer by a sputtering method. As the metal oxide film, an approximately 5-nm-thick aluminum oxide film was formed by a reactive sputtering method using an aluminum target. The metal oxide film was formed under the following conditions: the substrate temperature was kept at 170° C.; a mixed gas of an argon gas and an oxygen gas was used as the deposition gas; the pressure was 0.6 Pa; and the power was 7.5 kW. Furthermore, the oxygen flow rate ratio at the time of deposition was 70%.

Next, an approximately 50-nm-thick titanium film, an approximately 200-nm-thick aluminum film, and an approximately 50-nm-thick titanium film were formed over the metal oxide film by a sputtering method, and the films were processed to form the second gate electrode, the metal oxide layer, and the second gate insulating layer.

Next, as a protective insulating layer covering the transistor, an approximately 20-nm-thick aluminum oxide film was formed by a sputtering method, and then an approximately 300-nm-thick silicon oxynitride film was formed by a plasma CVD method. After that, heat treatment was performed at 350° C. for one hour in a nitrogen atmosphere. Then, an opening was formed in the part of the insulating layer covering the transistor, a molybdenum film was formed by a sputtering method, and the film was processed to form a source electrode and a drain electrode. After that, an approximately 1.5-μm-thick acrylic film was formed as a planarization layer, and heat treatment was performed at 250° C. for one hour in a nitrogen atmosphere.

Through the above process, the transistors formed over glass substrates were fabricated.

[$I_d$-$V_g$ Characteristics of Transistors]

Figure 32:
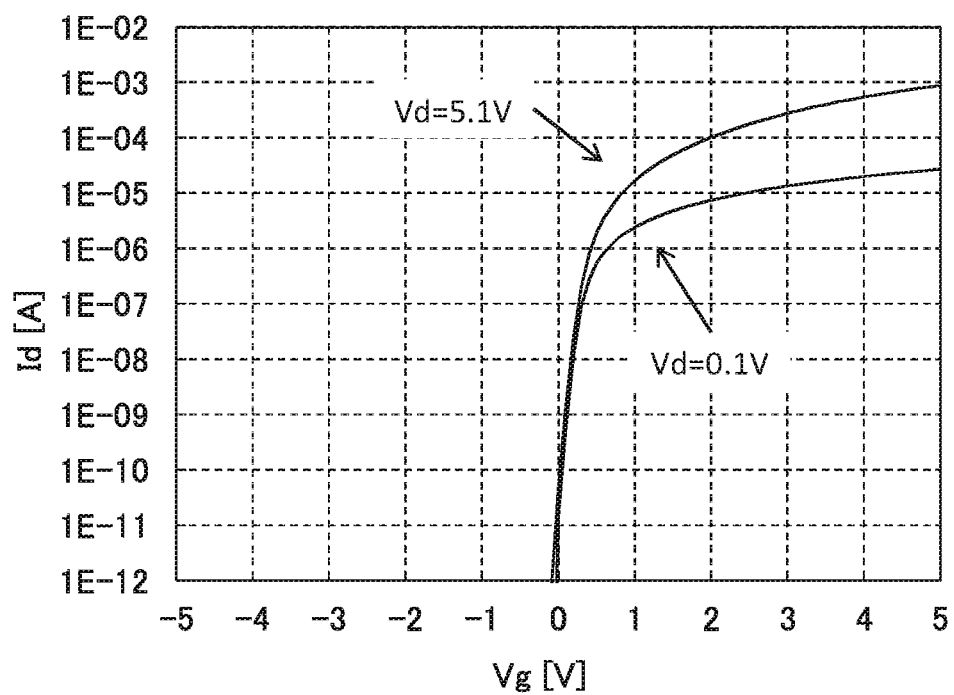
FIG. 32 shows electrical characteristics of a transistor in Example 2.

FIG. 32 shows the measurement results of $I_d$-$V_g$ characteristics of the above transistor in which the second gate insulating layer has a thickness of approximately 20 nm, the channel length L is approximately 0.7 μm, and the channel width W is approximately 20 μm, which was fabricated by the method described in Sample Fabrication 1.

As conditions for measuring the $I_d$-$V_g$ characteristics of each transistor, a voltage applied to the conductive film serving as a first gate electrode (hereinafter the voltage is also referred to as gate voltage ($V_g$)) and a voltage applied to the conductive film serving as the second gate electrode (hereinafter the voltage is also referred to as back gate voltage ($V_{bg}$)) were changed from −5 V to +5 V in increments of 0.1 V. A voltage applied to the conductive film serving as a source electrode (hereinafter the voltage is also referred to as source voltage ($V_s$)) was 0 V (common), and a voltage applied to the conductive film serving as a drain electrode (the voltage is also referred to as drain voltage ($V_d$)) was 0.1 V and 5.1 V.

As shown in FIG. 32, it is found that even if the channel length is approximately 0.7 μm, which is extremely small, and the thickness of the second gate insulating layer is 20 nm, which is extremely thin, favorable transistor characteristics can be obtained.

[On-State Current Characteristics of Transistors]

Next, the on-state currents of transistors, which are the fabricated samples, were measured. The on-state current of the transistor was measured under the following conditions: a voltage applied to the first gate electrode and the second gate electrode (gate voltage ($V_g$)) was 5 V; a voltage applied to the source electrode (source voltage ($V_s$)) was 0 V; and a voltage applied to the drain electrode (drain voltage ($V_d$)) was 5 V.

The six kinds of transistors described below were measured. The first transistor is a transistor in which the thickness of the second gate insulating layer is approximately 150 nm, the channel length L is approximately 3 µm, and the channel width W is approximately 20 µm. The second transistor is a transistor in which the thickness of the second gate insulating layer is approximately 150 nm, the channel length L is approximately 0.7 µm, and the channel width W is approximately 20 µm. The third transistor is a transistor in which the thickness of the second gate insulating layer is approximately 100 nm, the channel length L is approximately 0.7 µm, and the channel width W is approximately 20 µm. The fourth transistor is a transistor in which the thickness of the second gate insulating layer is approximately 80 nm, the channel length L is approximately 0.7 µm, and the channel width W is approximately 20 µm. The fifth transistor is a transistor in which the thickness of the second gate insulating layer is approximately 50 nm, the channel length L is approximately 0.7 µm, and the channel width W is approximately 20 µm. The sixth transistor is a transistor in which the thickness of the second gate insulating layer is approximately 20 nm, the channel length L is approximately 0.7 µm, and the channel width W is approximately 20 µm.

Note that the first to fifth transistors were fabricated by the method described in Sample Fabrication 2 and the sixth transistor was fabricated by the method described in Sample Fabrication 1.

Figure 33:
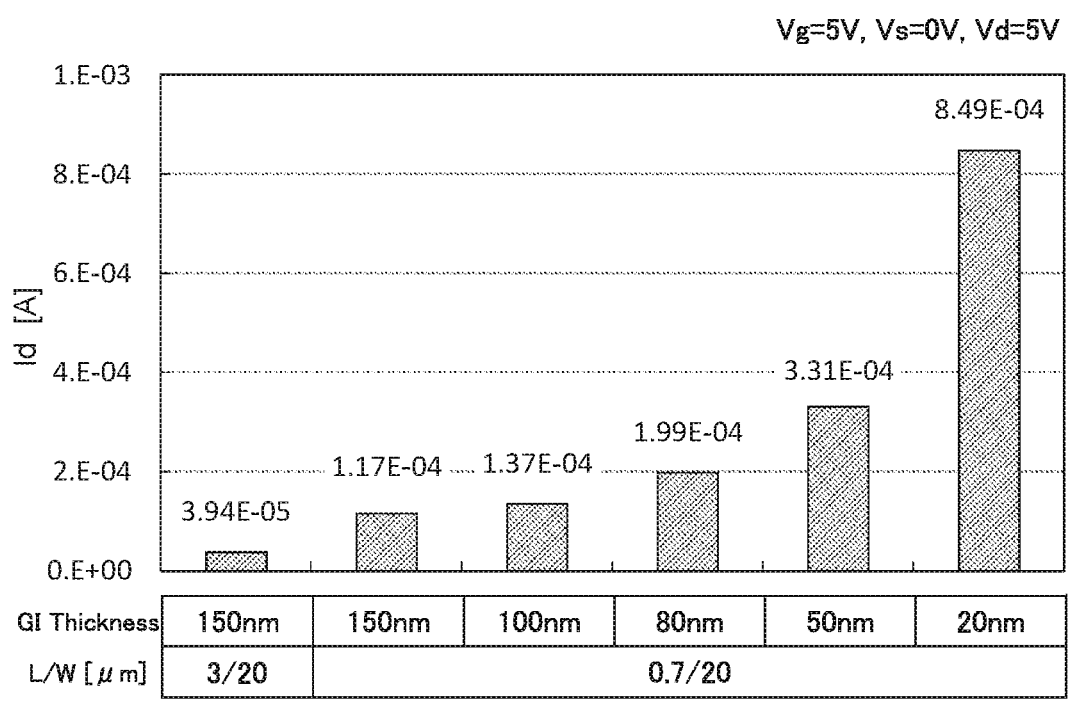
FIG. 33 shows electrical characteristics of transistors in Example 2.

FIG. 33 shows the measurement results of on-state currents of the transistors. In each of the transistors in which the channel length L is approximately 0.7 µm, the on-state current is higher than $1 \times 10^{-4}$ A. In addition, as the second gate insulating layer is thinner, the on-state current tends to be higher, and in the transistor in which the second gate insulating layer is approximately 20 nm, the on-state current is approximately $8.49 \times 10^{-4}$ A, which is extremely high.

Here, in a general transistor using polysilicon, the source region and the drain region are doped with impurities to reduce the resistance of the source region and the drain region. At this time, the doped impurities are partly diffused in a channel formation region. Thus, when the channel length L is extremely short (e.g., 3 µm or less), it is difficult to obtain the transistor characteristics in some cases. However, the transistor of one embodiment of the present invention can have favorable transistor characteristics even if the channel length L is less than or equal to 0.7 µm.

Furthermore, the surface roughness of a general polysilicon film is extremely large due to crystallization; thus, there is a problem that when the thickness of the gate insulating layer is smaller than the degree of roughness, sufficient gate withstand voltage cannot be obtained. Thus, in a transistor using the general polysilicon film, it is difficult to reduce the thickness of the gate insulating layer, and the thickness needs to be larger than approximately 100 nm. In contrast, the surface of the metal oxide film used in the transistor of one embodiment of the present invention is very flat; thus, the thickness of the gate insulating layer can be sufficiently small (e.g., smaller than or equal to 20 nm).

In addition, the on-state current of an n-channel transistor using general polysilicon (with a channel length L of approximately 6.4 µm and a channel width W of approximately 19 µm), which is measured in the same conditions as above, is approximately $5.3 \times 10^{-5}$ A. In contrast, in the transistor of one embodiment of the present invention, in the case where the channel length L is smaller than 1 µm (submicron) and the second gate insulating layer is sufficiently thin, the on-state current can be higher than that of the transistor using polysilicon by one or more orders of magnitude.

Furthermore, when the transistor with an approximately 50-nm-thick second gate insulating layer and the transistor with an approximately 20-nm-thick second gate insulating layer are compared, the on-state current of the latter transistor can be higher than the value estimated from the difference of the thicknesses of the second gate insulating layers (the value 2.5 times as high as that of the transistor with an approximately 50-nm-thick second gate insulating layer). This is probably because the resistance between the source and the drain is further reduced by employing the first layer.

Example 3

In this example, whether a source driver circuit can be obtained using transistors with small channel lengths was verified.

A source driver circuit of a display panel requires an extremely high driving frequency. For example, in the case where a high-definition OLED panel whose display portion size is approximately 5 inches is used, a driving frequency of approximately 30 MHz and a driving frequency of approximately 3 MHz are required in a single-ended method (48-point simultaneous sampling) and an analog line sequential method (54-point simultaneous sampling), respectively.

Figure 34A:
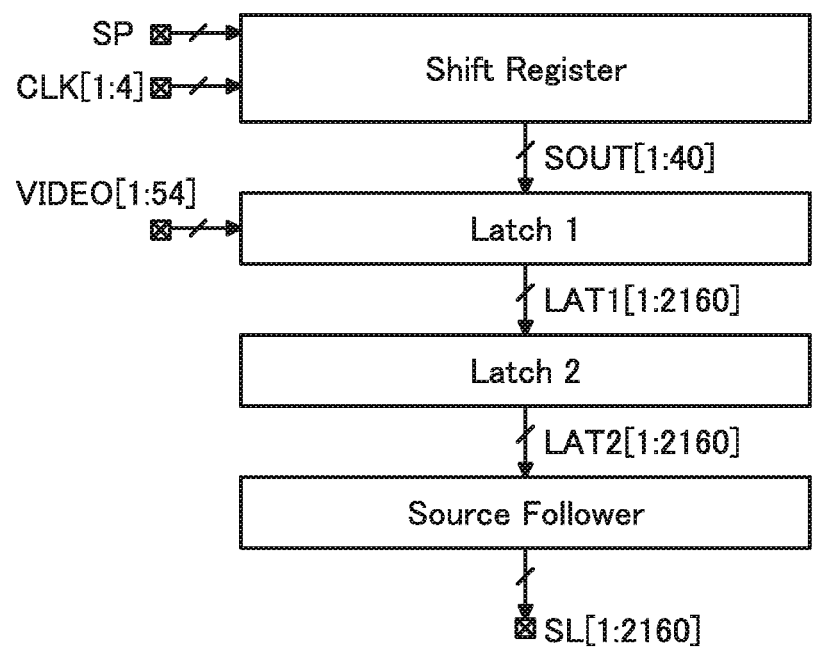
FIGS. 34A to 34C illustrate structure examples of a source driver circuit and a ring oscillator circuit in Example 3.

FIG. 34A shows a configuration example of the source driver circuit with the analog line sequential method (54-point simultaneous sampling). The source driver circuit includes a shift register, two latch circuits (a latch 1 and a latch 2), and a source follower circuit. The source driver circuit in FIG. 34A can drive 2160 source signal lines SL.

In this example, a ring oscillator circuit was formed using the transistor of one embodiment of the present invention, and the oscillation frequency thereof was measured.

Figure 34B:
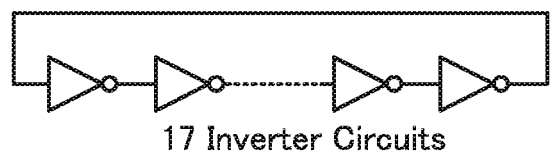

FIG. 34B shows a circuit diagram of the formed ring oscillator circuit. The ring oscillator circuit has a configuration where 17 inverter circuits are connected in series.

Figure 34C:
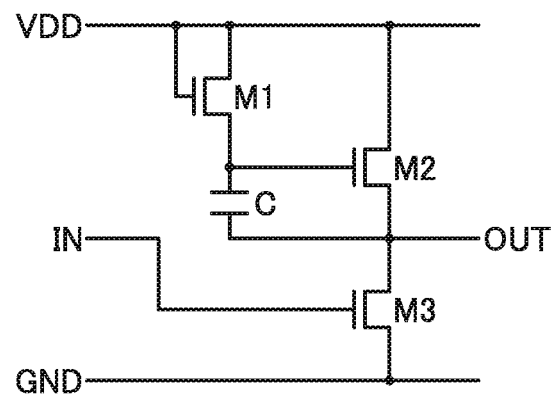

Furthermore, FIG. 34C shows a circuit diagram of one inverter circuit. The inverter circuit includes a transistor M1, a transistor M2, a transistor M3, and a capacitor C. Here, as the transistor M1, two transistors connected in parallel each of which has a channel width W of 20 µm were used. As the transistor M2, two transistors connected in parallel each of which has a channel width W of 50 µm were used. As the transistor M3, 20 transistors connected in parallel each of which has a channel width W of 50 µm were used. The capacitance of the capacitor C was approximately 3.71 pF.

Here, the following four ring oscillator circuits in which the conditions of the transistors are different from each other were fabricated and the oscillation frequency thereof was measured. In the first ring oscillator circuit, the channel lengths of the transistors are each approximately 3 µm and the thicknesses of the second gate insulating layers are each approximately 150 nm. In the second ring oscillator circuit, the channel lengths of the transistors are each approximately 0.8 µm and the thicknesses of the second gate insulating layers are each approximately 150 nm. In the third ring oscillator circuit, the channel lengths of the transistors are each approximately 0.8 µm and the thicknesses of the second gate insulating layers are each approximately 80 nm. In the fourth ring oscillator circuit, the channel lengths of the transistors are each approximately 0.8 μm and the thicknesses of the second gate insulating layers are each approximately 20 nm.

Here, the transistor with the approximately 20-nm-thick second gate insulating layer is a transistor where the second gate electrode is replaced with a tungsten film in Sample Fabrication 1 in Example 2. Furthermore, the other transistors were fabricated by the same method as Sample Fabrication 2 in Example 2.

Figure 35A:
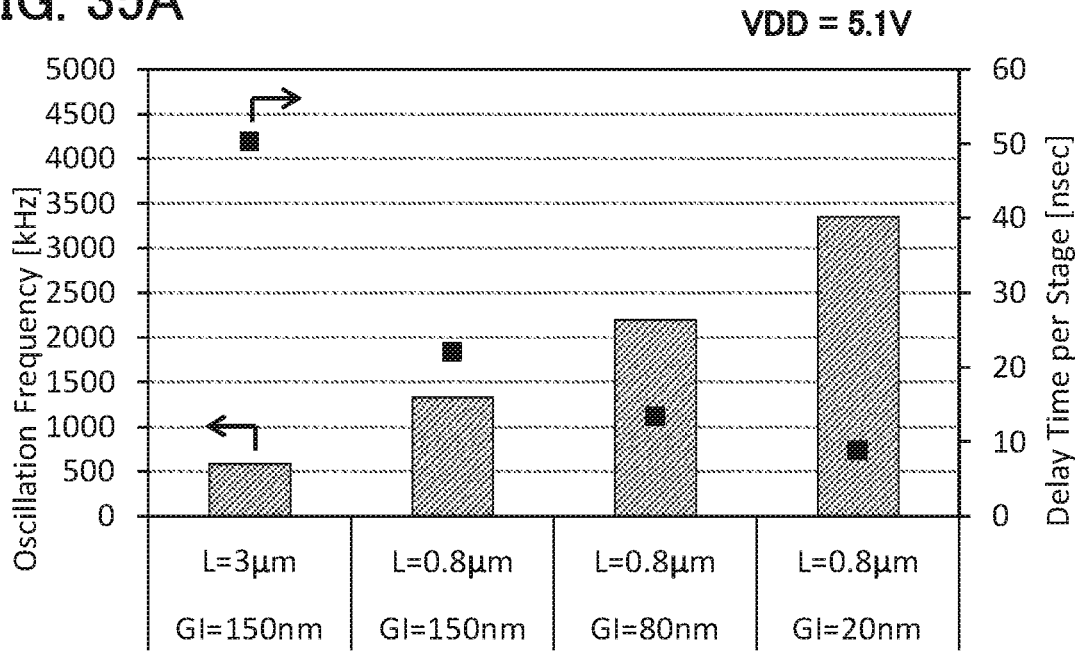
FIGS. 35A and 35B show measurement results of ring oscillator circuits in Example 3.

FIG. 35A shows the measurement results of the oscillation frequency and the delay time per stage when each of the four ring oscillator circuits was driven under the condition where VDD was 5.1 V. Under the condition where the channel length L was approximately 0.8 μm and the thickness of the second gate insulating layer was approximately 20 nm, an oscillation frequency of higher than 3 MHz was obtained.

Figure 35B:
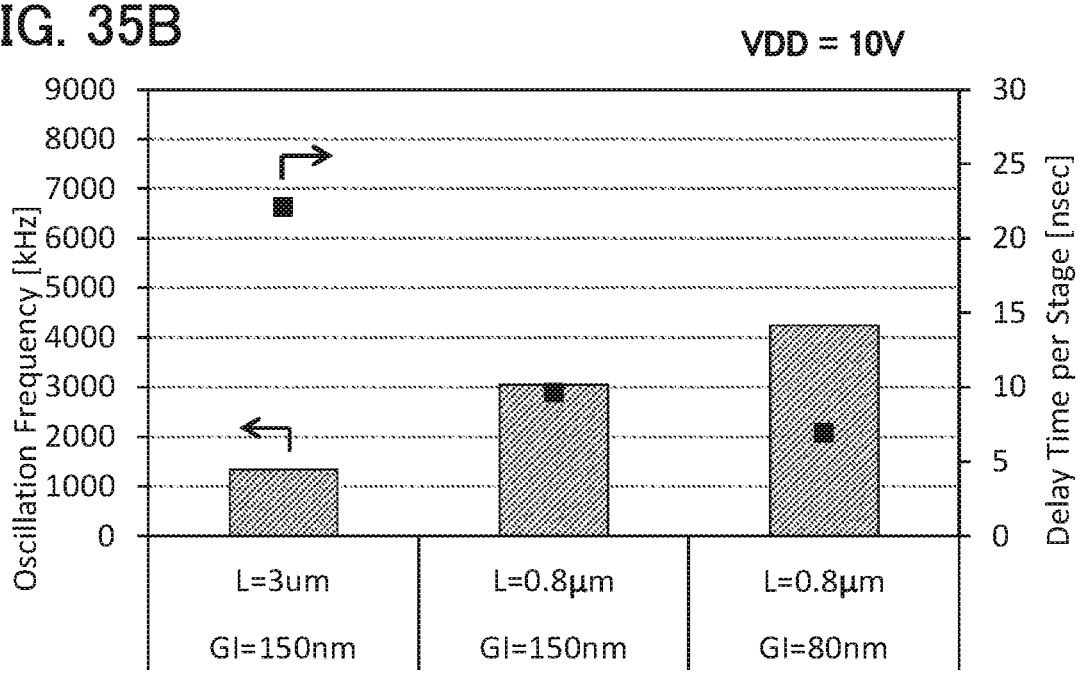

Furthermore, FIG. 35B shows the measurement results of the oscillation frequency and the delay time per stage when three ring oscillator circuits where the thicknesses of the second gate insulating layers were 80 nm or more were driven under the condition where VDD was 10 V. At this time, under the two conditions where the channel length L was approximately 0.8 μm, an oscillation frequency of higher than 3 MHz was obtained.

These results indicate that, with the use of the transistor of one embodiment of the present invention, the source driver circuit with the analog line sequential method can be formed on the display panel.

Example 4

In this example, transistors of one embodiment of the present invention were fabricated and the electrical characteristics and the reliability thereof were evaluated.

[Sample Fabrication]

For the structures of the fabricated transistors, the transistor 100G described in Embodiment 1 and illustrated in FIGS. 8A and 8B can be referred to. Here, an In—Ga—Zn oxide, into which oxygen is less likely to diffuse, was used for the metal oxide layer 114, and two kinds of transistors in which the first layers are different from each other were fabricated.

First, a first gate electrode, a first gate insulating layer, and a semiconductor layer were formed over a glass substrate in this order. For the first gate electrode, a tungsten film with a thickness of approximately 100 nm formed by a sputtering method was used. A stacked-layer film including a silicon nitride film having a thickness of approximately 300 nm and a silicon oxynitride film having a thickness of approximately 5 nm each formed by a PECVD method was used as the first gate insulating layer. For the semiconductor layer, a metal oxide film formed by a sputtering method using an In—Ga—Zn oxide target (In:Ga:Zn=4:2:4.1 [atomic ratio]) was used.

Next, a second gate insulating layer, a metal oxide layer, and a second gate electrode were formed. For the second gate insulating layer, a silicon oxynitride film with a thickness of approximately 150 nm formed by a PECVD method was used. For the second gate electrode, a molybdenum film with a thickness of approximately 100 nm formed by a sputtering method was used.

Here, for the metal oxide layer between the second gate insulating layer and the second gate electrode, a metal oxide film formed by a sputtering method using an In—Ga—Zn oxide target (In:Ga:Zn=1:3:4 [atomic ratio]) was used. In this manner, when a material in which the proportion of indium is less than that of gallium is used, a film in which an oxygen vacancy is less likely to be generated can be formed; as a result, a film into which oxygen is less likely to diffuse or a film which is less likely to absorb oxygen can be obtained. Furthermore, when a material in which the proportion of zinc is greater than that of indium is used, crystallization is easily caused; thus, a film into which oxygen is further less likely to diffuse can be obtained.

For example, baking is performed under a nitrogen atmosphere after the film formation, in the case where an oxide target whose composition is In:Ga:Zn=4:2:4.1 [atomic ratio] is used, the sheet resistance value is reduced because of an increase in carrier density due to an increase in oxygen vacancies, and in the case where an oxide target whose composition is In:Ga:Zn=1:3:4 [atomic ratio] is used, the sheet resistance is kept at the upper measurement limit of a measurer (larger than or equal to $5 \times 10^6$ Ω/square) and the metal oxide layer is substantially an insulator.

Next, different first layers were formed for the following two samples (Sample D1 and Sample D2).

In Sample 1, an approximately 20-nm-thick aluminum nitride film was used for the first layer. The aluminum nitride film was formed using an Al target by a reactive sputtering method using a mixed gas of an Ar gas and an $N_2$ gas was used as the deposition gas. Furthermore, the first layer is left without removing by etching.

In Sample 2, an approximately 100-nm-thick silicon nitride film containing hydrogen was used for the first layer. The silicon nitride film was formed by a PECVD method using a mixed gas of a silane gas, an $N_2$ gas, and an ammonia gas as the deposition gas.

After the first layer was formed, an approximately 300-nm-thick silicon oxynitride film was formed as a protective insulating layer by a PECVD method, and heat treatment was performed at 350° C. for one hour in a nitrogen atmosphere.

Then, an opening which reaches the semiconductor layer was formed in the protective insulating layer, and then a source electrode and a drain electrode were formed. For the source electrode and the drain electrode, an approximately 100-nm-thick molybdenum film formed by a sputtering method was used.

Through the above process, the transistors (Sample D1 and Sample D2) formed over glass were obtained.

[$I_d$-$V_g$ Characteristics of Transistors]

Figure 36:
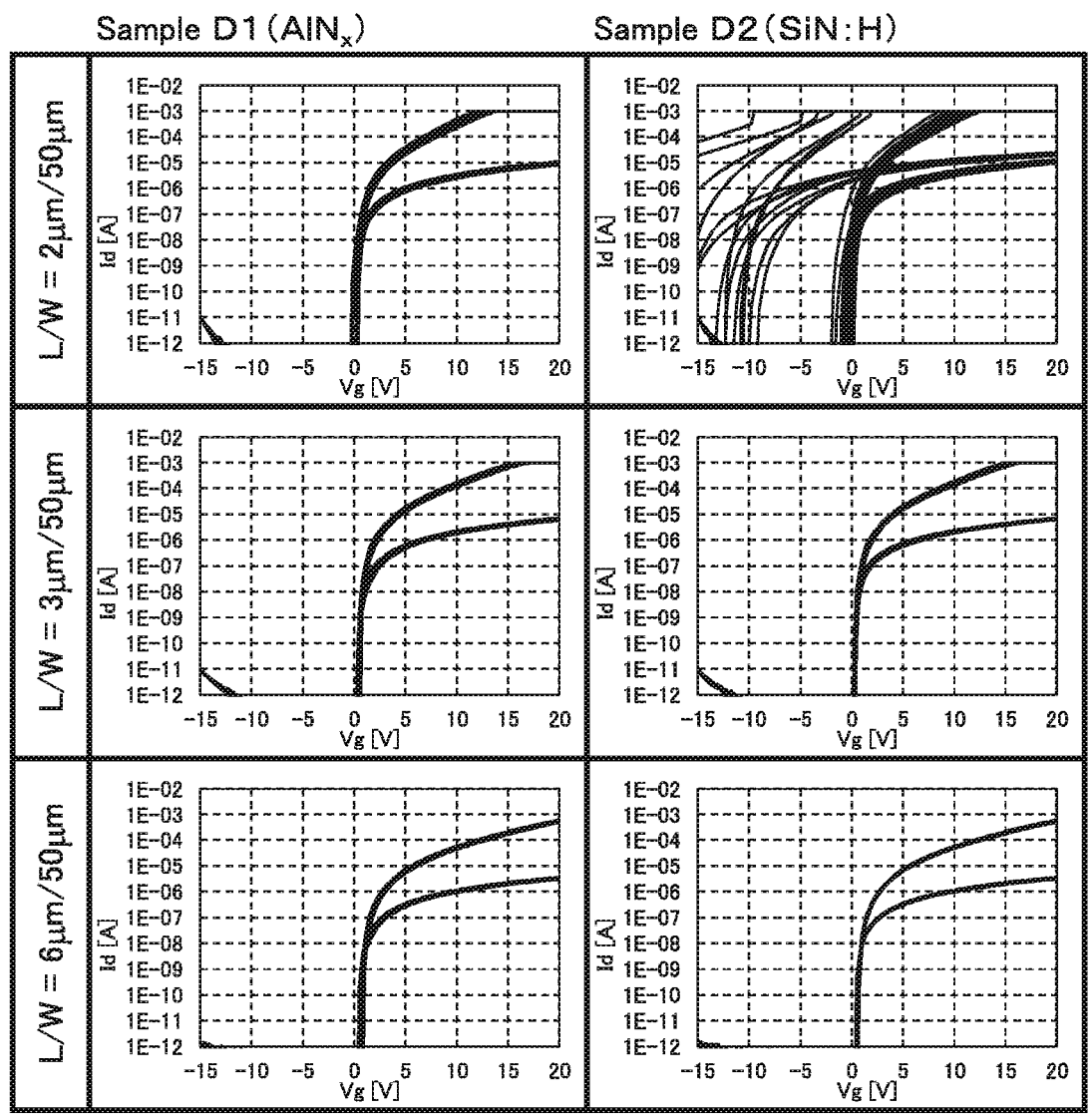
FIG. 36 shows electrical characteristics of transistors in Example 4.

FIG. 36 shows the measurement results of $I_d$-$V_g$ characteristics of the transistors, which are Sample D1 and Sample D2. In FIG. 36, the results of three transistors in which the channel length was approximately 2 μm, approximately 3 μm, and approximately 6 μm are shown. In addition, the channel width of each transistor was approximately 50 μm.

As shown in FIG. 36, in Sample D1 in which an aluminum nitride film (represented as $AlN_x$) was used for the first layer, even if the channel length was as small as approximately 2 μm, favorable electrical characteristics with less variation can be obtained.

In contrast, in Sample D2 in which a silicon nitride film containing hydrogen (represented as SiN:H) is used for the first layer, in the transistor where the channel length is approximately 3 μm or more, favorable characteristics can be obtained; however, in the transistor where the channel length is approximately 2 μm, variation in characteristics is large.

[Gate Bias-Temperature Stress Test]

Sample D1 and Sample D2 were subjected to a gate bias-temperature stress test (GBT test). In the GBT test, a substrate over which the transistor was formed was held at 60° C., a voltage of 0 V was applied to a source and a drain of the transistor, and a voltage of 20 V or −20 V was applied to a gate; this state was held for one hour. A test in which a positive voltage is applied to the gate and the test environment is dark is referred to as PBTS, and a test in which a negative voltage is applied to the gate and the test environment is dark is referred to as NBTS. PBTS in a state where a sample is irradiated with light is referred to as PBITS, and NBTS in a state where a sample is irradiated with light is referred to as NBITS. For the light irradiation, white LED light with approximately 10000 lx was used.

Figure 37:
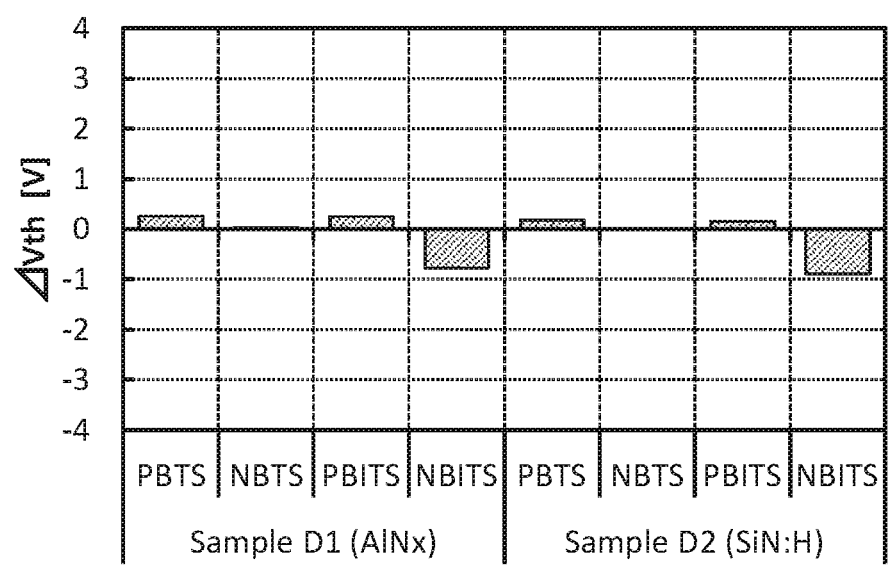
FIG. 37 shows evaluation results of reliability of transistors in Example 4.

FIG. 37 shows the GBT test results of transistors each having a channel length of 3 μm and a channel width of 50 μm. The vertical axis represents the amount of change (ΔVth) in the threshold voltage (Vth). It can be seen from the results that the amount of change in the threshold voltage is extremely small in each of Samples D1 and D2.

From the above, it is found that the reliability of the transistor of one embodiment of the present invention is extremely high.

REFERENCE NUMERALS

100: transistor, 100A: transistor, 100B: transistor, 100C: transistor, 100D: transistor, 100E: transistor, 100F: transistor, 100G: transistor, 102: substrate, 104: insulating layer, 106: conductive layer, 106C: conductive layer, 107: insulating layer, 108: semiconductor layer, 108C: metal oxide layer, 108f: metal oxide film, 108i: region, 108n: region, 108n1: region, 108n2: region, 109: conductive layer, 110: insulating layer, 110f: insulating film, 111: insulating layer, 112: conductive layer, 112f: conductive film, 114: metal oxide layer, 114f: metal oxide film, 116: first layer, 116a: first layer, 117: metal oxide layer, 118: insulating layer, 119: insulating layer, 120a: conductive layer, 120b: conductive layer, 130A: capacitor, 130B: capacitor, 130C: capacitor, 141a: opening, 141b: opening, 141c: opening, 142: opening, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 600: television device, 601: control portion, 602: memory portion, 603: communication control portion, 604: image processing circuit, 605: decoder circuit, 606: video signal reception portion, 607: timing controller, 608: source driver, 609: gate driver, 610: neural network, 611: input layer, 612: middle layer, 613: output layer, 615: neuron, 620: display panel, 621: pixel, 630: system bus, 700: display device, 700A: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 721: source driver IC, 722: gate driver circuit, 723: FPC, 724: printed circuit board, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure body, 780: anisotropic conductive film, 782: light-emitting element, 786: EL layer, 788: conductive film, 790: capacitor, 791: touch panel, 792: insulating film, 793: electrode, 794: electrode, 795: insulating film, 796: electrode, 797: insulating film, 6000: display module, 6001: upper cover, 6002: lower cover, 6005: FPC, 6006: display device, 6009: frame, 6010: printed circuit board, 6011: battery, 6015: light-emitting portion, 6016: light-receiving portion, 6017a: light guide portion, 6017b: light guide portion, 6018: light, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 7500: display portion, 8000: camera, 8001: housing, 8002: display portion, 8003: operation button, 8004: shutter button, 8006: lens, 8040: portable information terminal, 8041: housing, 8042: display portion, 8043: button, 8044: icon, 8045: camera, 8046: microphone, 8047: speaker, 8048: connection terminal, 8049: solar cell, 8050: camera, 8051: charge and discharge control circuit, 8052: battery, 8053: DC-DC converter, 8054: switch, 8055: switch, 8056: switch, 8057: converter, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: object, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal.

This application is based on Japanese Patent Application Serial No. 2017-099571 filed with Japan Patent Office on May 19, 2017, Japanese Patent Application Serial No. 2017-133092 filed with Japan Patent Office on Jul. 6, 2017, and Japanese Patent Application Serial No. 2017-216684 filed with Japan Patent Office on Nov. 9, 2017, the entire contents of which are hereby incorporated by reference.

The invention claimed is:

1. A method for manufacturing a semiconductor device, comprising steps of:
    forming a first metal oxide layer and a second metal oxide layer over and in contact with a surface of a first layer at the same time;
    forming a first insulating layer over a first region of the first metal oxide layer and a first conductive layer over the first insulating layer;
    forming a second layer in contact with a second region of the first metal oxide layer and the second metal oxide layer;
    performing heat treatment to lower a resistance of the second region of the first metal oxide layer and a resistance of the second metal oxide layer;
    forming a second insulating layer to cover the first metal oxide layer, the second metal oxide layer, the first insulating layer, and the first conductive layer; and
    forming, over the second insulating layer, a second conductive layer electrically connected to the second region,
    wherein the second layer comprises at least one of aluminum, titanium, tantalum, and tungsten, and
    wherein the second metal oxide layer is configured to function as one electrode of a capacitor.

2. The method for manufacturing a semiconductor device, according to claim 1, further comprising the step of removing the second layer after the step of performing the heat treatment and before the step of forming the second insulating layer.

3. The method for manufacturing a semiconductor device, according to claim 1, wherein the second conductive layer overlaps the second metal oxide layer.

4. The method for manufacturing a semiconductor device, according to claim 1, further comprising the steps of:
forming a third conductive layer and a fourth conductive layer over a surface of a third layer; and
forming the first layer to cover the third conductive layer and the fourth conductive layer,
wherein the first region of the first metal oxide layer overlaps the third conductive layer, and
wherein the second metal oxide layer at least partly overlaps the fourth conductive layer.

5. The method for manufacturing a semiconductor device, according to claim 1, wherein the second layer is formed by a sputtering method to comprise nitrogen.

6. The method for manufacturing a semiconductor device, according to claim 1, wherein the heat treatment is performed at a temperature higher than or equal to 300° C. and lower than or equal to 450° C. in an atmosphere comprising nitrogen.

7. A semiconductor device comprising:
a first metal oxide layer and a second metal oxide layer over and in contact with a surface of a first layer;
a first insulating layer and a first conductive layer stacked over a first region of the first metal oxide layer;
a second layer over and in contact with a second region of the first metal oxide layer and the second metal oxide layer;
a second insulating layer covering the first metal oxide layer, the second metal oxide layer, the first insulating layer, and the first conductive layer; and
a second conductive layer over the second insulating layer, the second conductive layer being electrically connected to the second region,
wherein the second layer comprises at least one of aluminum, titanium, tantalum, and tungsten,
wherein the second region has a lower resistance than the first region,
wherein the second metal oxide layer does not overlap with the first metal oxide layer, and
wherein the second metal oxide layer is configured to function as one electrode of a capacitor.

8. The semiconductor device according to claim 7, wherein the second conductive layer partly overlaps the first insulating layer, the second layer, and the second metal oxide layer.

9. The semiconductor device according to claim 7, wherein the first region and the second metal oxide layer are seamlessly continuous.

10. A display device comprising:
the semiconductor device according to claim 7; and
a liquid crystal element above the second insulating layer, the liquid crystal element comprising a liquid crystal, a fourth conductive layer, and a fifth conductive layer,
wherein the fourth conductive layer is electrically connected to the second conductive layer.

11. A display device comprising:
the semiconductor device according to claim 7; and
a light-emitting element above the second insulating layer, the light-emitting element comprising a sixth conductive layer, a seventh conductive layer, and a light-emitting layer between the sixth conductive layer and the seventh conductive layer,
wherein the sixth conductive layer is electrically connected to the second conductive layer.

12. The semiconductor device according to claim 7, further comprising:
a third conductive layer and a fourth conductive layer below the first metal oxide layer and the second metal oxide layer; and
the first insulating layer covering the third conductive layer and the fourth conductive layer and positioned below the first metal oxide layer and the second metal oxide layer,
wherein the third conductive layer is partly overlapped by the first region, and
wherein the fourth conductive layer is partly overlapped by the second metal oxide layer.

13. The semiconductor device according to claim 12, wherein the second region is electrically connected to the second metal oxide layer through the second conductive layer.

14. The semiconductor device according to claim 7, further comprising a third metal oxide layer between the first metal oxide layer and the first insulating layer,
wherein the third metal oxide layer comprises In, Ga, and Zn and has a higher Ga content than In content.

15. The semiconductor device according to claim 14, wherein the third metal oxide layer has a higher Zn content than the In content.

16. A method for manufacturing a semiconductor device, comprising steps of:
forming a first metal oxide layer and a second metal oxide layer over one surface at the same time;
forming a first insulating layer over a first region of the first metal oxide layer and a first conductive layer over the first insulating layer;
forming a first layer in contact with a second region of the first metal oxide layer and the second metal oxide layer;
performing heat treatment to lower a resistance of the second region of the first metal oxide layer and a resistance of the second metal oxide layer;
forming a second insulating layer to cover the first metal oxide layer, the second metal oxide layer, the first insulating layer, and the first conductive layer;
removing the first layer after the step of performing the heat treatment and before the step of forming the second insulating layer; and
forming, over the second insulating layer, a second conductive layer electrically connected to the second region,
wherein the first layer comprises at least one of aluminum, titanium, tantalum, and tungsten.

17. The method for manufacturing a semiconductor device, according to claim 16, further comprising the steps of:
forming a third conductive layer and a fourth conductive layer over one surface; and
forming a third insulating layer to cover the third conductive layer and the fourth conductive layer,
wherein the first metal oxide layer and the second metal oxide layer are formed over the third insulating layer,
wherein the first region of the first metal oxide layer overlaps the third conductive layer, and
wherein the second metal oxide layer at least partly overlaps the fourth conductive layer.

18. A method for manufacturing a semiconductor device, comprising steps of:
forming a first metal oxide layer and a second metal oxide layer over one surface at the same time;

forming a first insulating layer over a first region of the first metal oxide layer and a first conductive layer over the first insulating layer;

forming a first layer in contact with a second region of the first metal oxide layer and the second metal oxide layer;

performing heat treatment to lower a resistance of the second region of the first metal oxide layer and a resistance of the second metal oxide layer;

forming a second insulating layer to cover the first metal oxide layer, the second metal oxide layer, the first insulating layer, and the first conductive layer; and forming, over the second insulating layer, a second conductive layer electrically connected to the second region, wherein the second conductive layer overlaps the second metal oxide layer, and wherein the first layer comprises at least one of aluminum, titanium, tantalum, and tungsten.

19. The method for manufacturing a semiconductor device, according to claim 18, further comprising the steps of:

forming a third conductive layer and a fourth conductive layer over one surface; and forming a third insulating layer to cover the third conductive layer and the fourth conductive layer, wherein the first metal oxide layer and the second metal oxide layer are formed over the third insulating layer, wherein the first region of the first metal oxide layer overlaps the third conductive layer, and wherein the second metal oxide layer at least partly overlaps the fourth conductive layer.

* * * * *